United States Patent
Kim et al.

(10) Patent No.: US 10,158,452 B2
(45) Date of Patent: Dec. 18, 2018

(54) APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

(71) Applicant: LG Electronics Inc., Seoul (KR)

(72) Inventors: Jinwoo Kim, Seoul (KR); Jongwoong Shin, Seoul (KR); Woosuk Ko, Seoul (KR); Sungryong Hong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/636,230

(22) Filed: Jun. 28, 2017

(65) Prior Publication Data

US 2017/0302405 A1    Oct. 19, 2017

Related U.S. Application Data

(63) Continuation of application No. 14/808,955, filed on Jul. 24, 2015, now Pat. No. 9,729,275.

(Continued)

(51) Int. Cl.
*H04L 1/00* (2006.01)
*H04L 27/26* (2006.01)
(Continued)

(52) U.S. Cl.
CPC ....... *H04L 1/0041* (2013.01); *H03M 13/1148* (2013.01); *H03M 13/255* (2013.01);
(Continued)

(58) Field of Classification Search
CPC .................................................. H04L 1/0057
(Continued)

(56) References Cited

U.S. PATENT DOCUMENTS

| 7,430,215 B2 | 9/2008 | Arivoli et al. |
| 8,190,979 B2 | 5/2012 | Song et al. |

(Continued)

FOREIGN PATENT DOCUMENTS

| EP | 2 360 884 A1 | 8/2011 |
| EP | 2 237 468 B1 | 5/2012 |

(Continued)

OTHER PUBLICATIONS

ATSC, "ATSC Candidate Standard: Physical Layer Protocol," Doc. S32-230r21, Sep. 28, 2015, pp. 1-228, XP17846934.

(Continued)

*Primary Examiner* — Fritz Alphonse
(74) *Attorney, Agent, or Firm* — Birch, Stewart, Kolasch & Birch, LLP

(57) ABSTRACT

A method is provided for transmitting broadcast signals. The method includes encoding, by an encoder, service data, encoding, by a signaling encoder, signaling data based on modes of the signaling data, wherein the signaling data is categorized into each mode representing a Low Density Parity Check (LDPC) code rate and a modulation order for the signaling data, building, by a frame builder, at least one signal frame including the encoded service data in at least one data symbol and the encoded signaling data in at least one signaling symbol, modulating, by a modulator, data in the at least one signal frame by an Orthogonal Frequency Division Multiplex (OFDM) scheme, and transmitting, by a transmitter, the broadcast signals carrying the modulated data in the at least one signal frame. One of the modes for the signaling data represents a 6/15 LDPC code rate and a Quadrature Phase Shift Keying (QPSK) modulation.

8 Claims, 45 Drawing Sheets

Related U.S. Application Data

(60) Provisional application No. 62/097,565, filed on Dec. 29, 2014, provisional application No. 62/110,597, filed on Feb. 1, 2015, provisional application No. 62/113,504, filed on Feb. 8, 2015, provisional application No. 62/114,559, filed on Feb. 10, 2015.

(51) Int. Cl.

| | | |
|---|---|---|
| *H04L 12/18* | (2006.01) | |
| *H04L 5/00* | (2006.01) | |
| *H04L 29/06* | (2006.01) | |
| *H03M 13/25* | (2006.01) | |
| *H03M 13/27* | (2006.01) | |
| *H03M 13/29* | (2006.01) | |
| *H03M 13/11* | (2006.01) | |
| *H03M 13/15* | (2006.01) | |
| *H03M 13/35* | (2006.01) | |

(52) U.S. Cl.
CPC ..... *H03M 13/271* (2013.01); *H03M 13/2778* (2013.01); *H03M 13/2792* (2013.01); *H03M 13/2906* (2013.01); *H04L 1/0045* (2013.01); *H04L 1/0047* (2013.01); *H04L 1/0071* (2013.01); *H04L 1/0083* (2013.01); *H04L 5/0007* (2013.01); *H04L 5/0048* (2013.01); *H04L 12/18* (2013.01); *H04L 12/189* (2013.01); *H04L 27/2601* (2013.01); *H04L 27/2627* (2013.01); *H04L 65/4076* (2013.01); *H04L 65/607* (2013.01); *H03M 13/1165* (2013.01); *H03M 13/152* (2013.01); *H03M 13/356* (2013.01); *H04L 1/0057* (2013.01); *H04L 2001/0093* (2013.01)

(58) Field of Classification Search
USPC ................................. 714/776, 774, 775, 788
See application file for complete search history.

(56) References Cited

U.S. PATENT DOCUMENTS

| | | | |
|---|---|---|---|
| 8,208,499 B2 | 6/2012 | Sun et al. | |
| 8,325,760 B2 | 12/2012 | Song et al. | |
| 8,559,372 B2 | 10/2013 | Song et al. | |
| 9,215,038 B2* | 12/2015 | Shin | ...................... H04L 1/0063 |
| 9,425,874 B2* | 8/2016 | Murakami | ................ H04L 5/00 |
| 2006/0107171 A1 | 5/2006 | Skraparlis | |
| 2009/0052541 A1 | 2/2009 | Kang et al. | |
| 2010/0287444 A1 | 11/2010 | Song et al. | |
| 2011/0131615 A1 | 6/2011 | Lee et al. | |
| 2011/0274204 A1 | 11/2011 | Ko et al. | |
| 2011/0280327 A1 | 11/2011 | Ko et al. | |
| 2012/0008540 A1 | 1/2012 | Yun et al. | |
| 2012/0236880 A1 | 9/2012 | Stadelmeier et al. | |
| 2012/0320994 A1 | 12/2012 | Loghin et al. | |
| 2013/0219431 A1 | 8/2013 | Hong et al. | |
| 2013/0291046 A1 | 10/2013 | Ko et al. | |
| 2014/0198875 A1 | 7/2014 | Kim et al. | |
| 2014/0380135 A1 | 12/2014 | Hong et al. | |
| 2015/0074485 A1 | 3/2015 | Jeong et al. | |
| 2015/0082118 A1 | 3/2015 | Jeong et al. | |
| 2015/0229335 A1 | 8/2015 | Park et al. | |
| 2016/0218829 A1* | 7/2016 | Fay | ........................ H04L 1/0083 |

FOREIGN PATENT DOCUMENTS

| | | |
|---|---|---|
| KR | 10-2009-0075750 A | 7/2009 |
| KR | 10-2009-0127087 A | 12/2009 |
| KR | 10-2010-0042652 A | 4/2010 |
| KR | 10-2011-101549 A | 9/2011 |
| KR | 10-2011-0117686 A | 10/2011 |
| KR | 10-2011-0124231 A | 11/2011 |
| KR | 10-2011-0129380 A | 12/2011 |
| KR | 10-1309615 B1 | 9/2013 |
| KR | 10-1351022 B1 | 1/2014 |

OTHER PUBLICATIONS

ETSI, "Digital Video Broadcasting (DVB); Frame structure channel coding and modulation for a second generation digital terrestrial television broadcasting system (DVB-T2)," Final Draft ETSI EN 302 755 V1.1.1, Jul. 2009, pp. 1-167, XP14044393.

ETSI, "Digital Video Broadcasting (DVB); Next Generation broadcasting system to Handheld, physical layer specification (DVB-NGH)," Draft ETSI EN 303 105 v1.1.1, Jun. 2013, pp. 1-300, XP17840591.

* cited by examiner

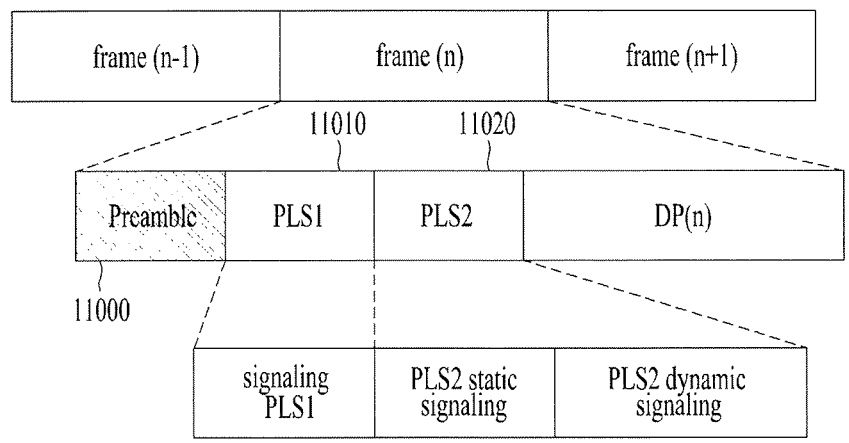

FIG. 13

| Content | Bits |
|---|---|
| PREAMBLE_DATA<br>NUM_FRAME_FRU<br>PAYLOAD_TYPE<br>NUM_FSS<br>SYSTEM_VERSION | 20<br>2<br>3<br>2<br>8 |
| CELL_ID<br>NETWORK_ID<br>SYSTEM_ID | 16<br>16<br>16 |
| for i = 0:3<br>    FRU_PHY_PROFILE<br>    FRU_FRAME_LENGTH<br>    FRU_GI_FRACTION<br>    RESERVED<br>end | <br>3<br>2<br>3<br>4 |
| PLS2_FEC_TYPE<br>PLS2_MOD<br>PLS2_SIZE_CELL<br>PLS2_STAT_SIZE_BIT<br>PLS2_SYN_SIZE_BIT<br>PLS2_REP_FLAG<br>PLS2_REP_SIZE_CELL<br>PLS2_NEXT_FEC_TYPE<br>PLS2_NEXT_MODE<br>PLS2_NEXT_REP_FLAG<br>PLS2_NEXT_REP_SIZE_CELL<br>PLS2_NEXT_REP_STAT_SIZE_BIT<br>PLS2_NEXT_REP_DYN_SIZE_BIT<br>PLS2_AP_MODE<br>PLS2_AP_SIZE_CELL<br>PLS2_NEXT_AP_MODE<br>PLS2_NEXT_AP_SIZE_CELL | 2<br>3<br>15<br>14<br>14<br>1<br>15<br>2<br>3<br>1<br>15<br>14<br>14<br>2<br>15<br>2<br>15 |
| RESERVED<br>CRC 32 | 32<br>32 |

FIG. 14

| Content | Bits |
|---|---|
| FIC_FLAG | 1 |
| AUX_FLAG | 1 |
| NUM_DP | 6 |
| for i = 1: NUM_DP | |
|     DP_ID | 6 |
|     DP_TYPE | 3 |
|     DP_GROUP_ID | 8 |
|     BASE_DP_ID | 6 |
|     DP_FEC_TYPE | 2 |
|     DP_COD | 4 |
|     DP_MOD | 4 |
|     DP_SSD_FLAG | 1 |
|     if PHY_PROFILE = '010' | |
|         DP_MIMO | 3 |
|     end | |
|     DP_TI_TYPE | 1 |
|     DP_TI_LENGTH | 2 |
|     DP_TI_BYPASS | 1 |
|     DP_FRAME_INTERVAL | 2 |
|     DP_FIRST_FRAME_IDX | 5 |
|     DP_NUM_BLOCK_MAX | 10 |
|     DP_PAYLOAD_TYPE | 2 |
|     DP_INBAND_MODE | 2 |
|     DP_PROTOCOL_TYPE | 2 |
|     DP_CRC_MODE | 2 |
|     if DP_PAYLOAD_TYPE == TS('00') | |
|         DNP_MODE | 2 |
|         ISSY_MODE | 2 |
|         HC_MODE_TS | 2 |
|         if HC_MODE_TS == '01' or '10' | |
|             PID | 13 |
|         end | |
|     if DP_PAYLOAD_TYPE == IP('01') | |
|         HC_MODE_IP | 2 |
|     end | |
|     RESERVED | 8 |
| end | |
| if FIC_FLAG == 1 | |
|     FIC_VERSION | 8 |
|     FIC_LENGTH_BYTE | 13 |
|     RESERVED | 8 |
| end | |
| if AUX_FLAG == 1 | |
|     NUM_AUX | 4 |
|     AUX_CONFIG_RFU | 8 |
|     for - 1 : NUM_AUX | |
|         AUX_STREAM_TYPE | 4 |
|         AUX_PRIVATE_CONF | 28 |
|     end | |
| end | |

| Content | | Bit |
|---|---|---|
| FRAME_INDEX | | 5 |
| PLS_CHANGE_COUNTER | | 4 |
| FIC_CHANGE_COUNTER | | 4 |
| RESERVED | | 16 |
| for i = 1: NUM_DP | | |
| | DP_ID | 6 |
| | DP_START | 15 (or13) |
| | DP_NUM_BLOCK | 10 |
| end | RESERVED | 8 |
| EAC_FLAG | | 1 |
| EAS_WAKE_UP_VERSION_NUM | | 8 |
| if EAC_FLAG == 1 | | |
| | EAC_LENGTH_BYTE | 12 |
| else | | |
| | EAC_COUNTER | 12 |
| end | | |
| for i=1:NUM_AUX | | |
| | AUX_PRIVATE_DYN | 48 |
| end | | |
| CRC 32 | | 32 |

FIG. 25
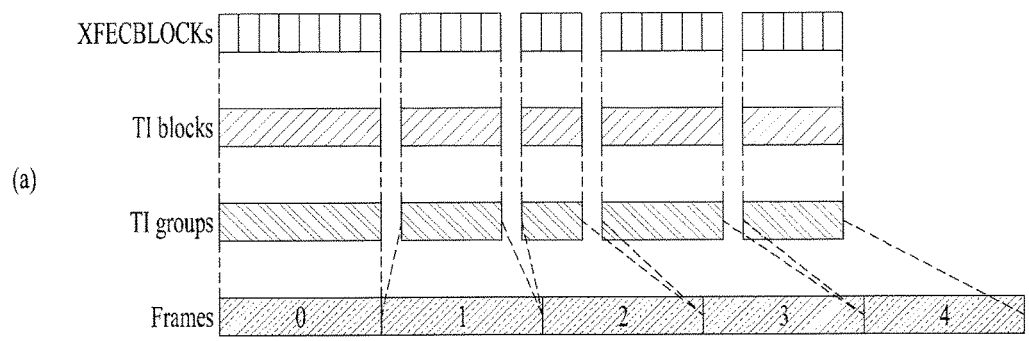
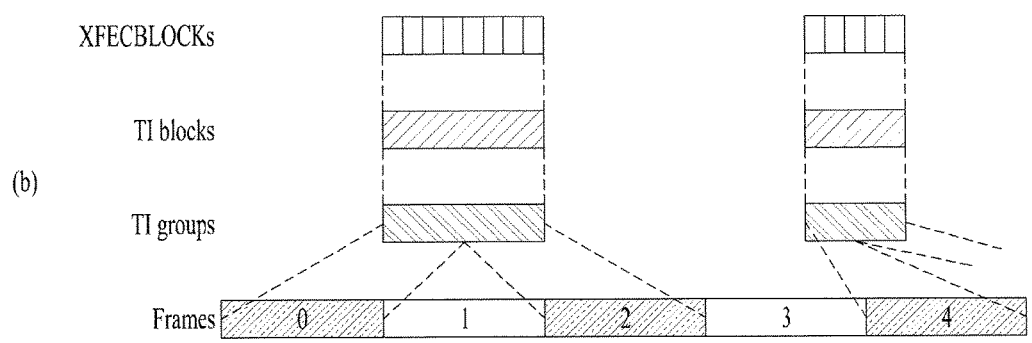
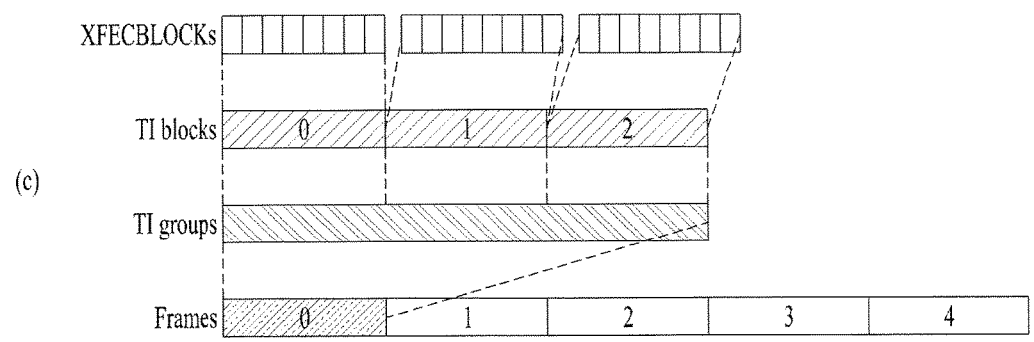

FIG. 29

FIG. 32
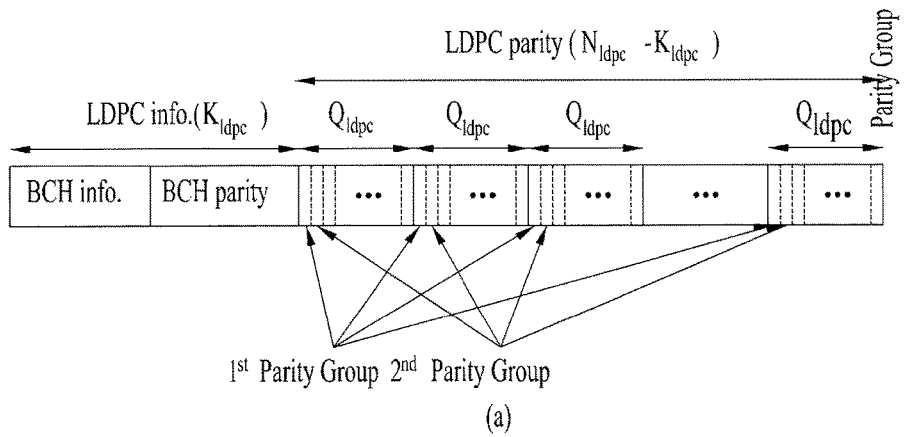
(a)
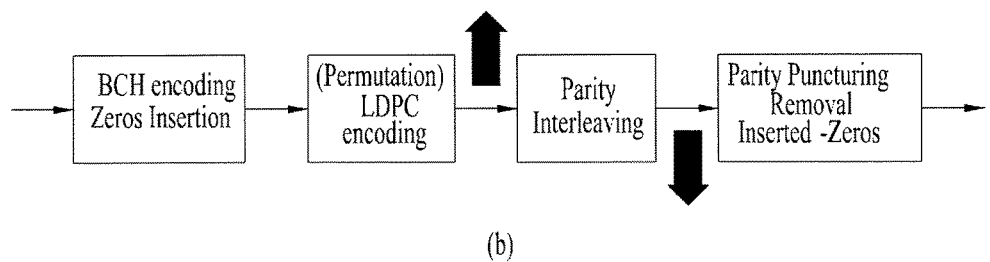
(b)
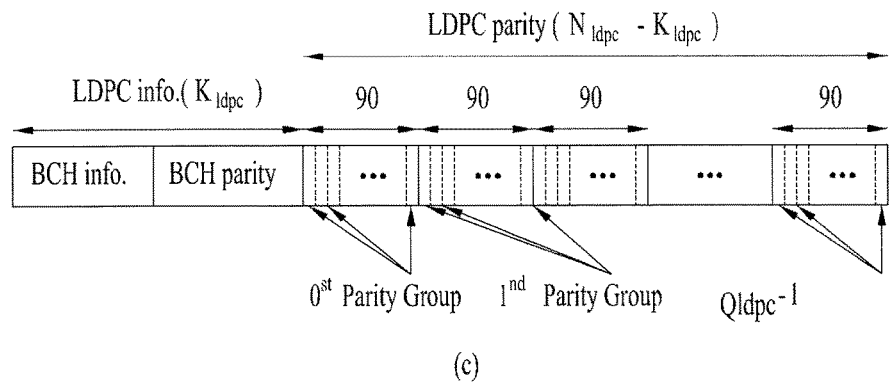
(c)

FIG. 35
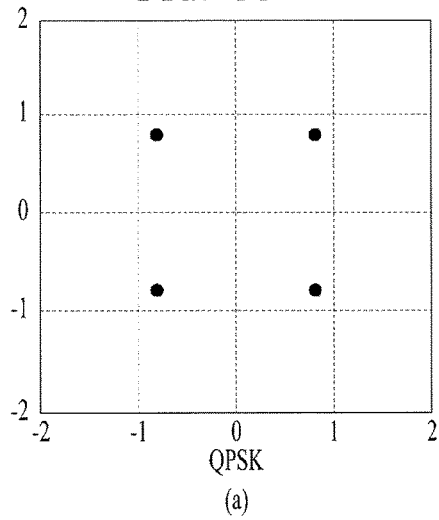
(a) QPSK
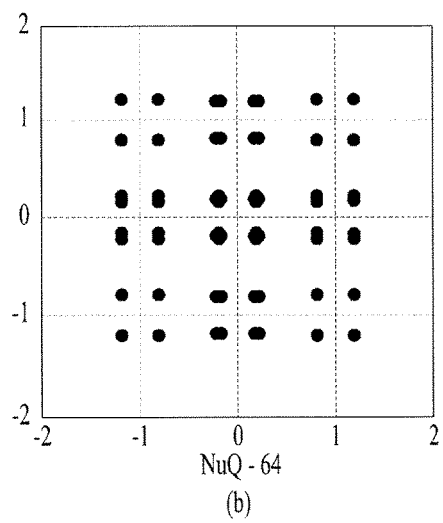
(b) NuQ-64
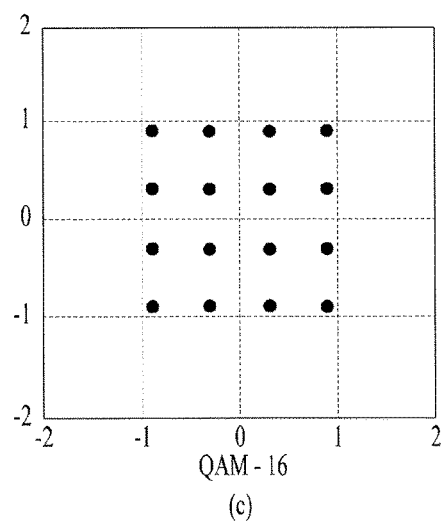
(c) QAM-16

FIG. 37
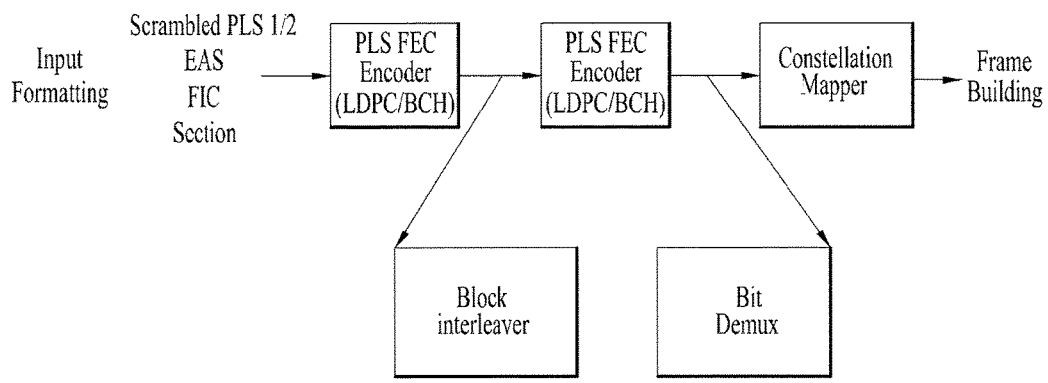
FIG. 38
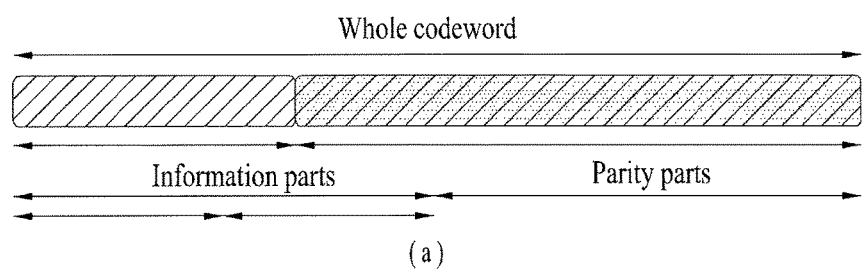
(a)
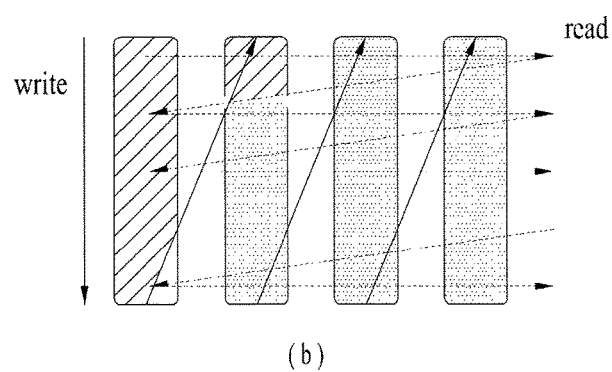
(b)

FIG. 40

$S_{demux\_in}(i) = \{b_i(0), b_i(1), b_i(2),..., b_i(\eta_{MOD} - 1)\},$ $S_{demux\_out}(i) = \{c_i(0), c_i(1), c_i(2),..., c_i(\eta_{MOD} - 1)\},$ $c_i(0) = b_i(i\%\eta_{MOD}), c_i(1) = b_i((i+1)\%\eta_{MOD}),..., c_i(\eta_{MOD} - 1) = b_i((i + \eta_{MOD} - 1)\%\eta_{MOD})$

FIG. 41

(a) QPSK with SSD PLS Decoder with 2-D LLR Demapper

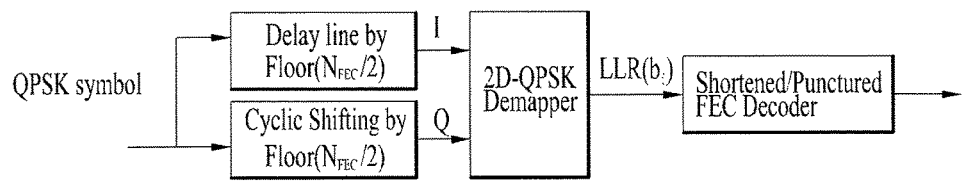

$$LLR(b_i) = \ln\left(\frac{\sum_{x \in C_i^1} e^{-\frac{(I-\rho_I I_x)^2+(Q-\rho_Q Q_x)^2}{2\sigma^2}}}{\sum_{x \in C_i^0} e^{-\frac{(I-\rho_I I_x)^2+(Q-\rho_Q Q_x)^2}{2\sigma^2}}}\right)$$

(b) QPSK with SSD PLS Decoder with 1-D LLR Demapper

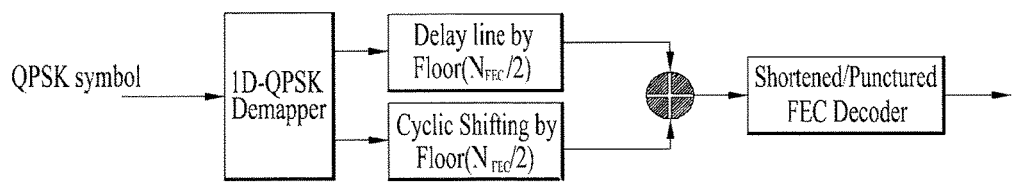

FIG. 42

$S_{demux\_in}(i) = \{b_i(0), b_i(1), b_i(2), ..., b_i(\eta_{MOD} - 1)\},$ $S_{demux\_out}(i) = \{c_i(0), c_i(1), c_i(2), ..., c_i(\eta_{MOD} - 1)\},$ $c_i(0) = b_i(i\%\eta_{MOD}), c_i(1) = b_i((i+1)\%\eta_{MOD}), ..., c_i(\eta_{MOD} - 1) = b_i((i + \eta_{MOD} - 1)\%\eta_{MOD})$

FIG. 43

(a) Survived 64k - LDPC

| Mod (bpc) | Code Rate (x/15) | | | | | | | | | | | |
|---|---|---|---|---|---|---|---|---|---|---|---|---|
|  | 2/15 | 3/15 | 4/15 | 5/15 | 6/15 | 7/15 | 8/15 | 9/15 | 10/15 | 11/15 | 12/15 | 13/15 |
| 2 | 0,27 | 0,40 | 0,53 | 0,67 | 0,80 | 0,93 | 1,07 | 1,20 | - | 1,47 | - | - |
| 4 | - | - | 1,07 | 1,33 | - | 1,87 | 2,13 | 2,40 | - | 2,93 | - | - |
| 6 | - | 1,20 | 1,60 | 2,00 | 2,40 | 2,80 | 3,20 | 3,60 | 4,00 | 4,40 | - | - |
| 8 | - | - | 2,13 | 2,67 | - | 3,73 | 4,27 | 4,80 | 5,33 | 5,87 | 6,40 | 6,93 |
| 10 | - | - | - | 3,33 | - | 4,67 | 5,33 | 6,00 | 6,67 | 7,33 | 8,00 | 8,67 |
| 12 | - | - | - | - | - | 5,60 | - | 7,20 | - | 8,80 | 9,60 | 10,40 |

(b) Survived 16k - LDPC

| Mod (bpc) | Code Rate (x/15) | | | | | | | | | | | |
|---|---|---|---|---|---|---|---|---|---|---|---|---|
|  | 2/15 | 3/15 | 4/15 | 5/15 | 6/15 | 7/15 | 8/15 | 9/15 | 10/15 | 11/15 | 12/15 | 13/15 |
| 2 | 0,27 | 0,40 | 0,53 | 0,67 | 0,80 | 0,93 | - | - | - | - | - | - |
| 4 | - | - | 1,07 | 1,33 | 1,60 | 1,87 | 2,13 | - | - | - | - | - |
| 6 | - | 1,20 | - | 2,00 | 2,40 | 2,80 | 3,20 | 3,60 | 4,00 | 4,40 | - | - |
| 8 | - | - | - | 2,67 | - | 3,73 | 4,27 | 4,80 | 5,33 | 5,87 | 6,40 | 6,93 |

FIG. 44

| | Length | Mod (bpc) | Numerator for CR | SNR (FER=10^-4, AWGN) | SNR (FER=10^-4, Ray) | throughput (w/ BCH) | throughput (wo/ BCH) |
|---|---|---|---|---|---|---|---|
| 1 (12) | 16200 | 2 | 2 | -5.60 | -5.14 | 0.246 | 0.267 |
| | 64800 | 2 | 2 | -6.23 | -5.75 | 0.261 | 0.267 |
| | 16200 | 2 | 3 | -3.80 | -3.05 | 0.379 | 0.400 |
| | 64800 | 2 | 3 | -4.32 | -3.64 | 0.394 | 0.400 |
| | 16200 | 2 | 4 | -2.36 | -1.42 | 0.513 | 0.533 |
| | 64800 | 2 | 4 | -2.88 | -1.99 | 0.527 | 0.533 |
| | 16200 | 2 | 5 | -1.33 | -0.13 | 0.646 | 0.667 |
| | 64800 | 2 | 5 | -1.69 | -0.56 | 0.661 | 0.667 |
| | 16200 | 2 | 6 | -0.33 | 1.12 | 0.779 | 0.800 |
| | 64800 | 2 | 6 | -0.52 | 0.88 | 0.794 | 0.800 |
| | 16200 | 2 | 7 | 0.53 | 2.28 | 0.913 | 0.933 |
| | 64800 | 2 | 7 | 0.31 | 1.96 | 0.927 | 0.933 |
| 2 (15) | 16200 | 4 | 4 | 1.94 | 3.32 | 1.025 | 1.067 |
| | 64800 | 4 | 4 | 1.47 | 2.69 | 1.055 | 1.067 |
| | 64800 | 2 | 8 | 1.18 | 3.20 | 1.061 | 1.067 |
| | 16200 | 6 | 3 | 2.74 | 4.20 | 1.138 | 1.200 |
| | 64800 | 6 | 3 | 2.28 | 3.62 | 1.182 | 1.200 |
| | 64800 | 2 | 9 | 1.99 | 4.38 | 1.194 | 1.200 |
| | 16200 | 4 | 5 | 3.13 | 4.72 | 1.292 | 1.333 |
| | 64800 | 4 | 5 | 2.83 | 4.31 | 1.321 | 1.333 |
| | 64800 | 2 | 11 | 3.62 | 7.07 | 1.461 | 1.467 |
| | 16200 | 4 | 6 | 4.46 | 6.27 | 1.559 | 1.600 |
| | 64800 | 6 | 4 | 4.16 | 5.88 | 1.582 | 1.600 |
| | 16200 | 4 | 7 | 5.53 | 7.58 | 1.825 | 1.867 |
| | 64800 | 4 | 7 | 5.24 | 7.21 | 1.855 | 1.867 |
| | 16200 | 6 | 5 | 6.23 | 8.21 | 1.938 | 2.000 |
| | 64800 | 6 | 5 | 5.97 | 7.76 | 1.982 | 2.000 |

FIG. 45

| | | | | | | | |
|---|---|---|---|---|---|---|---|
| | 16200 | 4 | 8 | 6.52 | 8.92 | 2.092 | 2.133 |
| | 64800 | 8 | 4 | 6.58 | 8.46 | 2.110 | 2.133 |
| | 64800 | 4 | 8 | 6.33 | 8.65 | 2.121 | 2.133 |
| | 16200 | 6 | 6 | 7.93 | 10.05 | 2.338 | 2.400 |
| 3 | 64800 | 6 | 6 | 7.70 | 9.75 | 2.382 | 2.400 |
| (14) | 64800 | 4 | 9 | 7.35 | 9.96 | 2.388 | 2.400 |
| | 16200 | 8 | 5 | 8.90 | 11.10 | 2.584 | 2.667 |
| | 64800 | 8 | 5 | 8.55 | 10.59 | 2.643 | 2.667 |
| | 16200 | 6 | 7 | 9.32 | 11.56 | 2.738 | 2.800 |
| | 64800 | 6 | 7 | 8.95 | 11.10 | 2.782 | 2.800 |
| | 64800 | 4 | 11 | 9.52 | 12.82 | 2.921 | 2.933 |
| | 16200 | 6 | 8 | 10.56 | 13.08 | 3.138 | 3.200 |
| | 64800 | 6 | 8 | 10.35 | 12.78 | 3.182 | 3.200 |
| | 64800 | 10 | 5 | 11.11 | 13.26 | 3.304 | 3.333 |
| | 16200 | 6 | 9 | 11.84 | 14.60 | 3.538 | 3.600 |
| 4 | 64800 | 6 | 9 | 11.59 | 14.27 | 3.582 | 3.600 |
| (16) | 16200 | 8 | 7 | 12.58 | 15.16 | 3.650 | 3.733 |
| | 64800 | 8 | 7 | 12.12 | 14.58 | 3.710 | 3.733 |
| | 16200 | 6 | 10 | 13.13 | 16.16 | 3.938 | 4.000 |
| | 64800 | 6 | 10 | 12.91 | 15.84 | 3.982 | 4.000 |
| | 16200 | 8 | 8 | 14.25 | 16.96 | 4.184 | 4.267 |
| | 64800 | 8 | 8 | 13.96 | 16.58 | 4.243 | 4.267 |
| | 16200 | 6 | 11 | 14.54 | 17.84 | 4.338 | 4.400 |
| | 64800 | 6 | 11 | 14.29 | 17.49 | 4.382 | 4.400 |
| | 64800 | 10 | 7 | 15.33 | 17.86 | 4.637 | 4.667 |
| | 16200 | 8 | 9 | 15.84 | 18.63 | 4.717 | 4.800 |
| | 64800 | 8 | 9 | 15.60 | 18.29 | 4.776 | 4.800 |
| | 16200 | 8 | 10 | 17.43 | 20.46 | 5.250 | 5.333 |
| | 64800 | 10 | 8 | 17.52 | 20.20 | 5.304 | 5.333 |
| | 64800 | 8 | 10 | 17.17 | 20.09 | 5.310 | 5.333 |

FIG. 46

| | | | | | | | |
|---|---|---|---|---|---|---|---|
| | 64800 | 12 | 7 | 18.24 | 21.06 | 5.564 | 5.600 |
| | 16200 | 8 | 11 | 19.10 | 22.38 | 5.784 | 5.867 |
| | 64800 | 8 | 11 | 18.79 | 21.95 | 5.843 | 5.867 |
| | 64800 | 10 | 9 | 19.51 | 22.39 | 5.970 | 6.000 |
| | 16200 | 8 | 12 | 20.79 | 24.51 | 6.317 | 6.400 |
| 5 | 64800 | 8 | 12 | 20.47 | 24.02 | 6.376 | 6.400 |
| (16) | 64800 | 10 | 10 | 21.41 | 24.52 | 6.637 | 6.667 |
| | 16200 | 8 | 13 | 22.55 | 27.20 | 6.850 | 6.933 |
| | 64800 | 8 | 13 | 22.25 | 26.63 | 6.910 | 6.933 |
| | 64800 | 12 | 9 | 23.16 | 26.44 | 7.164 | 7.200 |
| | 64800 | 10 | 11 | 23.47 | 26.65 | 7.304 | 7.333 |
| | 64800 | 10 | 12 | 25.57 | 28.86 | 7.970 | 8.000 |
| | 64800 | 10 | 13 | 27.66 | 31.61 | 8.637 | 8.667 |
| | 64800 | 12 | 11 | 27.87 | 31.31 | 8.764 | 8.800 |
| | 64800 | 12 | 12 | 30.42 | 33.86 | 9.564 | 9.600 |
| | 64800 | 12 | 13 | 32.89 | 36.58 | 10.364 | 10.400 |

FIG. 47

| Category | Data - BICM ModCod Performance | | | Signaling ModCod | |
|---|---|---|---|---|---|
| | Max. capacity | AWGN | Rayleigh | LDPC Cod | Modulation -order |
| Category -1 | 0.933 | -6.23 | -5.75 | 3/15 | BPSK |
| Category -2 | 2.000 | 1.18 | 2.69 | 3/15 | QPSK |
| Category -3 | 3.333 | 6.33 | 8.46 | 6/15 | 16QAM |
| Category -4 | 5.333 | 11.59 | 14.27 | 6/15 | 64QAM |
| Category -5 | 10.400 | 18.24 | 21.06 | | 256QAM |

FIG. 48

| Category | Data - BICM ModCod Performance | | | Signaling ModCod | | |
|---|---|---|---|---|---|---|
| | Max. capacity | AWGN | Rayleigh | LDPC Cod | Modulation -order | |
| Category -1 | 0.800 | -6.23 | -5.75 | 3/15 | BPSK | Target for Robust Mode |
| Category -2 | 1.467 | 1.18 | 2.69 | | QPSK | |
| Category -3 | 2.400 | 4.16 | 5.88 | 6/15 | QPSK | |
| Category -4 | 3.733 | 8.55 | 10.59 | | 16QAM | Target for High capacity |
| Category -5 | 5.333 | 12.91 | 15.84 | | 64QAM | |
| Category -6 | 10.400 | 18.24 | 21.06 | | 256QAM | |

# APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

CROSS-REFERENCE TO RELATED APPLICATIONS

This application is a continuation of U.S. application Ser. No. 14/808,955 filed on Jul. 24, 2015, which claims the benefit of U.S. Provisional Application Nos. 62/097,565, filed on Dec. 29, 2014, 62/110,597, filed on Feb. 1, 2015, 62/113,504, filed on Feb. 8, 2015, and 62/114,559, filed on Feb. 10, 2015. The entire contents of all of the above applications are hereby incorporated by reference.

BACKGROUND OF THE INVENTION

Field of the Invention

The present invention relates to an apparatus for transmitting broadcast signals, an apparatus for receiving broadcast signals and methods for transmitting and receiving broadcast signals.

Discussion of the Related Art

As analog broadcast signal transmission comes to an end, various technologies for transmitting/receiving digital broadcast signals are being developed. A digital broadcast signal may include a larger amount of video/audio data than an analog broadcast signal and further include various types of additional data in addition to the video/audio data.

That is, a digital broadcast system can provide HD (high definition) images, multi-channel audio and various additional services. However, data transmission efficiency for transmission of large amounts of data, robustness of transmission/reception networks and network flexibility in consideration of mobile reception equipment need to be improved for digital broadcast.

SUMMARY OF THE INVENTION

Accordingly, the present invention is directed to an apparatus for transmitting broadcast signals and an apparatus for receiving broadcast signals for future broadcast services and methods for transmitting and receiving broadcast signals for future broadcast services.

An object of the present invention is to provide an apparatus and method for transmitting broadcast signals to multiplex data of a broadcast transmission/reception system providing two or more different broadcast services in a time domain and transmit the multiplexed data through the same RF signal bandwidth and an apparatus and method for receiving broadcast signals corresponding thereto.

Another object of the present invention is to provide an apparatus for transmitting broadcast signals, an apparatus for receiving broadcast signals and methods for transmitting and receiving broadcast signals to classify data corresponding to services by components, transmit data corresponding to each component as a data pipe, receive and process the data Still another object of the present invention is to provide an apparatus for transmitting broadcast signals, an apparatus for receiving broadcast signals and methods for transmitting and receiving broadcast signals to signal signaling information necessary to provide broadcast signals.

To achieve the object and other advantages and in accordance with the purpose of the invention, as embodied and broadly described herein, a method for transmitting broadcast signals, the method comprises encoding service data, encoding signaling data based on a mode of the signaling data, wherein the signaling data is categorized to plural modes based on a length of the signaling data and ModCod information, building at least one signal frame including the encoded service data and the encoded signaling data, modulating the at least one signal frame by an OFDM (Orthogonal Frequency Division Multiplex) scheme and transmitting the broadcast signals carrying the at least one modulated signal frame.

The present invention can process data according to service characteristics to control QoS (Quality of Services) for each service or service component, thereby providing various broadcast services.

The present invention can achieve transmission flexibility by transmitting various broadcast services through the same RF signal bandwidth.

The present invention can improve data transmission efficiency and increase robustness of transmission/reception of broadcast signals using a MIMO system.

According to the present invention, it is possible to provide broadcast signal transmission and reception methods and apparatus capable of receiving digital broadcast signals without error even with mobile reception equipment or in an indoor environment.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 11 illustrates a signaling hierarchy structure of the frame according to an embodiment of the present invention.

FIG. 12 illustrates preamble signaling data according to an embodiment of the present invention.

FIG. 13 illustrates PLS1 data according to an embodiment of the present invention.

FIG. 14 illustrates PLS2 data according to an embodiment of the present invention.

FIG. 25 illustrates a time interleaving according to an embodiment of the present invention.

FIG. 29 illustrates interleaved XFECBLOCKs from each interleaving array according to an embodiment of the present invention.

FIG. 32 illustrates a detailed operation of the parity interleaving block using a PLS data structure.

FIG. 35 illustrates a result obtained by mapping bits input to the constellation mapper onto the QAM symbol and outputting the mapped bits by the constellation mapper according to the present embodiment.

FIG. 37 illustrates a BICM block for protection of physical layer signaling (PLS), emergency alert channel (EAC) and fast information channel (FIC).

FIG. 38 illustrates input and output data of the bit interleaver according to the present embodiment.

FIG. 40 shows an equation indicating an operation of a bit demultiplexer of a broadcast signal transmission apparatus according to an embodiment of the present invention.

FIG. 41 illustrates a bit deinterleaver of a broadcast signal reception apparatus according to an embodiment of the present invention.

FIG. 42 shows an equation indicating an operation of a bit demultiplexer of a broadcast signal transmission apparatus according to an embodiment of the present invention.

FIG. 43 shows applicable ModCod combinations when PLS data signaling protection according to an embodiment of the present invention is performed.

FIGS. 44 to 46 are tables that categorize and show data according to data throughput.

FIG. 47 is a table showing BICM ModCod performance for each category according to an embodiment of the present invention.

FIG. 48 is a table showing BICM ModCod for each category according to an embodiment of the present invention.

DETAILED DESCRIPTION OF THE INVENTION

Figure 1:
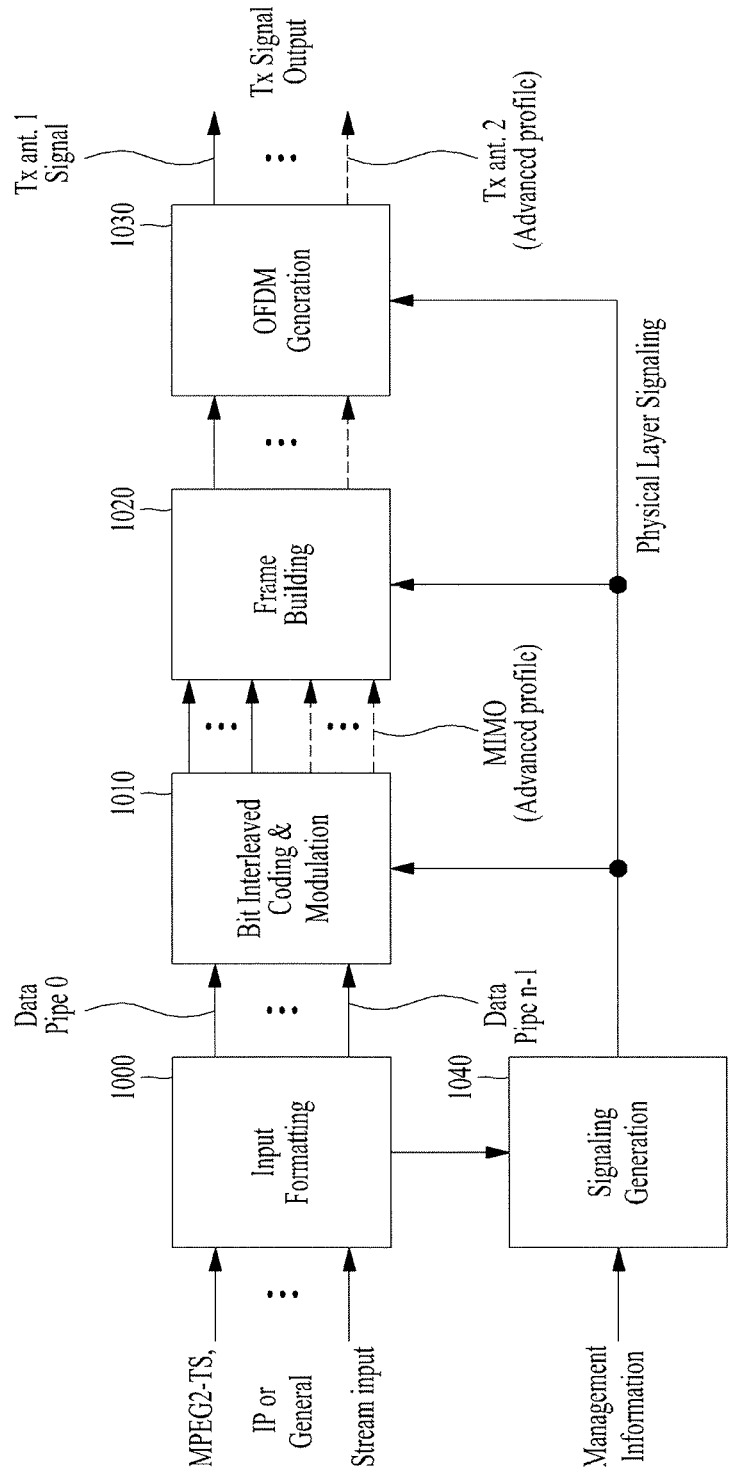
FIG. 1 illustrates a structure of an apparatus for transmitting broadcast signals for future broadcast services according to an embodiment of the present invention.

Reference will now be made in detail to the preferred embodiments of the present invention, examples of which are illustrated in the accompanying drawings. The detailed description, which will be given below with reference to the accompanying drawings, is intended to explain exemplary embodiments of the present invention, rather than to show the only embodiments that can be implemented according to the present invention. The following detailed description includes specific details in order to provide a thorough understanding of the present invention. However, it will be apparent to those skilled in the art that the present invention may be practiced without such specific details.

Although most terms used in the present invention have been selected from general ones widely used in the art, some terms have been arbitrarily selected by the applicant and their meanings are explained in detail in the following description as needed. Thus, the present invention should be understood based upon the intended meanings of the terms rather than their simple names or meanings.

The present invention provides apparatuses and methods for transmitting and receiving broadcast signals for future broadcast services. Future broadcast services according to an embodiment of the present invention include a terrestrial broadcast service, a mobile broadcast service, a UHDTV service, etc. The present invention may process broadcast signals for the future broadcast services through non-MIMO (Multiple Input Multiple Output) or MIMO according to one embodiment. A non-MIMO scheme according to an embodiment of the present invention may include a MISO (Multiple Input Single Output) scheme, a SISO (Single Input Single Output) scheme, etc.

While MISO or MIMO uses two antennas in the following for convenience of description, the present invention is applicable to systems using two or more antennas.

The present invention may defines three physical layer (PL) profiles—base, handheld and advanced profiles—each optimized to minimize receiver complexity while attaining the performance required for a particular use case. The physical layer (PHY) profiles are subsets of all configurations that a corresponding receiver should implement.

The three PHY profiles share most of the functional blocks but differ slightly in specific blocks and/or parameters. Additional PHY profiles can be defined in the future. For the system evolution, future profiles can also be multiplexed with the existing profiles in a single RF channel through a future extension frame (FEF). The details of each PHY profile are described below.

1. Base Profile

The base profile represents a main use case for fixed receiving devices that are usually connected to a roof-top antenna. The base profile also includes portable devices that could be transported to a place but belong to a relatively stationary reception category. Use of the base profile could be extended to handheld devices or even vehicular by some improved implementations, but those use cases are not expected for the base profile receiver operation.

Target SNR range of reception is from approximately 10 to 20 dB, which includes the 15 dB SNR reception capability of the existing broadcast system (e.g. ATSC A/53). The receiver complexity and power consumption is not as critical as in the battery-operated handheld devices, which will use the handheld profile. Key system parameters for the base profile are listed in below table 1.

TABLE 1

| | |
|---|---|
| LDPC codeword length | 16K, 64K bits |
| Constellation size | 4~10 bpcu (bits per channel use) |
| Time de-interleaving memory size | ≤$2^{19}$ data cells |
| Pilot patterns | Pilot pattern for fixed reception |
| FFT size | 16K, 32K points |

2. Handheld Profile

The handheld profile is designed for use in handheld and vehicular devices that operate with battery power. The devices can be moving with pedestrian or vehicle speed. The power consumption as well as the receiver complexity is very important for the implementation of the devices of the handheld profile. The target SNR range of the handheld profile is approximately 0 to 10 dB, but can be configured to reach below 0 dB when intended for deeper indoor reception.

In addition to low SNR capability, resilience to the Doppler Effect caused by receiver mobility is the most important performance attribute of the handheld profile. Key system parameters for the handheld profile are listed in the below table 2.

TABLE 2

| | |
|---|---|
| LDPC codeword length | 16K bits |
| Constellation size | 2~8 bpcu |
| Time de-interleaving memory size | ≤$2^{18}$ data cells |
| Pilot patterns | Pilot patterns for mobile and indoor reception |
| FFT size | 8K, 16K points |

3. Advanced Profile

The advanced profile provides highest channel capacity at the cost of more implementation complexity. This profile requires using MIMO transmission and reception, and UHDTV service is a target use case for which this profile is specifically designed. The increased capacity can also be used to allow an increased number of services in a given bandwidth, e.g., multiple SDTV or HDTV services.

The target SNR range of the advanced profile is approximately 20 to 30 dB. MIMO transmission may initially use existing elliptically-polarized transmission equipment, with extension to full-power cross-polarized transmission in the future. Key system parameters for the advanced profile are listed in below table 3.

TABLE 3

| | |
|---|---|
| LDPC codeword length | 16K, 64K bits |
| Constellation size | 8~12 bpcu |
| Time de-interleaving memory size | ≤$2^{19}$ data cells |
| Pilot patterns | Pilot pattern for fixed reception |
| FFT size | 16K, 32K points |

In this case, the base profile can be used as a profile for both the terrestrial broadcast service and the mobile broadcast service. That is, the base profile can be used to define a concept of a profile which includes the mobile profile. Also, the advanced profile can be divided advanced profile for a base profile with MIMO and advanced profile for a handheld profile with MIMO. Moreover, the three profiles can be changed according to intention of the designer.

The following terms and definitions may apply to the present invention. The following terms and definitions can be changed according to design.

auxiliary stream: sequence of cells carrying data of as yet undefined modulation and coding, which may be used for future extensions or as required by broadcasters or network operators;

base data pipe: data pipe that carries service signaling data;

baseband frame (or BBFRAME): set of Kbch bits which form the input to one FEC encoding process (BCH and LDPC encoding);

cell: modulation value that is carried by one carrier of the OFDM transmission;

coded block: LDPC-encoded block of PLS1 data or one of the LDPC-encoded blocks of PLS2 data;

data pipe: logical channel in the physical layer that carries service data or related metadata, which may carry one or multiple service(s) or service component(s);

data pipe unit: a basic unit for allocating data cells to a DP in a frame;

data symbol: OFDM symbol in a frame which is not a preamble symbol (the frame signaling symbol and frame edge symbol is included in the data symbol);

DP_ID: this 8-bit field identifies uniquely a DP within the system identified by the SYSTEM_ID;

dummy cell: cell carrying a pseudo-random value used to fill the remaining capacity not used for PLS signaling, DPs or auxiliary streams;

emergency alert channel: part of a frame that carries EAS information data;

frame: physical layer time slot that starts with a preamble and ends with a frame edge symbol;

frame repetition unit: a set of frames belonging to same or different physical layer profile including a FEF, which is repeated eight times in a super-frame;

fast information channel: a logical channel in a frame that carries the mapping information between a service and the corresponding base DP;

FECBLOCK: set of LDPC-encoded bits of a DP data;

FFT size: nominal FFT size used for a particular mode, equal to the active symbol period Ts expressed in cycles of the elementary period T;

frame signaling symbol: OFDM symbol with higher pilot density used at the start of a frame in certain combinations of FFT size, guard interval and scattered pilot pattern, which carries a part of the PLS data;

frame edge symbol: OFDM symbol with higher pilot density used at the end of a frame in certain combinations of FFT size, guard interval and scattered pilot pattern;

frame-group: the set of all the frames having the same PHY profile type in a super-frame;

future extension frame: physical layer time slot within the super-frame that could be used for future extension, which starts with a preamble;

Futurecast UTB system: proposed physical layer broadcasting system, of which the input is one or more MPEG2-TS or IP or general stream(s) and of which the output is an RF signal;

input stream: A stream of data for an ensemble of services delivered to the end users by the system;

normal data symbol: data symbol excluding the frame signaling symbol and the frame edge symbol;

PHY profile: subset of all configurations that a corresponding receiver should implement;

PLS: physical layer signaling data consisting of PLS1 and PLS2;

PLS1: a first set of PLS data carried in the FSS symbols having a fixed size, coding and modulation, which carries basic information about the system as well as the parameters needed to decode the PLS2;

NOTE: PLS1 data remains constant for the duration of a frame-group.

PLS2: a second set of PLS data transmitted in the FSS symbol, which carries more detailed PLS data about the system and the DPs;

PLS2 dynamic data: PLS2 data that may dynamically change frame-by-frame;

PLS2 static data: PLS2 data that remains static for the duration of a frame-group;

preamble signaling data: signaling data carried by the preamble symbol and used to identify the basic mode of the system;

preamble symbol: fixed-length pilot symbol that carries basic PLS data and is located in the beginning of a frame;

NOTE: The preamble symbol is mainly used for fast initial band scan to detect the system signal, its timing, frequency offset, and FFT-size.

reserved for future use: not defined by the present document but may be defined in future;

super-frame: set of eight frame repetition units;

time interleaving block (TI block): set of cells within which time interleaving is carried out, corresponding to one use of the time interleaver memory;

TI group: unit over which dynamic capacity allocation for a particular DP is carried out, made up of an integer, dynamically varying number of XFECBLOCKs;

NOTE: The TI group may be mapped directly to one frame or may be mapped to multiple frames. It may contain one or more TI blocks.

Type 1 DP: DP of a frame where all DPs are mapped into the frame in TDM fashion;

Type 2 DP: DP of a frame where all DPs are mapped into the frame in FDM fashion; and XFECBLOCK: set of Ncells cells carrying all the bits of one LDPC FECBLOCK.

FIG. 1 illustrates a structure of an apparatus for transmitting broadcast signals for future broadcast services according to an embodiment of the present invention.

The apparatus for transmitting broadcast signals for future broadcast services according to an embodiment of the present invention can include an input formatting block 1000, a BICM (Bit interleaved coding & modulation) block 1010, a frame structure block 1020, an OFDM (Orthogonal Frequency Division Multiplexing) generation block 1030 and a signaling generation block 1040. A description will be given of the operation of each module of the apparatus for transmitting broadcast signals.

IP stream/packets and MPEG2-TS are the main input formats, other stream types are handled as General Streams. In addition to these data inputs, Management Information is input to control the scheduling and allocation of the corresponding bandwidth for each input stream. One or multiple TS stream(s), IP stream(s) and/or General Stream(s) inputs are simultaneously allowed.

The input formatting block 1000 can demultiplex each input stream into one or multiple data pipe(s), to each of which an independent coding and modulation is applied. The data pipe (DP) is the basic unit for robustness control, thereby affecting quality-of-service (QoS). One or multiple service(s) or service component(s) can be carried by a single DP. Details of operations of the input formatting block 1000 will be described later.

The data pipe is a logical channel in the physical layer that carries service data or related metadata, which may carry one or multiple service(s) or service component(s).

Also, the data pipe unit: a basic unit for allocating data cells to a DP in a frame.

In the BICM block 1010, parity data is added for error correction and the encoded bit streams are mapped to complex-value constellation symbols. The symbols are interleaved across a specific interleaving depth that is used for the corresponding DP. For the advanced profile, MIMO encoding is performed in the BICM block 1010 and the additional data path is added at the output for MIMO transmission. Details of operations of the BICM block 1010 will be described later.

The Frame Building block 1020 can map the data cells of the input DPs into the OFDM symbols within a frame. After mapping, the frequency interleaving is used for frequency-domain diversity, especially to combat frequency-selective fading channels. Details of operations of the Frame Building block 1020 will be described later.

After inserting a preamble at the beginning of each frame, the OFDM Generation block 1030 can apply conventional OFDM modulation having a cyclic prefix as guard interval. For antenna space diversity, a distributed MISO scheme is applied across the transmitters. In addition, a Peak-to-Average Power Reduction (PAPR) scheme is performed in the time domain. For flexible network planning, this proposal provides a set of various FFT sizes, guard interval lengths and corresponding pilot patterns. Details of operations of the OFDM Generation block 1030 will be described later.

The Signaling Generation block 1040 can create physical layer signaling information used for the operation of each functional block. This signaling information is also transmitted so that the services of interest are properly recovered at the receiver side. Details of operations of the Signaling Generation block 1040 will be described later.

Figure 2:
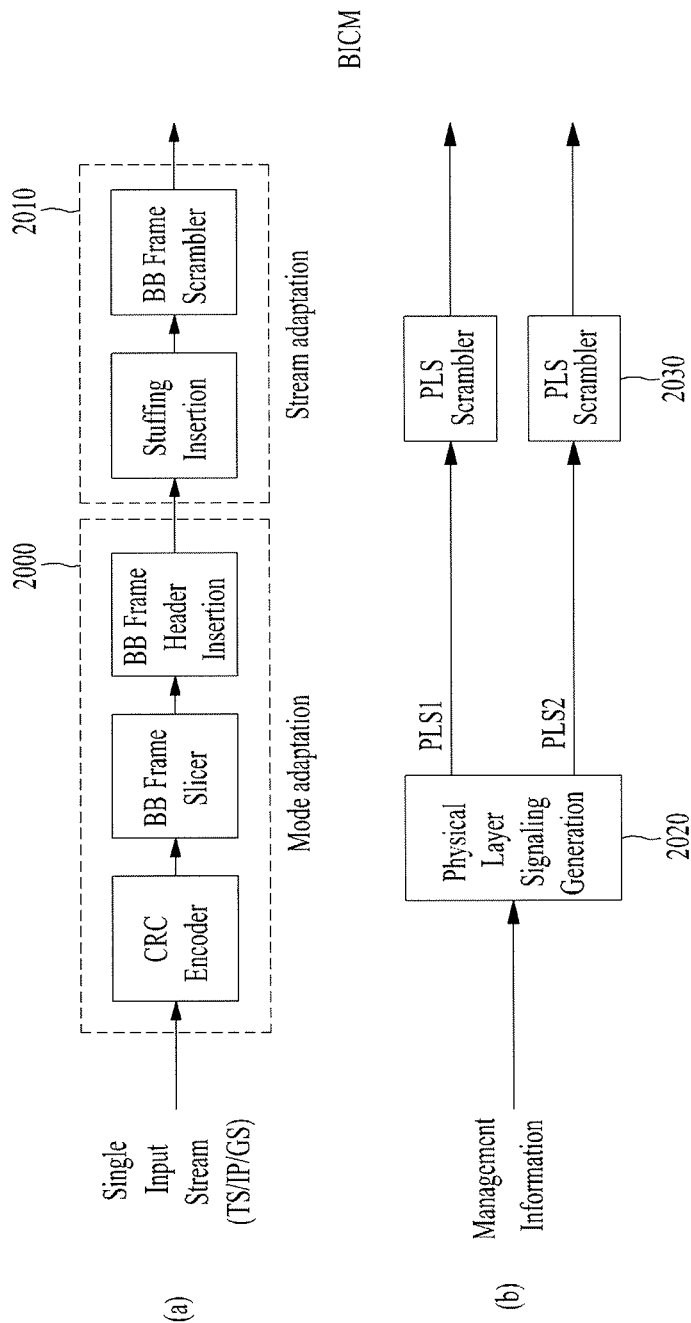
FIG. 2 illustrates an input formatting block according to one embodiment of the present invention.
Figure 3:
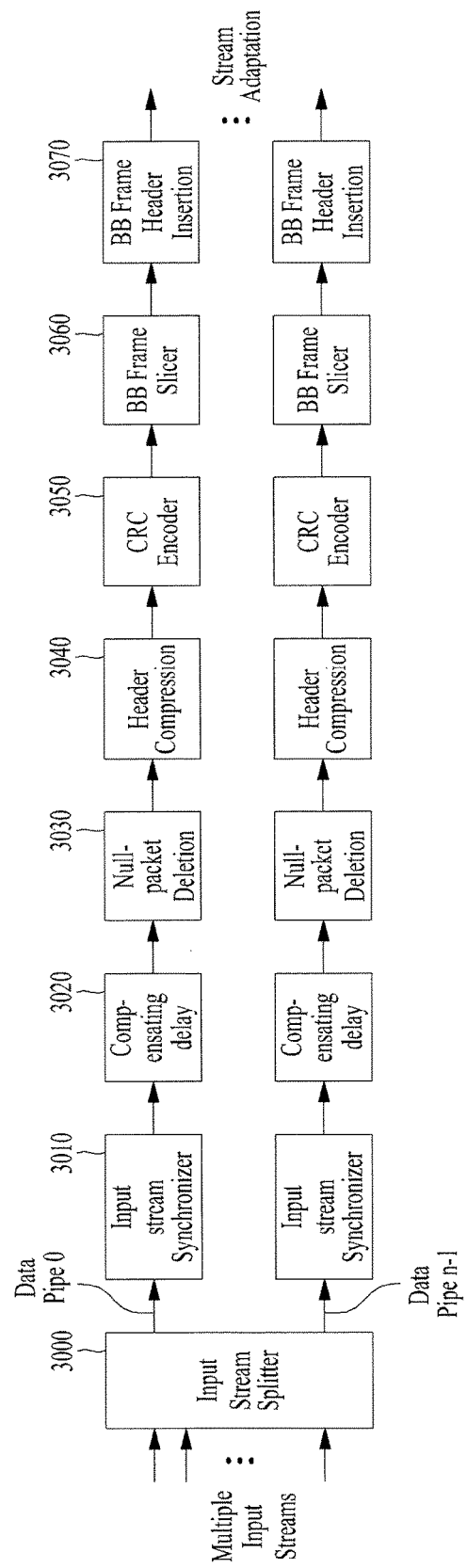
FIG. 3 illustrates an input formatting block according to another embodiment of the present invention.
Figure 4:
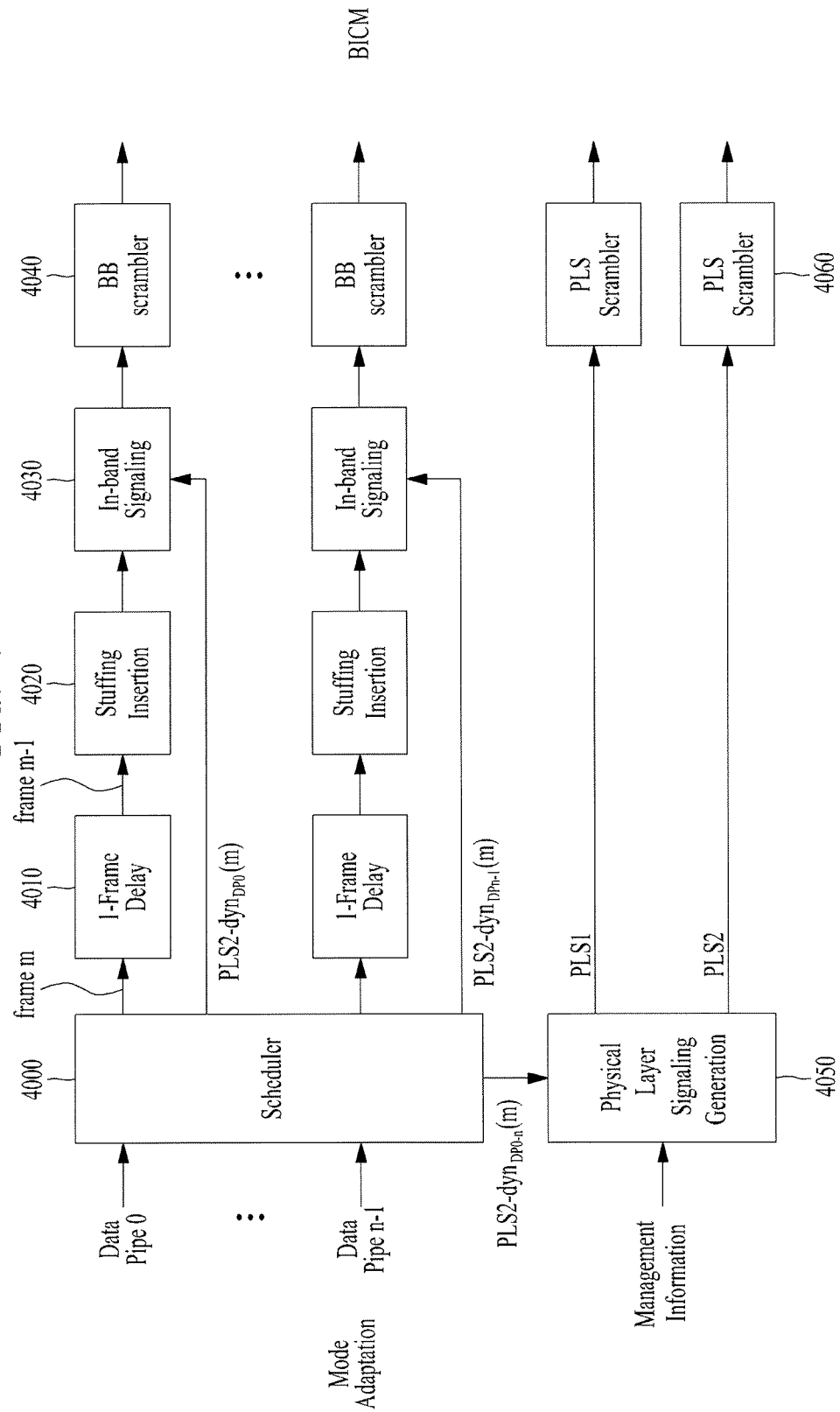
FIG. 4 illustrates an input formatting block according to another embodiment of the present invention.

FIGS. 2, 3 and 4 illustrate the input formatting block 1000 according to embodiments of the present invention. A description will be given of each figure.

FIG. 2, including view (a) and view (b), illustrates an input formatting block according to one embodiment of the present invention. FIG. 2 shows an input formatting module when the input signal is a single input stream.

The input formatting block illustrated in FIG. 2 corresponds to an embodiment of the input formatting block 1000 described with reference to FIG. 1.

The input to the physical layer may be composed of one or multiple data streams. Each data stream is carried by one DP. The mode adaptation modules slice the incoming data stream into data fields of the baseband frame (BBF). The system supports three types of input data streams: MPEG2-TS, Internet protocol (IP) and Generic stream (GS). MPEG2-TS is characterized by fixed length (188 byte) packets with the first byte being a sync-byte (0×47). An IP stream is composed of variable length IP datagram packets, as signaled within IP packet headers. The system supports both IPv4 and IPv6 for the IP stream. GS may be composed of variable length packets or constant length packets, signaled within encapsulation packet headers.

FIG. 2(*a*) shows a mode adaptation block 2000 and a stream adaptation 2010 for signal DP and FIG. 2(*b*) shows a PLS generation block 2020 and a PLS scrambler 2030 for generating and processing PLS data. A description will be given of the operation of each block.

The Input Stream Splitter splits the input TS, IP, GS streams into multiple service or service component (audio, video, etc.) streams. The mode adaptation module 2010 is comprised of a CRC Encoder, BB (baseband) Frame Slicer, and BB Frame Header Insertion block.

The CRC Encoder provides three kinds of CRC encoding for error detection at the user packet (UP) level, i.e., CRC-8, CRC-16, and CRC-32. The computed CRC bytes are appended after the UP. CRC-8 is used for TS stream and CRC-32 for IP stream. If the GS stream doesn't provide the CRC encoding, the proposed CRC encoding should be applied.

BB Frame Slicer maps the input into an internal logical-bit format. The first received bit is defined to be the MSB. The BB Frame Slicer allocates a number of input bits equal to the available data field capacity. To allocate a number of input bits equal to the BBF payload, the UP packet stream is sliced to fit the data field of BBF.

BB Frame Header Insertion block can insert fixed length BBF header of 2 bytes is inserted in front of the BB Frame. The BBF header is composed of STUFFI (1 bit), SYNCD (13 bits), and RFU (2 bits). In addition to the fixed 2-Byte BBF header, BBF can have an extension field (1 or 3 bytes) at the end of the 2-byte BBF header.

The stream adaptation 2010 is comprised of stuffing insertion block and BB scrambler.

The stuffing insertion block can insert stuffing field into a payload of a BB frame. If the input data to the stream adaptation is sufficient to fill a BB-Frame, STUFFI is set to '0' and the BBF has no stuffing field. Otherwise STUFFI is set to '1' and the stuffing field is inserted immediately after the BBF header. The stuffing field comprises two bytes of the stuffing field header and a variable size of stuffing data.

The BB scrambler scrambles complete BBF for energy dispersal. The scrambling sequence is synchronous with the BBF. The scrambling sequence is generated by the feedback shift register.

The PLS generation block 2020 can generate physical layer signaling (PLS) data. The PLS provides the receiver with a means to access physical layer DPs. The PLS data consists of PLS1 data and PLS2 data.

The PLS1 data is a first set of PLS data carried in the FSS symbols in the frame having a fixed size, coding and modulation, which carries basic information about the system as well as the parameters needed to decode the PLS2 data. The PLS1 data provides basic transmission parameters including parameters required to enable the reception and decoding of the PLS2 data. Also, the PLS1 data remains constant for the duration of a frame-group.

The PLS2 data is a second set of PLS data transmitted in the FSS symbol, which carries more detailed PLS data about the system and the DPs. The PLS2 contains parameters that provide sufficient information for the receiver to decode the desired DP. The PLS2 signaling further consists of two types of parameters, PLS2 Static data (PLS2-STAT data) and PLS2 dynamic data (PLS2-DYN data). The PLS2 Static data is PLS2 data that remains static for the duration of a frame-group and the PLS2 dynamic data is PLS2 data that may dynamically change frame-by-frame.

Details of the PLS data will be described later.

The PLS scrambler 2030 can scramble the generated PLS data for energy dispersal.

The above-described blocks may be omitted or replaced by blocks having similar or identical functions.

FIG. 3 illustrates an input formatting block according to another embodiment of the present invention.

The input formatting block illustrated in FIG. 3 corresponds to an embodiment of the input formatting block 1000 described with reference to FIG. 1.

FIG. 3 shows a mode adaptation block of the input formatting block when the input signal corresponds to multiple input streams.

The mode adaptation block of the input formatting block for processing the multiple input streams can independently process the multiple input streams.

Referring to FIG. 3, the mode adaptation block for respectively processing the multiple input streams can include an input stream splitter 3000, an input stream synchronizer 3010, a compensating delay block 3020, a null packet deletion block 3030, a head compression block 3040, a CRC encoder 3050, a BB frame slicer 3060 and a BB header insertion block 3070. Description will be given of each block of the mode adaptation block.

Operations of the CRC encoder 3050, BB frame slicer 3060 and BB header insertion block 3070 correspond to those of the CRC encoder, BB frame slicer and BB header insertion block described with reference to FIG. 2 and thus description thereof is omitted.

The input stream splitter 3000 can split the input TS, IP, GS streams into multiple service or service component (audio, video, etc.) streams.

The input stream synchronizer 3010 may be referred as ISSY. The ISSY can provide suitable means to guarantee Constant Bit Rate (CBR) and constant end-to-end transmission delay for any input data format. The ISSY is always used for the case of multiple DPs carrying TS, and optionally used for multiple DPs carrying GS streams.

The compensating delay block 3020 can delay the split TS packet stream following the insertion of ISSY information to allow a TS packet recombining mechanism without requiring additional memory in the receiver.

The null packet deletion block 3030, is used only for the TS input stream case. Some TS input streams or split TS streams may have a large number of null-packets present in order to accommodate VBR (variable bit-rate) services in a CBR TS stream. In this case, in order to avoid unnecessary transmission overhead, null-packets can be identified and not transmitted. In the receiver, removed null-packets can be re-inserted in the exact place where they were originally by reference to a deleted null-packet (DNP) counter that is inserted in the transmission, thus guaranteeing constant bit-rate and avoiding the need for time-stamp (PCR) updating.

The head compression block 3040 can provide packet header compression to increase transmission efficiency for TS or IP input streams. Because the receiver can have a priori information on certain parts of the header, this known information can be deleted in the transmitter.

For Transport Stream, the receiver has a-priori information about the sync-byte configuration (0×47) and the packet length (188 Byte). If the input TS stream carries content that has only one PID, i.e., for only one service component (video, audio, etc.) or service sub-component (SVC base layer, SVC enhancement layer, MVC base view or MVC dependent views), TS packet header compression can be applied (optionally) to the Transport Stream. IP packet header compression is used optionally if the input steam is an IP stream.

The above-described blocks may be omitted or replaced by blocks having similar or identical functions.

FIG. 4 illustrates an input formatting block according to another embodiment of the present invention.

The input formatting block illustrated in FIG. 4 corresponds to an embodiment of the input formatting block 1000 described with reference to FIG. 1.

FIG. 4 illustrates a stream adaptation block of the input formatting module when the input signal corresponds to multiple input streams.

Referring to FIG. 4, the mode adaptation block for respectively processing the multiple input streams can include a scheduler 4000, an 1-Frame delay block 4010, a stuffing insertion block 4020, an in-band signaling 4030, a BB Frame scrambler 4040, a PLS generation block 4050 and a PLS scrambler 4060. Description will be given of each block of the stream adaptation block.

Operations of the stuffing insertion block 4020, the BB Frame scrambler 4040, the PLS generation block 4050 and the PLS scrambler 4060 correspond to those of the stuffing insertion block, BB scrambler, PLS generation block and the PLS scrambler described with reference to FIG. 2 and thus description thereof is omitted.

The scheduler 4000 can determine the overall cell allocation across the entire frame from the amount of FEC-BLOCKs of each DP. Including the allocation for PLS, EAC and FIC, the scheduler generate the values of PLS2-DYN data, which is transmitted as in-band signaling or PLS cell in FSS of the frame. Details of FECBLOCK, EAC and FIC will be described later.

The 1-Frame delay block 4010 can delay the input data by one transmission frame such that scheduling information about the next frame can be transmitted through the current frame for in-band signaling information to be inserted into the DPs.

The in-band signaling 4030 can insert un-delayed part of the PLS2 data into a DP of a frame.

The above-described blocks may be omitted or replaced by blocks having similar or identical functions.

Figure 5:
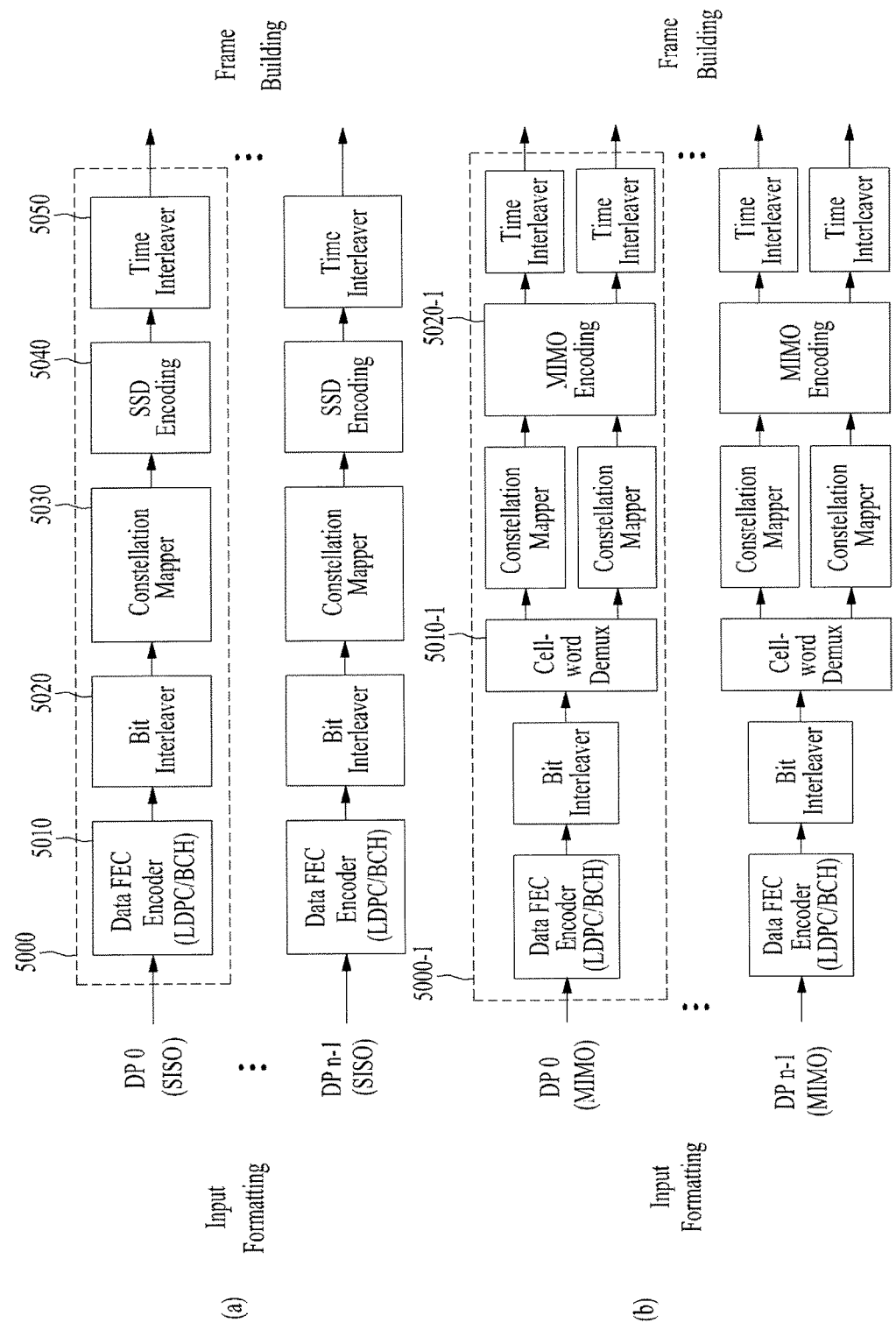
FIG. 5 illustrates a BICM block according to an embodiment of the present invention.

FIG. 5, including view (a) and view (b), illustrates a BICM block according to an embodiment of the present invention.

The BICM block illustrated in FIG. 5 corresponds to an embodiment of the BICM block 1010 described with reference to FIG. 1.

As described above, the apparatus for transmitting broadcast signals for future broadcast services according to an embodiment of the present invention can provide a terrestrial broadcast service, mobile broadcast service, UHDTV service, etc.

Since QoS (quality of service) depends on characteristics of a service provided by the apparatus for transmitting broadcast signals for future broadcast services according to an embodiment of the present invention, data corresponding to respective services needs to be processed through different schemes. Accordingly, the a BICM block according to an embodiment of the present invention can independently process DPs input thereto by independently applying SISO, MISO and MIMO schemes to the data pipes respectively corresponding to data paths. Consequently, the apparatus for transmitting broadcast signals for future broadcast services according to an embodiment of the present invention can control QoS for each service or service component transmitted through each DP.

FIG. 5(a) shows the BICM block shared by the base profile and the handheld profile and FIG. 5(b) shows the BICM block of the advanced profile.

The BICM block shared by the base profile and the handheld profile and the BICM block of the advanced profile can include plural processing blocks for processing each DP.

A description will be given of each processing block of the BICM block for the base profile and the handheld profile and the BICM block for the advanced profile.

A processing block 5000 of the BICM block for the base profile and the handheld profile can include a Data FEC encoder 5010, a bit interleaver 5020, a constellation mapper 5030, an SSD (Signal Space Diversity) encoding block 5040 and a time interleaver 5050.

The Data FEC encoder 5010 can perform the FEC encoding on the input BBF to generate FECBLOCK procedure using outer coding (BCH), and inner coding (LDPC). The outer coding (BCH) is optional coding method. Details of operations of the Data FEC encoder 5010 will be described later.

The bit interleaver 5020 can interleave outputs of the Data FEC encoder 5010 to achieve optimized performance with combination of the LDPC codes and modulation scheme while providing an efficiently implementable structure. Details of operations of the bit interleaver 5020 will be described later.

The constellation mapper 5030 can modulate each cell word from the bit interleaver 5020 in the base and the handheld profiles, or cell word from the Cell-word demultiplexer 5010-1 in the advanced profile using either QPSK, QAM-16, non-uniform QAM (NUQ-64, NUQ-256, NUQ-1024) or non-uniform constellation (NUC-16, NUC-64, NUC-256, NUC-1024) to give a power-normalized constellation point, el. This constellation mapping is applied only for DPs. Observe that QAM-16 and NUQs are square shaped, while NUCs have arbitrary shape. When each constellation is rotated by any multiple of 90 degrees, the rotated constellation exactly overlaps with its original one. This "rotation-sense" symmetric property makes the capacities and the average powers of the real and imaginary components equal to each other. Both NUQs and NUCs are defined specifically for each code rate and the particular one used is signaled by the parameter DP_MOD filed in PLS2 data.

The SSD encoding block 5040 can precode cells in two (2D), three (3D), and four (4D) dimensions to increase the reception robustness under difficult fading conditions.

The time interleaver 5050 can operates at the DP level. The parameters of time interleaving (TI) may be set differently for each DP. Details of operations of the time interleaver 5050 will be described later.

A processing block 5000-1 of the BICM block for the advanced profile can include the Data FEC encoder, bit interleaver, constellation mapper, and time interleaver. However, the processing block 5000-1 is distinguished from the processing block 5000 further includes a cell-word demultiplexer 5010-1 and a MIMO encoding block 5020-1.

Also, the operations of the Data FEC encoder, bit interleaver, constellation mapper, and time interleaver in the processing block 5000-1 correspond to those of the Data FEC encoder 5010, bit interleaver 5020, constellation mapper 5030, and time interleaver 5050 described and thus description thereof is omitted.

The cell-word demultiplexer 5010-1 is used for the DP of the advanced profile to divide the single cell-word stream into dual cell-word streams for MIMO processing. Details of operations of the cell-word demultiplexer 5010-1 will be described later.

The MIMO encoding block 5020-1 can processing the output of the cell-word demultiplexer 5010-1 using MIMO encoding scheme. The MIMO encoding scheme was optimized for broadcasting signal transmission. The MIMO technology is a promising way to get a capacity increase but it depends on channel characteristics. Especially for broadcasting, the strong LOS component of the channel or a difference in the received signal power between two antennas caused by different signal propagation characteristics makes it difficult to get capacity gain from MIMO. The proposed MIMO encoding scheme overcomes this problem using a rotation-based pre-coding and phase randomization of one of the MIMO output signals.

MIMO encoding is intended for a 2×2 MIMO system requiring at least two antennas at both the transmitter and the receiver. Two MIMO encoding modes are defined in this proposal; full-rate spatial multiplexing (FR-SM) and full-rate full-diversity spatial multiplexing (FRFD-SM). The FR-SM encoding provides capacity increase with relatively small complexity increase at the receiver side while the FRFD-SM encoding provides capacity increase and additional diversity gain with a great complexity increase at the receiver side. The proposed MIMO encoding scheme has no restriction on the antenna polarity configuration.

MIMO processing is required for the advanced profile frame, which means all DPs in the advanced profile frame are processed by the MIMO encoder. MIMO processing is applied at DP level. Pairs of the Constellation Mapper outputs NUQ (e1,i and e2,i) are fed to the input of the MIMO Encoder. Paired MIMO Encoder output (g1,i and g2,i) is transmitted by the same carrier k and OFDM symbol l of their respective TX antennas.

The above-described blocks may be omitted or replaced by blocks having similar or identical functions.

Figure 6:
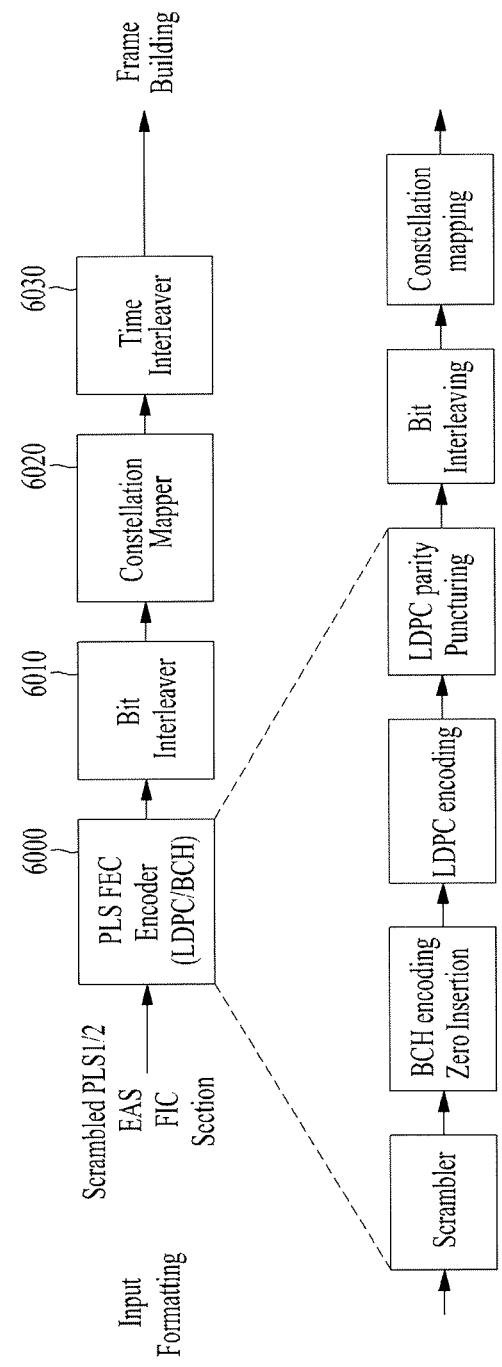
FIG. 6 illustrates a BICM block according to another embodiment of the present invention.

FIG. 6 illustrates a BICM block according to another embodiment of the present invention.

The BICM block illustrated in FIG. 6 corresponds to an embodiment of the BICM block 1010 described with reference to FIG. 1.

FIG. 6 illustrates a BICM block for protection of physical layer signaling (PLS), emergency alert channel (EAC) and fast information channel (FIC). EAC is a part of a frame that carries EAS information data and FIC is a logical channel in a frame that carries the mapping information between a service and the corresponding base DP. Details of the EAC and FIC will be described later.

Referring to FIG. 6, the BICM block for protection of PLS, EAC and FIC can include a PLS FEC encoder 6000, a bit interleaver 6010 and a constellation mapper 6020.

Also, the PLS FEC encoder 6000 can include a scrambler, BCH encoding/zero insertion block, LDPC encoding block and LDPC parity puncturing block. Description will be given of each block of the BICM block.

The PLS FEC encoder 6000 can encode the scrambled PLS 1/2 data, EAC and FIC section.

The scrambler can scramble PLS1 data and PLS2 data before BCH encoding and shortened and punctured LDPC encoding.

The BCH encoding/zero insertion block can perform outer encoding on the scrambled PLS 1/2 data using the shortened BCH code for PLS protection and insert zero bits after the BCH encoding. For PLS1 data only, the output bits of the zero insertion may be permutted before LDPC encoding.

The LDPC encoding block can encode the output of the BCH encoding/zero insertion block using LDPC code. To generate a complete coded block, Cldpc, parity bits, Pldpc are encoded systematically from each zero-inserted PLS information block, Ildpc and appended after it.

$$C_{ldpc}=[I_{ldpc}P_{ldpc}]=[i_0,i_1,\ldots,i_{K_{ldpc}-1},P_0,P_1,\ldots,P_{N_{ldpc}-K_{ldpc}-1}]$$ [Math figure 1]

The LDPC code parameters for PLS1 and PLS2 are as following table 4.

TABLE 4

| Signaling Type | $K_{sig}$ | $K_{bch}$ | $N_{bch\_parity}$ | $K_{ldpc}$ (= $N_{bch}$) | $N_{ldpc}$ | $N_{ldpc\_parity}$ | code rate | $Q_{ldpc}$ |
|---|---|---|---|---|---|---|---|---|
| PLS1 | 342 | 1020 | 60 | 1080 | 4320 | 3240 | 1/4 | 36 |
| PLS2 | <1021 | | | | | | | |
| | >1020 | 2100 | | 2160 | 7200 | 5040 | 3/10 | 56 |

The LDPC parity puncturing block can perform puncturing on the PLS1 data and PLS 2 data.

When shortening is applied to the PLS1 data protection, some LDPC parity bits are punctured after LDPC encoding. Also, for the PLS2 data protection, the LDPC parity bits of PLS2 are punctured after LDPC encoding. These punctured bits are not transmitted.

The bit interleaver 6010 can interleave the each shortened and punctured PLS1 data and PLS2 data.

The constellation mapper 6020 can map the bit interleaved PLS1 data and PLS2 data onto constellations.

The above-described blocks may be omitted or replaced by blocks having similar or identical functions.

Figure 7:
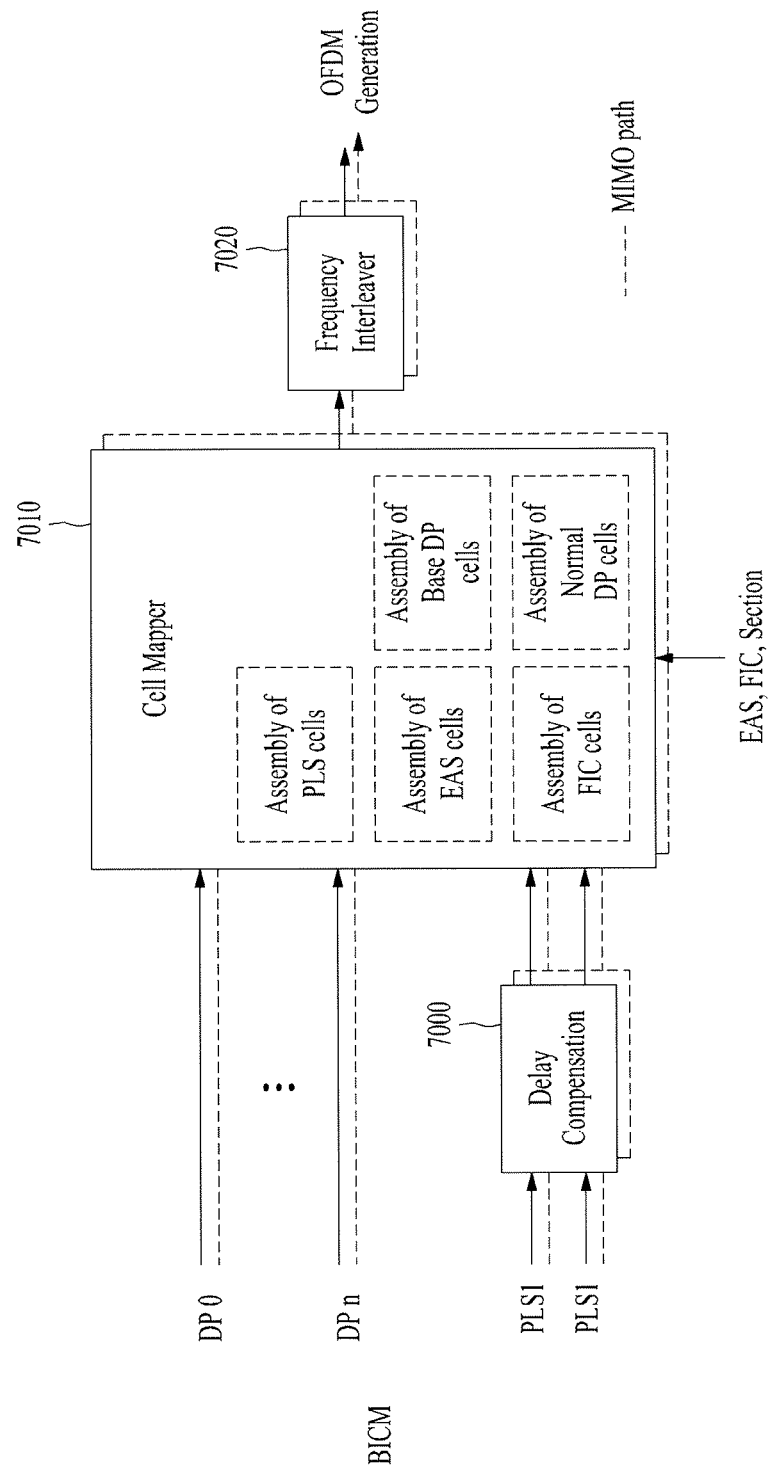
FIG. 7 illustrates a frame building block according to one embodiment of the present invention.

FIG. 7 illustrates a frame building block according to one embodiment of the present invention.

The frame building block illustrated in FIG. 7 corresponds to an embodiment of the frame building block 1020 described with reference to FIG. 1.

Referring to FIG. 7, the frame building block can include a delay compensation block 7000, a cell mapper 7010 and a frequency interleaver 7020. Description will be given of each block of the frame building block.

The delay compensation block 7000 can adjust the timing between the data pipes and the corresponding PLS data to ensure that they are co-timed at the transmitter end. The PLS data is delayed by the same amount as data pipes are by addressing the delays of data pipes caused by the Input Formatting block and BICM block. The delay of the BICM block is mainly due to the time interleaver 5050. In-band signaling data carries information of the next TI group so that they are carried one frame ahead of the DPs to be signaled. The Delay Compensating block delays in-band signaling data accordingly.

The cell mapper 7010 can map PLS, EAC, FIC, DPs, auxiliary streams and dummy cells into the active carriers of the OFDM symbols in the frame. The basic function of the cell mapper 7010 is to map data cells produced by the TIs for each of the DPs, PLS cells, and EAC/FIC cells, if any, into arrays of active OFDM cells corresponding to each of the OFDM symbols within a frame. Service signaling data (such as PSI(program specific information)/SI) can be separately gathered and sent by a data pipe. The Cell Mapper operates according to the dynamic information produced by the scheduler and the configuration of the frame structure. Details of the frame will be described later.

The frequency interleaver 7020 can randomly interleave data cells received from the cell mapper 7010 to provide frequency diversity. Also, the frequency interleaver 7020 can operate on very OFDM symbol pair comprised of two sequential OFDM symbols using a different interleaving-seed order to get maximum interleaving gain in a single frame.

The above-described blocks may be omitted or replaced by blocks having similar or identical functions.

Figure 8:
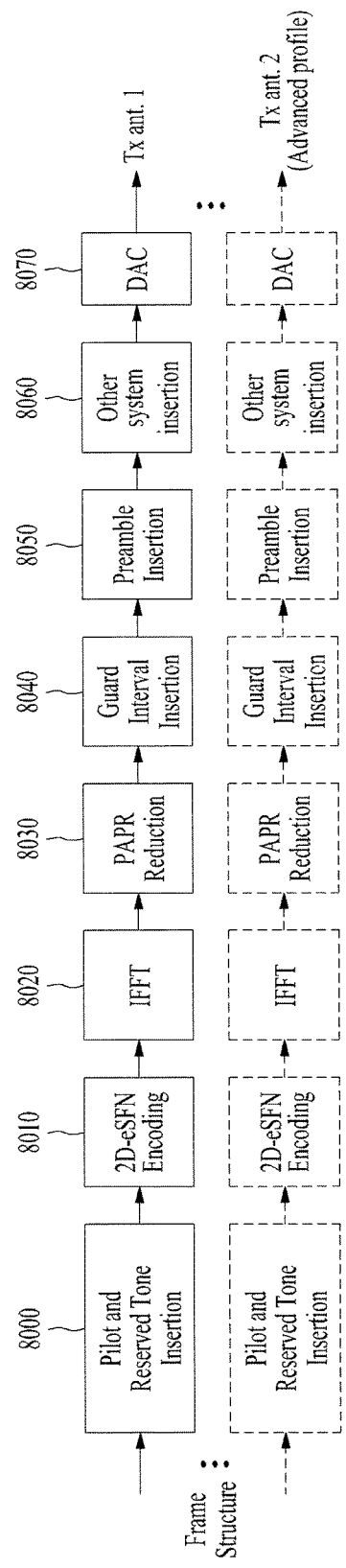
FIG. 8 illustrates an OFMD generation block according to an embodiment of the present invention.

FIG. 8 illustrates an OFMD generation block according to an embodiment of the present invention.

The OFMD generation block illustrated in FIG. 8 corresponds to an embodiment of the OFMD generation block 1030 described with reference to FIG. 1.

The OFDM generation block modulates the OFDM carriers by the cells produced by the Frame Building block, inserts the pilots, and produces the time domain signal for transmission. Also, this block subsequently inserts guard intervals, and applies PAPR (Peak-to-Average Power Radio) reduction processing to produce the final RF signal.

Referring to FIG. 8, the frame building block can include a pilot and reserved tone insertion block 8000, a 2D-eSFN encoding block 8010, an IFFT (Inverse Fast Fourier Transform) block 8020, a PAPR reduction block 8030, a guard interval insertion block 8040, a preamble insertion block 8050, other system insertion block 8060 and a DAC block 8070. Description will be given of each block of the frame building block.

The pilot and reserved tone insertion block 8000 can insert pilots and the reserved tone.

Various cells within the OFDM symbol are modulated with reference information, known as pilots, which have transmitted values known a priori in the receiver. The information of pilot cells is made up of scattered pilots, continual pilots, edge pilots, FSS (frame signaling symbol) pilots and FES (frame edge symbol) pilots. Each pilot is transmitted at a particular boosted power level according to pilot type and pilot pattern. The value of the pilot information is derived from a reference sequence, which is a series of values, one for each transmitted carrier on any given symbol. The pilots can be used for frame synchronization, frequency synchronization, time synchronization, channel estimation, and transmission mode identification, and also can be used to follow the phase noise.

Reference information, taken from the reference sequence, is transmitted in scattered pilot cells in every symbol except the preamble, FSS and FES of the frame. Continual pilots are inserted in every symbol of the frame. The number and location of continual pilots depends on both the FFT size and the scattered pilot pattern. The edge carriers are edge pilots in every symbol except for the preamble symbol. They are inserted in order to allow frequency interpolation up to the edge of the spectrum. FSS pilots are inserted in FSS(s) and FES pilots are inserted in FES. They are inserted in order to allow time interpolation up to the edge of the frame.

The system according to an embodiment of the present invention supports the SFN network, where distributed MISO scheme is optionally used to support very robust transmission mode. The 2D-eSFN is a distributed MISO scheme that uses multiple TX antennas, each of which is located in the different transmitter site in the SFN network.

The 2D-eSFN encoding block 8010 can process a 2D-eSFN processing to distorts the phase of the signals transmitted from multiple transmitters, in order to create both time and frequency diversity in the SFN configuration. Hence, burst errors due to low flat fading or deep-fading for a long time can be mitigated.

The IFFT block 8020 can modulate the output from the 2D-eSFN encoding block 8010 using OFDM modulation scheme. Any cell in the data symbols which has not been designated as a pilot (or as a reserved tone) carries one of the data cells from the frequency interleaver. The cells are mapped to OFDM carriers.

The PAPR reduction block 8030 can perform a PAPR reduction on input signal using various PAPR reduction algorithm in the time domain.

The guard interval insertion block 8040 can insert guard intervals and the preamble insertion block 8050 can insert preamble in front of the signal. Details of a structure of the preamble will be described later. The other system insertion block 8060 can multiplex signals of a plurality of broadcast transmission/reception systems in the time domain such that data of two or more different broadcast transmission/reception systems providing broadcast services can be simultaneously transmitted in the same RF signal bandwidth. In this case, the two or more different broadcast transmission/reception systems refer to systems providing different broadcast services. The different broadcast services may refer to a terrestrial broadcast service, mobile broadcast service, etc. Data related to respective broadcast services can be transmitted through different frames.

The DAC block 8070 can convert an input digital signal into an analog signal and output the analog signal. The signal output from the DAC block 7800 can be transmitted through multiple output antennas according to the physical layer profiles. A Tx antenna according to an embodiment of the present invention can have vertical or horizontal polarity.

The above-described blocks may be omitted or replaced by blocks having similar or identical functions according to design.

Figure 9:
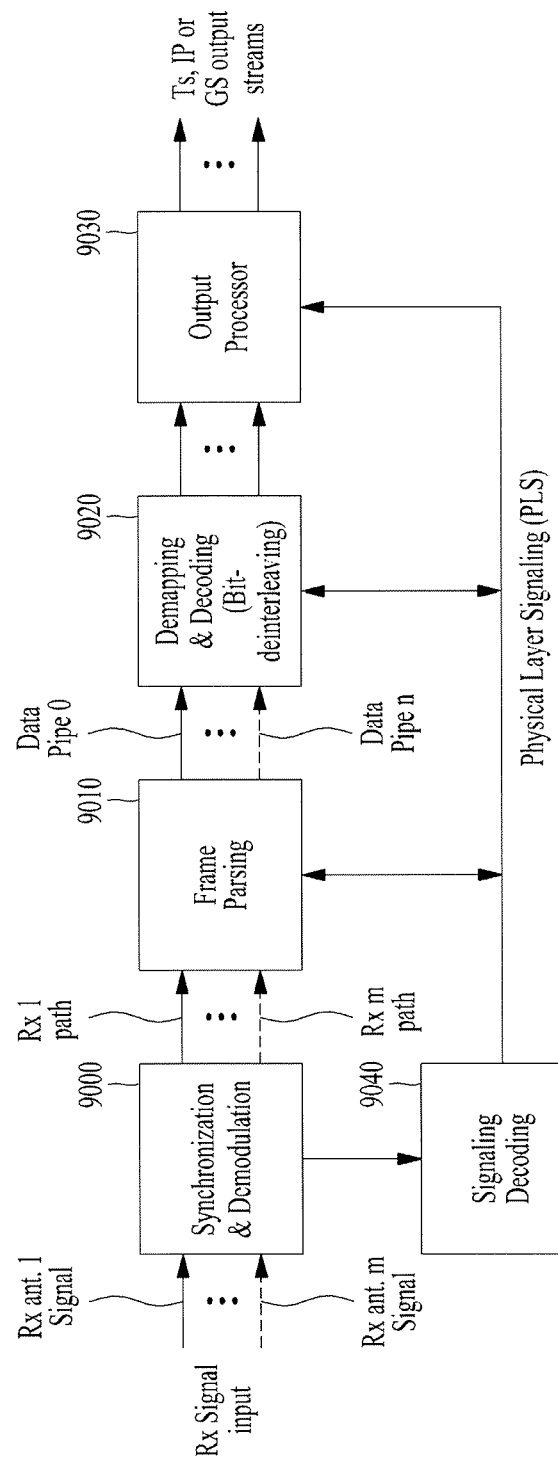
FIG. 9 illustrates a structure of an apparatus for receiving broadcast signals for future broadcast services according to an embodiment of the present invention.

FIG. 9 illustrates a structure of an apparatus for receiving broadcast signals for future broadcast services according to an embodiment of the present invention.

The apparatus for receiving broadcast signals for future broadcast services according to an embodiment of the present invention can correspond to the apparatus for transmitting broadcast signals for future broadcast services, described with reference to FIG. 1.

The apparatus for receiving broadcast signals for future broadcast services according to an embodiment of the present invention can include a synchronization & demodulation module 9000, a frame parsing module 9010, a demapping & decoding module 9020, an output processor 9030 and a signaling decoding module 9040. A description will be given of operation of each module of the apparatus for receiving broadcast signals.

The synchronization & demodulation module 9000 can receive input signals through m Rx antennas, perform signal detection and synchronization with respect to a system corresponding to the apparatus for receiving broadcast signals and carry out demodulation corresponding to a reverse procedure of the procedure performed by the apparatus for transmitting broadcast signals.

The frame parsing module 9100 can parse input signal frames and extract data through which a service selected by a user is transmitted. If the apparatus for transmitting broadcast signals performs interleaving, the frame parsing module 9100 can carry out deinterleaving corresponding to a reverse procedure of interleaving. In this case, the positions of a signal and data that need to be extracted can be obtained by decoding data output from the signaling decoding module 9400 to restore scheduling information generated by the apparatus for transmitting broadcast signals.

The demapping & decoding module 9200 can convert the input signals into bit domain data and then deinterleave the same as necessary. The demapping & decoding module 9200 can perform demapping for mapping applied for transmission efficiency and correct an error generated on a transmission channel through decoding. In this case, the demapping & decoding module 9200 can obtain transmission parameters necessary for demapping and decoding by decoding the data output from the signaling decoding module 9400.

The output processor 9300 can perform reverse procedures of various compression/signal processing procedures which are applied by the apparatus for transmitting broadcast signals to improve transmission efficiency. In this case, the output processor 9300 can acquire necessary control information from data output from the signaling decoding module 9400. The output of the output processor 8300 corresponds to a signal input to the apparatus for transmitting broadcast signals and may be MPEG-TSs, IP streams (v4 or v6) and generic streams.

The signaling decoding module 9400 can obtain PLS information from the signal demodulated by the synchronization & demodulation module 9000. As described above, the frame parsing module 9100, demapping & decoding module 9200 and output processor 9300 can execute functions thereof using the data output from the signaling decoding module 9400.

Figure 10:
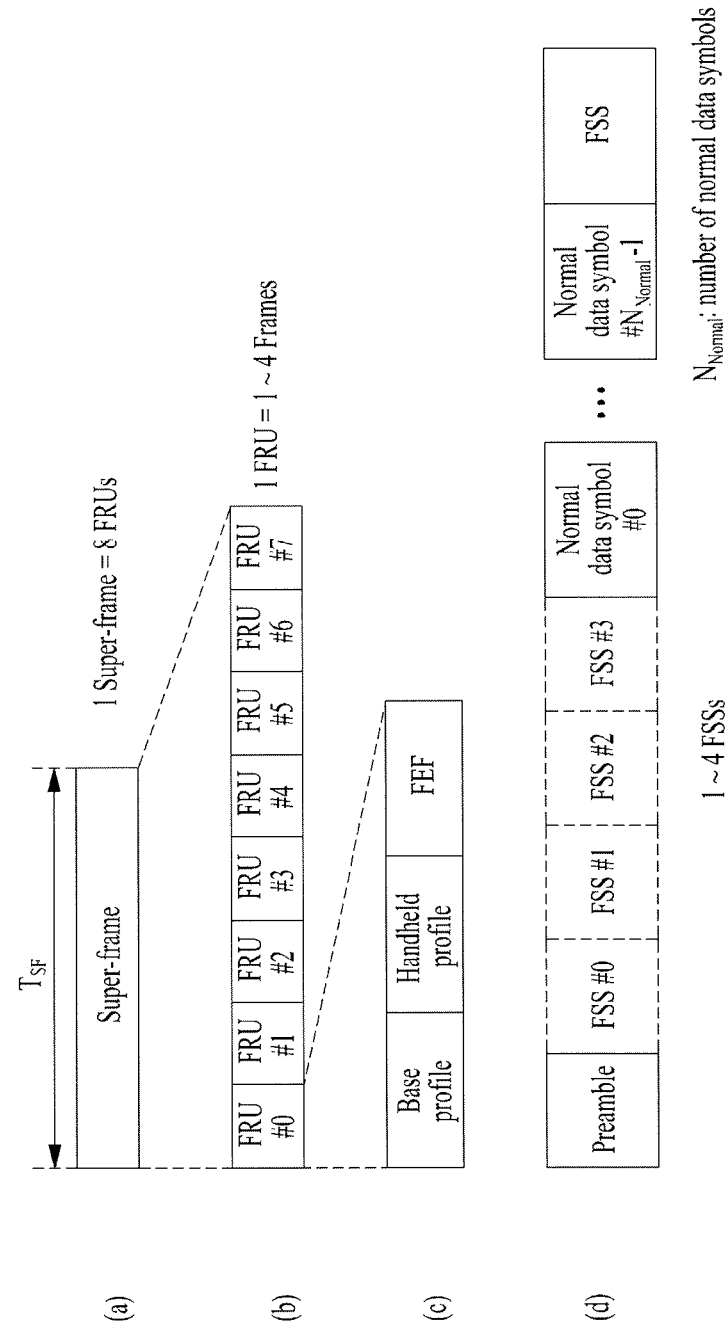
FIG. 10 illustrates a frame structure according to an embodiment of the present invention.

FIG. 10, including views (a)-(d), illustrates a frame structure according to an embodiment of the present invention.

FIG. 10 shows an example configuration of the frame types and FRUs in a super-frame. FIG. 10(*a*) shows a super frame according to an embodiment of the present invention, FIG. 10(*b*) shows FRU (Frame Repetition Unit) according to an embodiment of the present invention, FIG. 10(*c*) shows frames of variable PHY profiles in the FRU, and FIG. 10(*d*) shows a structure of a frame.

A super-frame may be composed of eight FRUs. The FRU is a basic multiplexing unit for TDM of the frames, and is repeated eight times in a super-frame.

Each frame in the FRU belongs to one of the PHY profiles, (base, handheld, advanced) or FEF. The maximum allowed number of the frames in the FRU is four and a given PHY profile can appear any number of times from zero times to four times in the FRU (e.g., base, base, handheld, advanced). PHY profile definitions can be extended using reserved values of the PHY_PROFILE in the preamble, if required.

The FEF part is inserted at the end of the FRU, if included. When the FEF is included in the FRU, the minimum number of FEFs is 8 in a super-frame. It is not recommended that FEF parts be adjacent to each other.

One frame is further divided into a number of OFDM symbols and a preamble. As shown in (d), the frame comprises a preamble, one or more frame signaling symbols (FSS), normal data symbols and a frame edge symbol (FES).

The preamble is a special symbol that enables fast Futurecast UTB system signal detection and provides a set of basic transmission parameters for efficient transmission and reception of the signal. The detailed description of the preamble will be will be described later.

The main purpose of the FSS(s) is to carry the PLS data. For fast synchronization and channel estimation, and hence fast decoding of PLS data, the FSS has more dense pilot pattern than the normal data symbol. The FES has exactly the same pilots as the FSS, which enables frequency-only interpolation within the FES and temporal interpolation, without extrapolation, for symbols immediately preceding the FES.

FIG. 11 illustrates a signaling hierarchy structure of the frame according to an embodiment of the present invention.

FIG. 11 illustrates the signaling hierarchy structure, which is split into three main parts: the preamble signaling data 11000, the PLS1 data 11010 and the PLS2 data 11020. The purpose of the preamble, which is carried by the preamble symbol in every frame, is to indicate the transmission type and basic transmission parameters of that frame. The PLS1 enables the receiver to access and decode the PLS2 data, which contains the parameters to access the DP of interest. The PLS2 is carried in every frame and split into two main parts: PLS2-STAT data and PLS2-DYN data. The static and dynamic portion of PLS2 data is followed by padding, if necessary.

FIG. 12 illustrates preamble signaling data according to an embodiment of the present invention.

Preamble signaling data carries 21 bits of information that are needed to enable the receiver to access PLS data and trace DPs within the frame structure. Details of the preamble signaling data are as follows:

PHY_PROFILE: This 3-bit field indicates the PHY profile type of the current frame. The mapping of different PHY profile types is given in below table 5.

TABLE 5

| Value | PHY Profile |
|---|---|
| 000 | Base profile |
| 001 | Handheld profile |
| 010 | Advanced profiled |
| 011~110 | Reserved |
| 111 | FEF |

FFT_SIZE: This 2 bit field indicates the FFT size of the current frame within a frame-group, as described in below table 6.

TABLE 6

| Value | FFT size |
|---|---|
| 00 | 8K FFT |
| 01 | 16K FFT |
| 10 | 32K FFT |
| 11 | Reserved |

GI_FRACTION: This 3 bit field indicates the guard interval fraction value in the current super-frame, as described in below table 7.

TABLE 7

| Value | GI_FRACTION |
|---|---|
| 000 | 1/5 |
| 001 | 1/10 |
| 010 | 1/20 |
| 011 | 1/40 |
| 100 | 1/80 |
| 101 | 1/160 |
| 110~111 | Reserved |

EAC_FLAG: This 1 bit field indicates whether the EAC is provided in the current frame. If this field is set to '1', emergency alert service (EAS) is provided in the current frame. If this field set to '0', EAS is not carried in the current frame. This field can be switched dynamically within a super-frame.

PILOT_MODE: This 1-bit field indicates whether the pilot mode is mobile mode or fixed mode for the current frame in the current frame-group. If this field is set to '0', mobile pilot mode is used. If the field is set to '1', the fixed pilot mode is used.

PAPR_FLAG: This 1-bit field indicates whether PAPR reduction is used for the current frame in the current frame-group. If this field is set to value '1', tone reservation is used for PAPR reduction. If this field is set to '0', PAPR reduction is not used.

FRU_CONFIGURE: This 3-bit field indicates the PHY profile type configurations of the frame repetition units (FRU) that are present in the current super-frame. All profile types conveyed in the current super-frame are identified in this field in all preambles in the current super-frame. The 3-bit field has a different definition for each profile, as show in below table 8.

TABLE 8

| | Current PHY_PROFILE = '000' (base) | Current PHY_PROFILE = '001' (handheld) | Current PHY_PROFILE = '010' (advanced) | Current PHY_PROFILE = '111' (FEF) |
|---|---|---|---|---|
| FRU_CONFIGURE = 000 | Only base profile present | Only handheld profile present | Only advanced profile present | Only FEF present |
| FRU_CONFIGURE = 1XX | Handheld profile present | Base profile present | Base profile present | Base profile present |
| FRU_CONFIGURE = X1X | Advanced profile present | Advanced profile present | Handheld profile present | Handheld profile present |
| FRU_CONFIGURE = XX1 | FEF present | FEF present | FEF present | Advanced profile present |

RESERVED: This 7-bit field is reserved for future use.

FIG. 13 illustrates PLS1 data according to an embodiment of the present invention.

PLS1 data provides basic transmission parameters including parameters required to enable the reception and decoding of the PLS2. As above mentioned, the PLS1 data remain unchanged for the entire duration of one frame-group. The detailed definition of the signaling fields of the PLS1 data are as follows:

PREAMBLE_DATA: This 20-bit field is a copy of the preamble signaling data excluding the EAC_FLAG.

NUM_FRAME_FRU: This 2-bit field indicates the number of the frames per FRU.

PAYLOAD_TYPE: This 3-bit field indicates the format of the payload data carried in the frame-group. PAYLOAD_TYPE is signaled as shown in table 9.

TABLE 9

| value | Payload type |
|---|---|
| 1XX | TS stream is transmitted |
| X1X | IP stream is transmitted |
| XX1 | GS stream is transmitted |

NUM_FSS: This 2-bit field indicates the number of FSS symbols in the current frame.

SYSTEM_VERSION: This 8-bit field indicates the version of the transmitted signal format. The SYSTEM_VERSION is divided into two 4-bit fields, which are a major version and a minor version.

Major version: The MSB four bits of SYSTEM_VERSION field indicate major version information. A change in the major version field indicates a non-backward-compatible change. The default value is '0000'. For the version described in this standard, the value is set to '0000'.

Minor version: The LSB four bits of SYSTEM_VERSION field indicate minor version information. A change in the minor version field is backward-compatible.

CELL_ID: This is a 16-bit field which uniquely identifies a geographic cell in an ATSC network. An ATSC cell coverage area may consist of one or more frequencies, depending on the number of frequencies used per Futurecast UTB system. If the value of the CELL_ID is not known or unspecified, this field is set to '0'.

NETWORK_ID: This is a 16-bit field which uniquely identifies the current ATSC network.

SYSTEM_ID: This 16-bit field uniquely identifies the Futurecast UTB system within the ATSC network. The Futurecast UTB system is the terrestrial broadcast system whose input is one or more input streams (TS, IP, GS) and whose output is an RF signal. The Futurecast UTB system carries one or more PHY profiles and FEF, if any. The same Futurecast UTB system may carry different input streams and use different RF frequencies in different geographical areas, allowing local service insertion. The frame structure and scheduling is controlled in one place and is identical for all transmissions within a Futurecast UTB system. One or more Futurecast UTB systems may have the same SYSTEM_ID meaning that they all have the same physical layer structure and configuration.

The following loop consists of FRU_PHY_PROFILE, FRU_FRAME_LENGTH, FRU_GI_FRACTION, and RESERVED which are used to indicate the FRU configuration and the length of each frame type. The loop size is fixed so that four PHY profiles (including a FEF) are signaled within the FRU. If NUM_FRAME_FRU is less than 4, the unused fields are filled with zeros.

FRU_PHY_PROFILE: This 3-bit field indicates the PHY profile type of the (i+1)th (i is the loop index) frame of the associated FRU. This field uses the same signaling format as shown in the table 8.

FRU_FRAME_LENGTH: This 2-bit field indicates the length of the (i+1)th frame of the associated FRU. Using FRU_FRAME_LENGTH together with FRU_GI_FRACTION, the exact value of the frame duration can be obtained.

FRU_GI_FRACTION: This 3-bit field indicates the guard interval fraction value of the (i+1)th frame of the associated FRU. FRU_GI_FRACTION is signaled according to the table 7.

RESERVED: This 4-bit field is reserved for future use.

The following fields provide parameters for decoding the PLS2 data.

PLS2_FEC_TYPE: This 2-bit field indicates the FEC type used by the PLS2 protection. The FEC type is signaled according to table 10. The details of the LDPC codes will be described later.

TABLE 10

| Content | PLS2 FEC type |
| --- | --- |
| 00 | 4K-1/4 and 7K-3/10 LDPC codes |
| 01~11 | Reserved |

PLS2_MOD: This 3-bit field indicates the modulation type used by the PLS2. The modulation type is signaled according to table 11.

TABLE 11

| Value | PLS2_MODE |
| --- | --- |
| 000 | BPSK |
| 001 | QPSK |
| 010 | QAM-16 |
| 011 | NUQ-64 |
| 100~111 | Reserved |

PLS2_SIZE_CELL: This 15-bit field indicates Ctotal_partial_block, the size (specified as the number of QAM cells) of the collection of full coded blocks for PLS2 that is carried in the current frame-group. This value is constant during the entire duration of the current frame-group.

PLS2_STAT_SIZE_BIT: This 14-bit field indicates the size, in bits, of the PLS2-STAT for the current frame-group. This value is constant during the entire duration of the current frame-group.

PLS2_DYN_SIZE_BIT: This 14-bit field indicates the size, in bits, of the PLS2-DYN for the current frame-group. This value is constant during the entire duration of the current frame-group.

PLS2_REP_FLAG: This 1-bit flag indicates whether the PLS2 repetition mode is used in the current frame-group. When this field is set to value '1', the PLS2 repetition mode is activated. When this field is set to value '0', the PLS2 repetition mode is deactivated.

PLS2_REP_SIZE_CELL: This 15-bit field indicates Ctotal_partial_block, the size (specified as the number of QAM cells) of the collection of partial coded blocks for PLS2 carried in every frame of the current frame-group, when PLS2 repetition is used. If repetition is not used, the value of this field is equal to 0. This value is constant during the entire duration of the current frame-group.

PLS2_NEXT_FEC_TYPE: This 2-bit field indicates the FEC type used for PLS2 that is carried in every frame of the next frame-group. The FEC type is signaled according to table 10.

PLS2_NEXT_MOD: This 3-bit field indicates the modulation type used for PLS2 that is carried in every frame of the next frame-group. The modulation type is signaled according to the table 11.

PLS2_NEXT_REP_FLAG: This 1-bit flag indicates whether the PLS2 repetition mode is used in the next frame-group. When this field is set to value '1', the PLS2 repetition mode is activated. When this field is set to value '0', the PLS2 repetition mode is deactivated.

PLS2_NEXT_REP_SIZE_CELL: This 15-bit field indicates Ctotal_full_block, The size (specified as the number of QAM cells) of the collection of full coded blocks for PLS2 that is carried in every frame of the next frame-group, when PLS2 repetition is used. If repetition is not used in the next frame-group, the value of this field is equal to 0. This value is constant during the entire duration of the current frame-group.

PLS2_NEXT_REP_STAT_SIZE_BIT: This 14-bit field indicates the size, in bits, of the PLS2-STAT for the next frame-group. This value is constant in the current frame-group.

PLS2_NEXT_REP_DYN_SIZE_BIT: This 14-bit field indicates the size, in bits, of the PLS2-DYN for the next frame-group. This value is constant in the current frame-group.

PLS2_AP_MODE: This 2-bit field indicates whether additional parity is provided for PLS2 in the current frame-group. This value is constant during the entire duration of the current frame-group. The below table 12 gives the values of this field. When this field is set to '00', additional parity is not used for the PLS2 in the current frame-group.

TABLE 12

| Value | PLS2-AP mode |
| --- | --- |
| 00 | AP is not provided |
| 01 | AP1 mode |
| 10~11 | Reserved |

PLS2_AP_SIZE_CELL: This 15-bit field indicates the size (specified as the number of QAM cells) of the additional parity bits of the PLS2. This value is constant during the entire duration of the current frame-group.

PLS2_NEXT_AP_MODE: This 2-bit field indicates whether additional parity is provided for PLS2 signaling in every frame of next frame-group. This value is constant during the entire duration of the current frame-group. The table 12 defines the values of this field PLS2_NEXT_AP_SIZE_CELL: This 15-bit field indicates the size (specified as the number of QAM cells) of the additional parity bits of the PLS2 in every frame of the next frame-group. This value is constant during the entire duration of the current frame-group.

RESERVED: This 32-bit field is reserved for future use.

CRC_32: A 32-bit error detection code, which is applied to the entire PLS1 signaling.

FIG. 14 illustrates PLS2 data according to an embodiment of the present invention.

FIG. 14 illustrates PLS2-STAT data of the PLS2 data. The PLS2-STAT data are the same within a frame-group, while the PLS2-DYN data provide information that is specific for the current frame.

The details of fields of the PLS2-STAT data are as follows:

FIC_FLAG: This 1-bit field indicates whether the FIC is used in the current frame-group. If this field is set to '1', the FIC is provided in the current frame. If this field set to '0', the FIC is not carried in the current frame. This value is constant during the entire duration of the current frame-group.

AUX_FLAG: This 1-bit field indicates whether the auxiliary stream(s) is used in the current frame-group. If this field is set to '1', the auxiliary stream is provided in the current frame. If this field set to '0', the auxiliary stream is not carried in the current frame. This value is constant during the entire duration of current frame-group.

NUM_DP: This 6-bit field indicates the number of DPs carried within the current frame. The value of this field ranges from 1 to 64, and the number of DPs is NUM_DP+1.

DP_ID: This 6-bit field identifies uniquely a DP within a PHY profile.

DP_TYPE: This 3-bit field indicates the type of the DP. This is signaled according to the below table 13.

TABLE 13

| Value | DP Type |
|---|---|
| 000 | DP Type 1 |
| 001 | DP Type 2 |
| 010~111 | reserved |

DP_GROUP_ID: This 8-bit field identifies the DP group with which the current DP is associated. This can be used by a receiver to access the DPs of the service components associated with a particular service, which will have the same DP_GROUP_ID.

BASE_DP_ID: This 6-bit field indicates the DP carrying service signaling data (such as PSI/SI) used in the Management layer. The DP indicated by BASE_DP_ID may be either a normal DP carrying the service signaling data along with the service data or a dedicated DP carrying only the service signaling data DP_FEC_TYPE: This 2-bit field indicates the FEC type used by the associated DP. The FEC type is signaled according to the below table 14.

TABLE 14

| Value | FEC_TYPE |
|---|---|
| 00 | 16K LDPC |
| 01 | 64K LDPC |
| 10~11 | Reserved |

DP_COD: This 4-bit field indicates the code rate used by the associated DP. The code rate is signaled according to the below table 15.

TABLE 15

| Value | Code rate |
|---|---|
| 0000 | 5/15 |
| 0001 | 6/15 |
| 0010 | 7/15 |
| 0011 | 8/15 |
| 0100 | 9/15 |
| 0101 | 10/15 |
| 0110 | 11/15 |
| 0111 | 12/15 |
| 1000 | 13/15 |
| 1001~1111 | Reserved |

DP_MOD: This 4-bit field indicates the modulation used by the associated DP. The modulation is signaled according to the below table 16.

TABLE 16

| Value | Modulation |
|---|---|
| 0000 | QPSK |
| 0001 | QAM-16 |

TABLE 16-continued

| Value | Modulation |
|---|---|
| 0010 | NUQ-64 |
| 0011 | NUQ-256 |
| 0100 | NUQ-1024 |
| 0101 | NUC-16 |
| 0110 | NUC-64 |
| 0111 | NUC-256 |
| 1000 | NUC-1024 |
| 1001~1111 | reserved |

DP_SSD_FLAG: This 1-bit field indicates whether the SSD mode is used in the associated DP. If this field is set to value '1', SSD is used. If this field is set to value '0', SSD is not used.

The following field appears only if PHY_PROFILE is equal to '010', which indicates the advanced profile:

DP_MIMO: This 3-bit field indicates which type of MIMO encoding process is applied to the associated DP. The type of MIMO encoding process is signaled according to the table 17.

TABLE 17

| Value | MIMO encoding |
|---|---|
| 000 | FR-SM |
| 001 | FRFD-SM |
| 010~111 | reserved |

DP_TI_TYPE: This 1-bit field indicates the type of time-interleaving. A value of '0' indicates that one TI group corresponds to one frame and contains one or more TI-blocks. A value of '1' indicates that one TI group is carried in more than one frame and contains only one TI-block.

DP_TI_LENGTH: The use of this 2-bit field (the allowed values are only 1, 2, 4, 8) is determined by the values set within the DP_TI_TYPE field as follows:

If the DP_TI_TYPE is set to the value '1', this field indicates PI, the number of the frames to which each TI group is mapped, and there is one TI-block per TI group (NTI=1). The allowed PI values with 2-bit field are defined in the below table 18.

If the DP_TI_TYPE is set to the value '0', this field indicates the number of TI-blocks NTI per TI group, and there is one TI group per frame (PI=1). The allowed PI values with 2-bit field are defined in the below table 18.

TABLE 18

| 2-bit field | $P_I$ | $N_{TI}$ |
|---|---|---|
| 00 | 1 | 1 |
| 01 | 2 | 2 |
| 10 | 4 | 3 |
| 11 | 8 | 4 |

DP_FRAME_INTERVAL: This 2-bit field indicates the frame interval (IJUMP) within the frame-group for the associated DP and the allowed values are 1, 2, 4, 8 (the corresponding 2-bit field is '00', '01', '10', or '11', respectively). For DPs that do not appear every frame of the frame-group, the value of this field is equal to the interval between successive frames. For example, if a DP appears on the frames 1, 5, 9, 13, etc., this field is set to '4'. For DPs that appear in every frame, this field is set to '1'.

DP_TI_BYPASS: This 1-bit field determines the availability of time interleaver 5050. If time interleaving is not used for a DP, it is set to '1'. Whereas if time interleaving is used it is set to '0'.

DP_FIRST_FRAME_IDX: This 5-bit field indicates the index of the first frame of the super-frame in which the current DP occurs. The value of DP_FIRST_FRAME_IDX ranges from 0 to 31

DP_NUM_BLOCK_MAX: This 10-bit field indicates the maximum value of DP_NUM_BLOCKS for this DP. The value of this field has the same range as DP_NUM_BLOCKS.

DP_PAYLOAD_TYPE: This 2-bit field indicates the type of the payload data carried by the given DP. DP_PAYLOAD_TYPE is signaled according to the below table 19.

TABLE 19

| Value | Payload Type |
|---|---|
| 00 | TS. |
| 01 | IP |
| 10 | GS |
| 11 | reserved |

DP_INBAND_MODE: This 2-bit field indicates whether the current DP carries in-band signaling information. The in-band signaling type is signaled according to the below table 20.

TABLE 20

| Value | In-band mode |
|---|---|
| 00 | In-band signaling is not carried. |
| 01 | INBAND-PLS is carried only |
| 10 | INBAND-ISSY is carried only |
| 11 | INBAND-PLS and INBAND-ISSY are carried |

DP_PROTOCOL_TYPE: This 2-bit field indicates the protocol type of the payload carried by the given DP. It is signaled according to the below table 21 when input payload types are selected.

TABLE 21

| Value | If DP_PAYLOAD_TYPE Is TS | If DP_PAYLOAD_TYPE Is IP | If DP_PAYLOAD_TYPE Is GS |
|---|---|---|---|
| 00 | MPEG2-TS | IPv4 | (Note) |
| 01 | Reserved | IPv6 | Reserved |
| 10 | Reserved | Reserved | Reserved |
| 11 | Reserved | Reserved | Reserved |

DP_CRC_MODE: This 2-bit field indicates whether CRC encoding is used in the Input Formatting block. The CRC mode is signaled according to the below table 22.

TABLE 22

| Value | CRC mode |
|---|---|
| 00 | Not used |
| 01 | CRC-8 |
| 10 | CRC-16 |
| 11 | CRC-32 |

DNP_MODE: This 2-bit field indicates the null-packet deletion mode used by the associated DP when DP_PAYLOAD_TYPE is set to TS ('00'). DNP_MODE is signaled according to the below table 23. If DP_PAYLOAD_TYPE is not TS ('00'), DNP_MODE is set to the value '00'.

TABLE 23

| Value | Null-packet deletion mode |
|---|---|
| 00 | Not used |
| 01 | DNP-NORMAL |
| 10 | DNP-OFFSET |
| 11 | reserved |

ISSY_MODE: This 2-bit field indicates the ISSY mode used by the associated DP when DP_PAYLOAD_TYPE is set to TS ('00'). The ISSY_MODE is signaled according to the below table 24 If DP_PAYLOAD_TYPE is not TS ('00'), ISSY_MODE is set to the value '00'.

TABLE 24

| Value | ISSY mode |
|---|---|
| 00 | Not used |
| 01 | ISSY-UP |
| 10 | ISSY-BBF |
| 11 | reserved |

HC_MODE_TS: This 2-bit field indicates the TS header compression mode used by the associated DP when DP_PAYLOAD_TYPE is set to TS ('00'). The HC_MODE_TS is signaled according to the below table 25.

TABLE 25

| Value | Header compression mode |
|---|---|
| 00 | HC_MODE_TS 1 |
| 01 | HC_MODE_TS 2 |
| 10 | HC_MODE_TS 3 |
| 11 | HC_MODE_TS 4 |

HC_MODE_IP: This 2-bit field indicates the IP header compression mode when DP_PAYLOAD_TYPE is set to IP ('01'). The HC_MODE_IP is signaled according to the below table 26.

TABLE 26

| Value | Header compression mode |
|---|---|
| 00 | No compression |
| 01 | HC_MODE_IP 1 |
| 10~11 | reserved |

PID: This 13-bit field indicates the PID number for TS header compression when DP_PAYLOAD_TYPE is set to TS ('00') and HC_MODE_TS is set to '01' or '10'.

RESERVED: This 8-bit field is reserved for future use.

The following field appears only if FIC_FLAG is equal to '1':

FIC_VERSION: This 8-bit field indicates the version number of the FIC.

FIC_LENGTH_BYTE: This 13-bit field indicates the length, in bytes, of the FIC.

RESERVED: This 8-bit field is reserved for future use.

The following field appears only if AUX_FLAG is equal to '1':

NUM_AUX: This 4-bit field indicates the number of auxiliary streams. Zero means no auxiliary streams are used.

AUX_CONFIG_RFU: This 8-bit field is reserved for future use.

AUX_STREAM_TYPE: This 4-bit is reserved for future use for indicating the type of the current auxiliary stream.

AUX_PRIVATE_CONFIG: This 28-bit field is reserved for future use for signaling auxiliary streams.

Figures 15, 16:
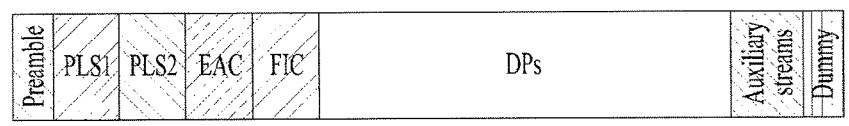
FIG. 15 illustrates PLS2 data according to another embodiment of the present invention.
FIG. 16 illustrates a logical structure of a frame according to an embodiment of the present invention.

FIG. 15 illustrates PLS2 data according to another embodiment of the present invention.

FIG. 15 illustrates PLS2-DYN data of the PLS2 data. The values of the PLS2-DYN data may change during the duration of one frame-group, while the size of fields remains constant.

The details of fields of the PLS2-DYN data are as follows:

FRAME_INDEX: This 5-bit field indicates the frame index of the current frame within the super-frame. The index of the first frame of the super-frame is set to '0'.

PLS_CHANGE_COUNTER: This 4-bit field indicates the number of super-frames ahead where the configuration will change. The next super-frame with changes in the configuration is indicated by the value signaled within this field. If this field is set to the value '0000', it means that no scheduled change is foreseen: e.g., value '1' indicates that there is a change in the next super-frame.

FIC_CHANGE_COUNTER: This 4-bit field indicates the number of super-frames ahead where the configuration (i.e., the contents of the FIC) will change. The next super-frame with changes in the configuration is indicated by the value signaled within this field. If this field is set to the value '0000', it means that no scheduled change is foreseen: e.g. value '0001' indicates that there is a change in the next super-frame.

RESERVED: This 16-bit field is reserved for future use.

The following fields appear in the loop over NUM_DP, which describe the parameters associated with the DP carried in the current frame.

DP_ID: This 6-bit field indicates uniquely the DP within a PHY profile.

DP_START: This 15-bit (or 13-bit) field indicates the start position of the first of the DPs using the DPU addressing scheme. The DP_START field has differing length according to the PHY profile and FFT size as shown in the below table 27.

TABLE 27

| | DP_START field size | |
|---|---|---|
| PHY profile | 64K | 16K |
| Base | 13 bit | 15 bit |
| Handheld | — | 13 bit |
| Advanced | 13 bit | 15 bit |

DP_NUM_BLOCK: This 10-bit field indicates the number of FEC blocks in the current TI group for the current DP. The value of DP_NUM_BLOCK ranges from 0 to 1023

RESERVED: This 8-bit field is reserved for future use.

The following fields indicate the FIC parameters associated with the EAC.

EAC_FLAG: This 1-bit field indicates the existence of the EAC in the current frame. This bit is the same value as the EAC_FLAG in the preamble.

EAS_WAKE_UP_VERSION_NUM: This 8-bit field indicates the version number of a wake-up indication.

If the EAC_FLAG field is equal to '1', the following 12 bits are allocated for EAC_LENGTH_BYTE field. If the EAC_FLAG field is equal to '0', the following 12 bits are allocated for EAC_COUNTER.

EAC_LENGTH_BYTE: This 12-bit field indicates the length, in byte, of the EAC.

EAC_COUNTER: This 12-bit field indicates the number of the frames before the frame where the EAC arrives.

The following field appears only if the AUX_FLAG field is equal to '1':

AUX_PRIVATE_DYN: This 48-bit field is reserved for future use for signaling auxiliary streams. The meaning of this field depends on the value of AUX_STREAM_TYPE in the configurable PLS2-STAT.

CRC_32: A 32-bit error detection code, which is applied to the entire PLS2.

FIG. 16 illustrates a logical structure of a frame according to an embodiment of the present invention.

As above mentioned, the PLS, EAC, FIC, DPs, auxiliary streams and dummy cells are mapped into the active carriers of the OFDM symbols in the frame. The PLS1 and PLS2 are first mapped into one or more FSS(s). After that, EAC cells, if any, are mapped immediately following the PLS field, followed next by FIC cells, if any. The DPs are mapped next after the PLS or EAC, FIC, if any. Type 1 DPs follows first, and Type 2 DPs next. The details of a type of the DP will be described later. In some case, DPs may carry some special data for EAS or service signaling data. The auxiliary stream or streams, if any, follow the DPs, which in turn are followed by dummy cells. Mapping them all together in the above mentioned order, i.e. PLS, EAC, FIC, DPs, auxiliary streams and dummy data cells exactly fill the cell capacity in the frame.

Figure 17:
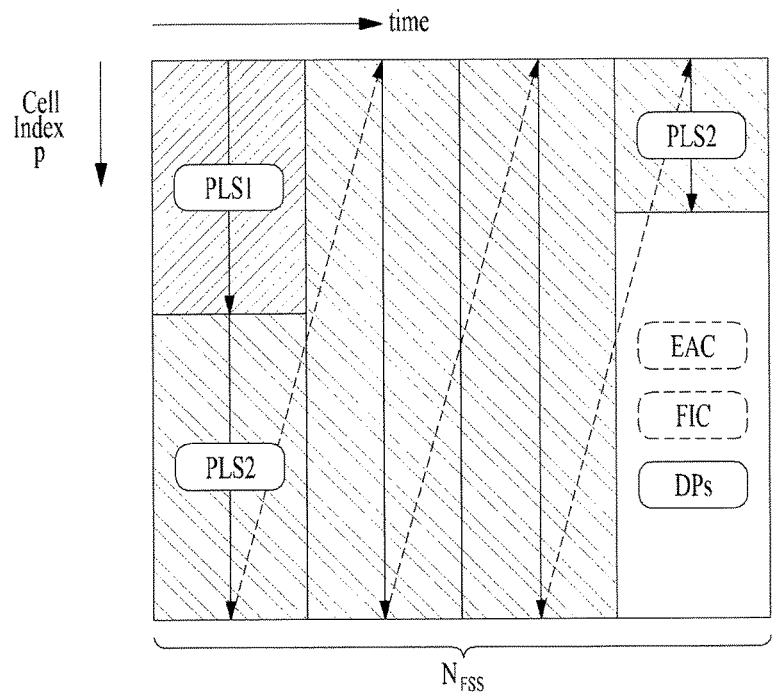
FIG. 17 illustrates PLS mapping according to an embodiment of the present invention.

FIG. 17 illustrates PLS mapping according to an embodiment of the present invention.

PLS cells are mapped to the active carriers of FSS(s). Depending on the number of cells occupied by PLS, one or more symbols are designated as FSS(s), and the number of FSS(s) NFSS is signaled by NUM_FSS in PLS1. The FSS is a special symbol for carrying PLS cells. Since robustness and latency are critical issues in the PLS, the FSS(s) has higher density of pilots allowing fast synchronization and frequency-only interpolation within the FSS.

PLS cells are mapped to active carriers of the NFSS FSS(s) in a top-down manner as shown in an example in FIG. 17. The PLS1 cells are mapped first from the first cell of the first FSS in an increasing order of the cell index. The PLS2 cells follow immediately after the last cell of the PLS1 and mapping continues downward until the last cell index of the first FSS. If the total number of required PLS cells exceeds the number of active carriers of one FSS, mapping proceeds to the next FSS and continues in exactly the same manner as the first FSS.

After PLS mapping is completed, DPs are carried next. If EAC, FIC or both are present in the current frame, they are placed between PLS and "normal" DPs.

Figure 18:
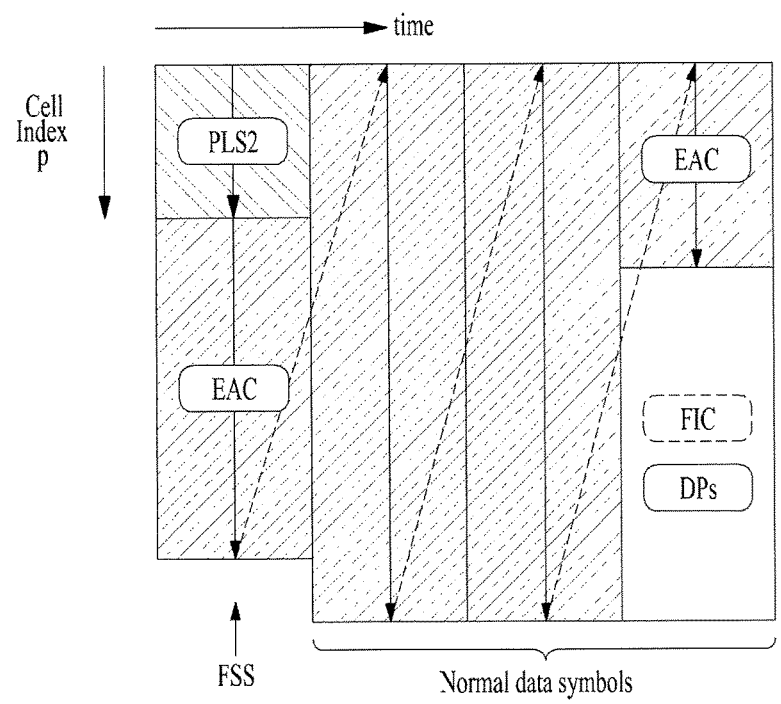
FIG. 18 illustrates EAC mapping according to an embodiment of the present invention.

FIG. 18 illustrates EAC mapping according to an embodiment of the present invention.

EAC is a dedicated channel for carrying EAS messages and links to the DPs for EAS. EAS support is provided but EAC itself may or may not be present in every frame. EAC, if any, is mapped immediately after the PLS2 cells. EAC is not preceded by any of the FIC, DPs, auxiliary streams or dummy cells other than the PLS cells. The procedure of mapping the EAC cells is exactly the same as that of the PLS.

The EAC cells are mapped from the next cell of the PLS2 in increasing order of the cell index as shown in the example in FIG. 18. Depending on the EAS message size, EAC cells may occupy a few symbols, as shown in FIG. 18.

EAC cells follow immediately after the last cell of the PLS2, and mapping continues downward until the last cell index of the last FSS. If the total number of required EAC cells exceeds the number of remaining active carriers of the last FSS mapping proceeds to the next symbol and continues in exactly the same manner as FSS(s). The next symbol for mapping in this case is the normal data symbol, which has more active carriers than a FSS.

After EAC mapping is completed, the FIC is carried next, if any exists. If FIC is not transmitted (as signaled in the PLS2 field), DPs follow immediately after the last cell of the EAC.

Figure 19:
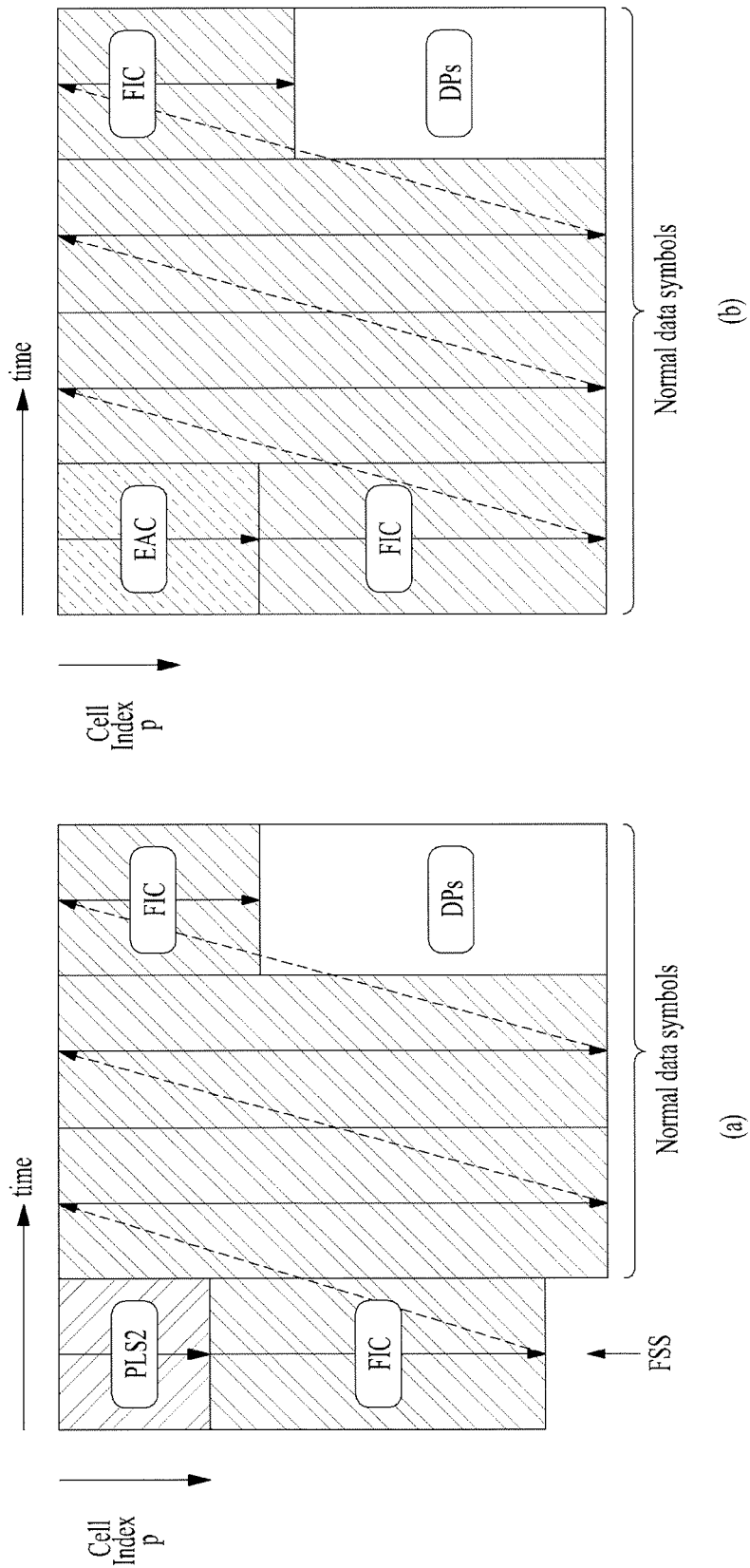
FIG. 19 illustrates FIC mapping according to an embodiment of the present invention.

FIG. 19, including view (a) and view (b), illustrates FIC mapping according to an embodiment of the present invention.

FIG. 19(a) shows an example mapping of FIC cell without EAC and FIG. 19(b) shows an example mapping of FIC cell with EAC.

FIC is a dedicated channel for carrying cross-layer information to enable fast service acquisition and channel scanning. This information primarily includes channel binding information between DPs and the services of each broadcaster. For fast scan, a receiver can decode FIC and obtain information such as broadcaster ID, number of services, and BASE_DP_ID. For fast service acquisition, in addition to FIC, base DP can be decoded using BASE_DP_ID. Other than the content it carries, a base DP is encoded and mapped to a frame in exactly the same way as a normal DP. Therefore, no additional description is required for a base DP. The FIC data is generated and consumed in the Management Layer. The content of FIC data is as described in the Management Layer specification.

The FIC data is optional and the use of FIC is signaled by the FIC_FLAG parameter in the static part of the PLS2. If FIC is used, FIC_FLAG is set to '1' and the signaling field for FIC is defined in the static part of PLS2. Signaled in this field are FIC_VERSION, and FIC_LENGTH_BYTE. FIC uses the same modulation, coding and time interleaving parameters as PLS2. FIC shares the same signaling parameters such as PLS2_MOD and PLS2_FEC. FIC data, if any, is mapped immediately after PLS2 or EAC if any. FIC is not preceded by any normal DPs, auxiliary streams or dummy cells. The method of mapping FIC cells is exactly the same as that of EAC which is again the same as PLS.

Without EAC after PLS, FIC cells are mapped from the next cell of the PLS2 in an increasing order of the cell index as shown in an example in (a). Depending on the FIC data size, FIC cells may be mapped over a few symbols, as shown in (b).

FIC cells follow immediately after the last cell of the PLS2, and mapping continues downward until the last cell index of the last FSS. If the total number of required FIC cells exceeds the number of remaining active carriers of the last FSS, mapping proceeds to the next symbol and continues in exactly the same manner as FSS(s). The next symbol for mapping in this case is the normal data symbol which has more active carriers than a FSS.

If EAS messages are transmitted in the current frame, EAC precedes FIC, and FIC cells are mapped from the next cell of the EAC in an increasing order of the cell index as shown in (b).

After FIC mapping is completed, one or more DPs are mapped, followed by auxiliary streams, if any, and dummy cells.

Figure 20:
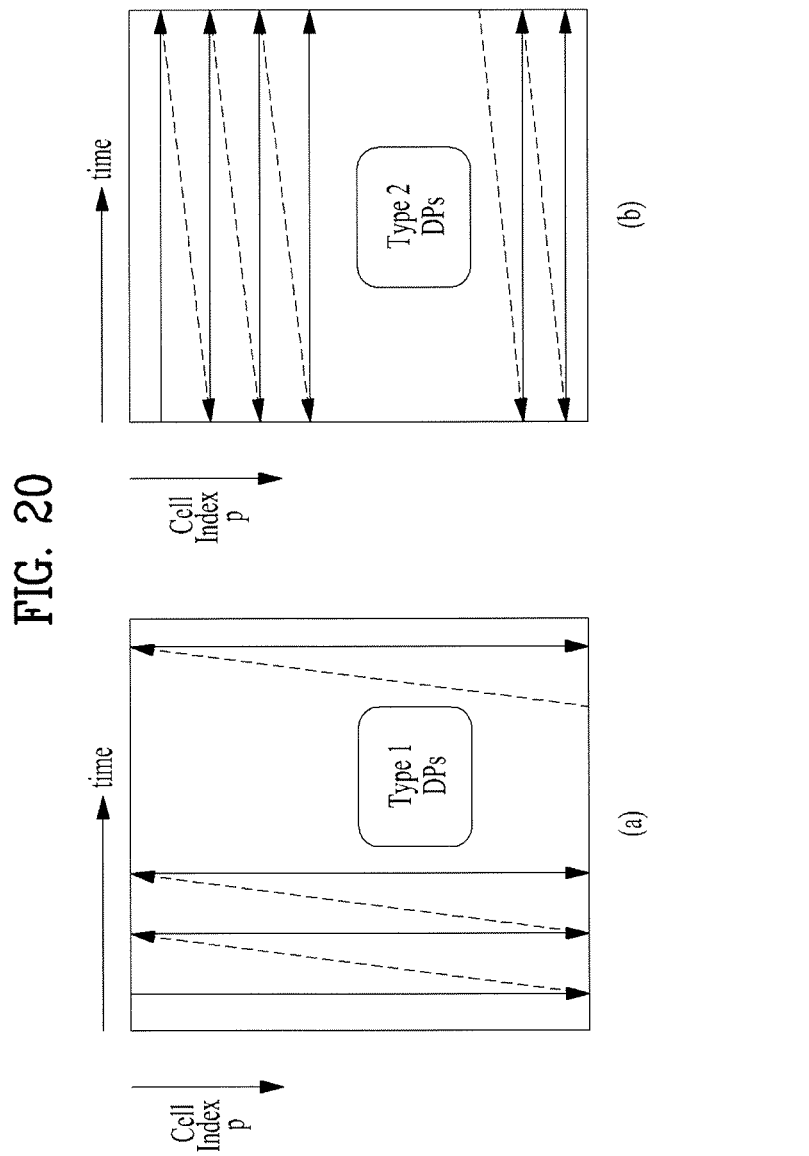
FIG. 20 illustrates a type of DP according to an embodiment of the present invention.

FIG. 20, including view (a) and view (b), illustrates a type of DP according to an embodiment of the present invention.

FIG. 20(a) shows type 1 DP and FIG. 20(b) shows type 2 DP.

After the preceding channels, i.e., PLS, EAC and FIC, are mapped, cells of the DPs are mapped. A DP is categorized into one of two types according to mapping method:
Type 1 DP: DP is mapped by TDM
Type 2 DP: DP is mapped by FDM
The type of DP is indicated by DP_TYPE field in the static part of PLS2. FIG. 20 illustrates the mapping orders of Type 1 DPs and Type 2 DPs. Type 1 DPs are first mapped in the increasing order of cell index, and then after reaching the last cell index, the symbol index is increased by one. Within the next symbol, the DP continues to be mapped in the increasing order of cell index starting from p=0. With a number of DPs mapped together in one frame, each of the Type 1 DPs is grouped in time, similar to TDM multiplexing of DPs.

Type 2 DPs are first mapped in the increasing order of symbol index, and then after reaching the last OFDM symbol of the frame, the cell index increases by one and the symbol index rolls back to the first available symbol and then increases from that symbol index. After mapping a number of DPs together in one frame, each of the Type 2 DPs are grouped in frequency together, similar to FDM multiplexing of DPs.

Type 1 DPs and Type 2 DPs can coexist in a frame if needed with one restriction; Type 1 DPs always precede Type 2 DPs. The total number of OFDM cells carrying Type 1 and Type 2 DPs cannot exceed the total number of OFDM cells available for transmission of DPs:

$$D_{DP1}+D_{DP2} \leq D_{DP}$$ [Math figure 2]

where DDP1 is the number of OFDM cells occupied by Type 1 DPs, DDP2 is the number of cells occupied by Type 2 DPs. Since PLS, EAC, FIC are all mapped in the same way as Type 1 DP, they all follow "Type 1 mapping rule". Hence, overall, Type 1 mapping always precedes Type 2 mapping.

Figure 21:
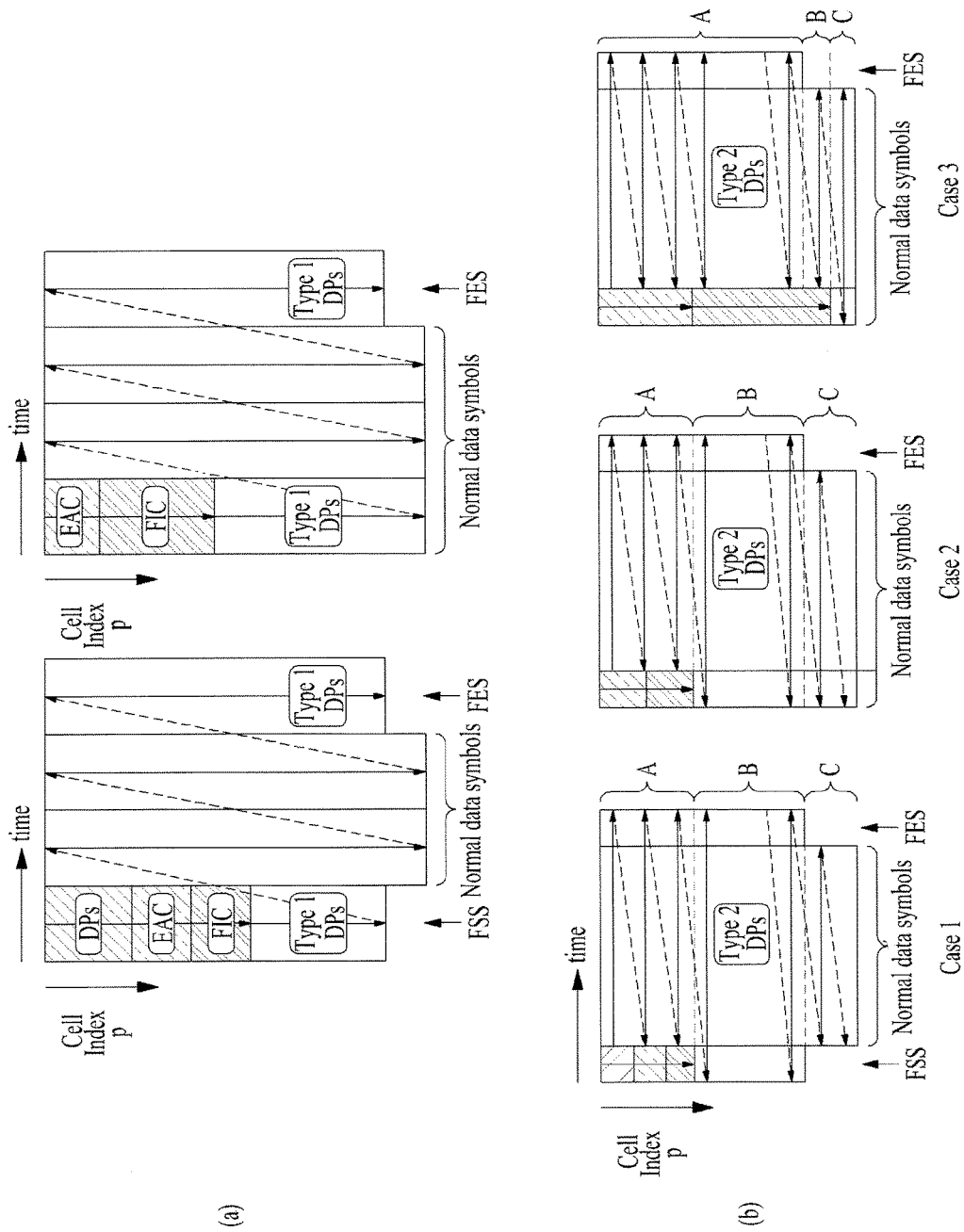
FIG. 21 illustrates DP mapping according to an embodiment of the present invention.

FIG. 21, including view (a) and view (b), illustrates DP mapping according to an embodiment of the present invention.

FIG. 21(a) shows an addressing of OFDM cells for mapping type 1 DPs and FIG. 21(b) shows an addressing of OFDM cells for mapping for type 2 DPs.

Addressing of OFDM cells for mapping Type 1 DPs (0, . . . , DDP1−1) is defined for the active data cells of Type 1 DPs. The addressing scheme defines the order in which the cells from the TIs for each of the Type 1 DPs are allocated to the active data cells. It is also used to signal the locations of the DPs in the dynamic part of the PLS2.

Without EAC and FIC, address 0 refers to the cell immediately following the last cell carrying PLS in the last FSS. If EAC is transmitted and FIC is not in the corresponding frame, address 0 refers to the cell immediately following the last cell carrying EAC. If FIC is transmitted in the corresponding frame, address 0 refers to the cell immediately following the last cell carrying FIC. Address 0 for Type 1 DPs can be calculated considering two different cases as shown in (a). In the example in (a), PLS, EAC and FIC are assumed to be all transmitted. Extension to the cases where either or both of EAC and FIC are omitted is straightforward. If there are remaining cells in the FSS after mapping all the cells up to FIC as shown on the left side of (a).

Addressing of OFDM cells for mapping Type 2 DPs (0, . . . , DDP2−1) is defined for the active data cells of Type 2 DPs. The addressing scheme defines the order in which the cells from the TIs for each of the Type 2 DPs are allocated to the active data cells. It is also used to signal the locations of the DPs in the dynamic part of the PLS2.

Three slightly different cases are possible as shown in (b). For the first case shown on the left side of (b), cells in the last FSS are available for Type 2 DP mapping. For the second case shown in the middle, FIC occupies cells of a normal symbol, but the number of FIC cells on that symbol is not larger than CFSS. The third case, shown on the right side in (b), is the same as the second case except that the number of FIC cells mapped on that symbol exceeds CFSS.

The extension to the case where Type 1 DP(s) precede Type 2 DP(s) is straightforward since PLS, EAC and FIC follow the same "Type 1 mapping rule" as the Type 1 DP(s).

A data pipe unit (DPU) is a basic unit for allocating data cells to a DP in a frame.

A DPU is defined as a signaling unit for locating DPs in a frame. A Cell Mapper 7010 may map the cells produced by the TIs for each of the DPs. A Time interleaver 5050 outputs a series of TI-blocks and each TI-block comprises a variable number of XFECBLOCKs which is in turn composed of a set of cells. The number of cells in an XFECBLOCK, Ncells, is dependent on the FECBLOCK size, Nldpc, and the number of transmitted bits per constellation symbol. A DPU is defined as the greatest common divisor of all possible values of the number of cells in a XFECBLOCK, Ncells, supported in a given PHY profile. The length of a DPU in cells is defined as LDPU. Since each PHY profile supports different combinations of FECBLOCK size and a different number of bits per constellation symbol, LDPU is defined on a PHY profile basis.

Figure 22:
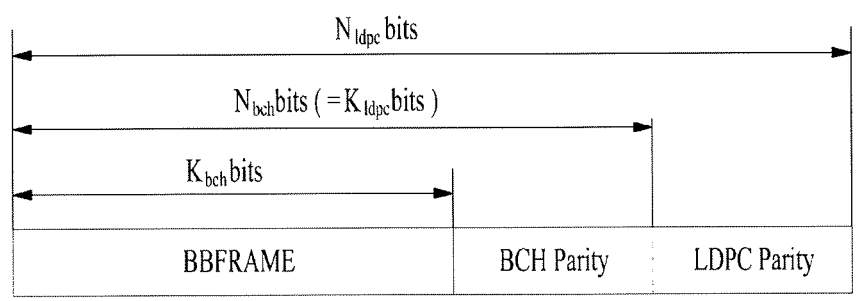
FIG. 22 illustrates a Forward Error Correction (FEC) structure according to an embodiment of the present invention.

FIG. 22 illustrates an FEC structure according to an embodiment of the present invention.

FIG. 22 illustrates an FEC structure according to an embodiment of the present invention before bit interleaving. As above mentioned, Data FEC encoder may perform the FEC encoding on the input BBF to generate FECBLOCK procedure using outer coding (BCH), and inner coding (LDPC). The illustrated FEC structure corresponds to the FECBLOCK. Also, the FECBLOCK and the FEC structure have same value corresponding to a length of LDPC codeword.

The BCH encoding is applied to each BBF (Kbch bits), and then LDPC encoding is applied to BCH-encoded BBF (Kldpc bits=Nbch bits) as illustrated in FIG. 22.

The value of Nldpc is either 64800 bits (long FECBLOCK) or 16200 bits (short FECBLOCK).

The below table 28 and table 29 show FEC encoding parameters for a long FECBLOCK and a short FECBLOCK, respectively.

TABLE 28

| LDPC Rate | $N_{ldpc}$ | $K_{ldpc}$ | $K_{bch}$ | BCH error correction capability | $N_{bch} - K_{bch}$ |
|---|---|---|---|---|---|
| 5/15 | 64800 | 21600 | 21408 | 12 | 192 |
| 6/15 |  | 25920 | 25728 |  |  |
| 7/15 |  | 30240 | 30048 |  |  |
| 8/15 |  | 34560 | 34368 |  |  |
| 9/15 |  | 38880 | 38688 |  |  |
| 10/15 |  | 43200 | 43008 |  |  |
| 11/15 |  | 47520 | 47328 |  |  |
| 12/15 |  | 51840 | 51648 |  |  |
| 13/15 |  | 56160 | 55968 |  |  |

TABLE 29

| LDPC Rate | $N_{ldpc}$ | $K_{ldpc}$ | $K_{bch}$ | BCH error correction capability | $N_{bch} - K_{bch}$ |
|---|---|---|---|---|---|
| 5/15 | 16200 | 5400 | 5232 | 12 | 168 |
| 6/15 |  | 6480 | 6312 |  |  |
| 7/15 |  | 7560 | 7392 |  |  |
| 8/15 |  | 8640 | 8472 |  |  |
| 9/15 |  | 9720 | 9552 |  |  |
| 10/15 |  | 10800 | 10632 |  |  |
| 11/15 |  | 11880 | 11712 |  |  |
| 12/15 |  | 12960 | 12792 |  |  |
| 13/15 |  | 14040 | 13872 |  |  |

The details of operations of the BCH encoding and LDPC encoding are as follows:

A 12-error correcting BCH code is used for outer encoding of the BBF. The BCH generator polynomial for short FECBLOCK and long FECBLOCK are obtained by multiplying together all polynomials.

LDPC code is used to encode the output of the outer BCH encoding. To generate a completed Bldpc (FECBLOCK), Pldpc (parity bits) is encoded systematically from each Ildpc (BCH-encoded BBF), and appended to Ildpc. The completed Bldpc (FECBLOCK) are expressed as follow Math figure.

$$B_{ldpc} = [I_{ldpc} P_{ldpc}] = [i_0, i_1, \ldots, i_{K_{ldpc}-1}, P_0, P_1, \ldots, P_{N_{ldpc}-K_{ldpc}-1}]$$ [Math figure 3]

The parameters for long FECBLOCK and short FECBLOCK are given in the above table 28 and 29, respectively.

The detailed procedure to calculate Nldpc−Kldpc parity bits for long FECBLOCK, is as follows:

1) Initialize the parity bits, $$P_0 = P_1 = P_2 = \ldots = P_{N_{ldpc}-K_{ldpc}-1} = 0$$ [Math figure 4]

2) Accumulate the first information bit—i0, at parity bit addresses specified in the first row of an addresses of parity check matrix. The details of addresses of parity check matrix will be described later. For example, for rate 13/15:

$$p_{983} = p_{983} \oplus i_0 \quad p_{2815} = p_{2815} \oplus i_0$$

$$p_{4837} = p_{4837} \oplus i_0 \quad p_{4989} = p_{4989} \oplus i_0$$

$$p_{6138} = p_{6138} \oplus i_0 \quad p_{6458} = p_{6458} \oplus i_0$$

$$p_{6921} = p_{6921} \oplus i_0 \quad p_{6974} = p_{6974} \oplus i_0$$

$$p_{7572} = p_{7572} \oplus i_0 \quad p_{8260} = p_{8260} \oplus i_0$$

$$p_{8496} = p_{8496} \oplus i_0$$ [Math figure 5]

3) For the next 359 information bits, is, s=1, 2, . . . , 359 accumulate is at parity bit addresses using following Math figure.

$$\{x + (s \bmod 360) \times Q_{ldpc}\} \bmod (N_{ldpc} - K_{ldpc})$$ [Math figure 6]

where x denotes the address of the parity bit accumulator corresponding to the first bit i0, and Qldpc is a code rate dependent constant specified in the addresses of parity check matrix. Continuing with the example, Qldpc=24 for rate 13/15, so for information bit i1, the following operations are performed:

$$p_{1007} = p_{1007} \oplus i_1 \quad p_{2839} = p_{2839} \oplus i_1$$

$$p_{4861} = p_{4861} \oplus i_1 \quad p_{5013} = p_{5013} \oplus i_1$$

$$p_{6162} = p_{6162} \oplus i_1 \quad p_{6482} = p_{6482} \oplus i_1$$

$$p_{6945} = p_{6945} \oplus i_1 \quad p_{6998} = p_{6998} \oplus i_1$$

$$p_{7596} = p_{7596} \oplus i_1 \quad p_{8284} = p_{8284} \oplus i_1$$

$$p_{8520} = p_{8520} \oplus i_1$$ [Math figure 7]

4) For the 361st information bit i360, the addresses of the parity bit accumulators are given in the second row of the addresses of parity check matrix. In a similar manner the addresses of the parity bit accumulators for the following 359 information bits is, s=361, 362, . . . , 719 are obtained using the Math figure 6, where x denotes the address of the parity bit accumulator corresponding to the information bit i360, i.e., the entries in the second row of the addresses of parity check matrix.

5) In a similar manner, for every group of 360 new information bits, a new row from addresses of parity check matrixes used to find the addresses of the parity bit accumulators.

After all of the information bits are exhausted, the final parity bits are obtained as follows:

6) Sequentially perform the following operations starting with i=1

$$p_i = p_i \oplus p_{i-1}, \quad i=1,2,\ldots,N_{ldpc}-K_{ldpc}-1 \quad \text{[Math figure 8]}$$

where final content of $p_i$, $i=0,1,\ldots N_{ldpc}-K_{ldpc}-1$ is equal to the parity bit $p_i$.

TABLE 30

| Code Rate | $Q_{ldpc}$ |
| --- | --- |
| 5/15 | 120 |
| 6/15 | 108 |
| 7/15 | 96 |
| 8/15 | 84 |
| 9/15 | 72 |
| 10/15 | 60 |
| 11/15 | 48 |
| 12/15 | 36 |
| 13/15 | 24 |

This LDPC encoding procedure for a short FECBLOCK is in accordance with t LDPC encoding procedure for the long FECBLOCK, except replacing the table 30 with table 31, and replacing the addresses of parity check matrix for the long FECBLOCK with the addresses of parity check matrix for the short FECBLOCK.

TABLE 31

| Code Rate | $Q_{ldpc}$ |
| --- | --- |
| 5/15 | 30 |
| 6/15 | 27 |
| 7/15 | 24 |
| 8/15 | 21 |
| 9/15 | 18 |
| 10/15 | 15 |
| 11/15 | 12 |
| 12/15 | 9 |
| 13/15 | 6 |

Figure 23:
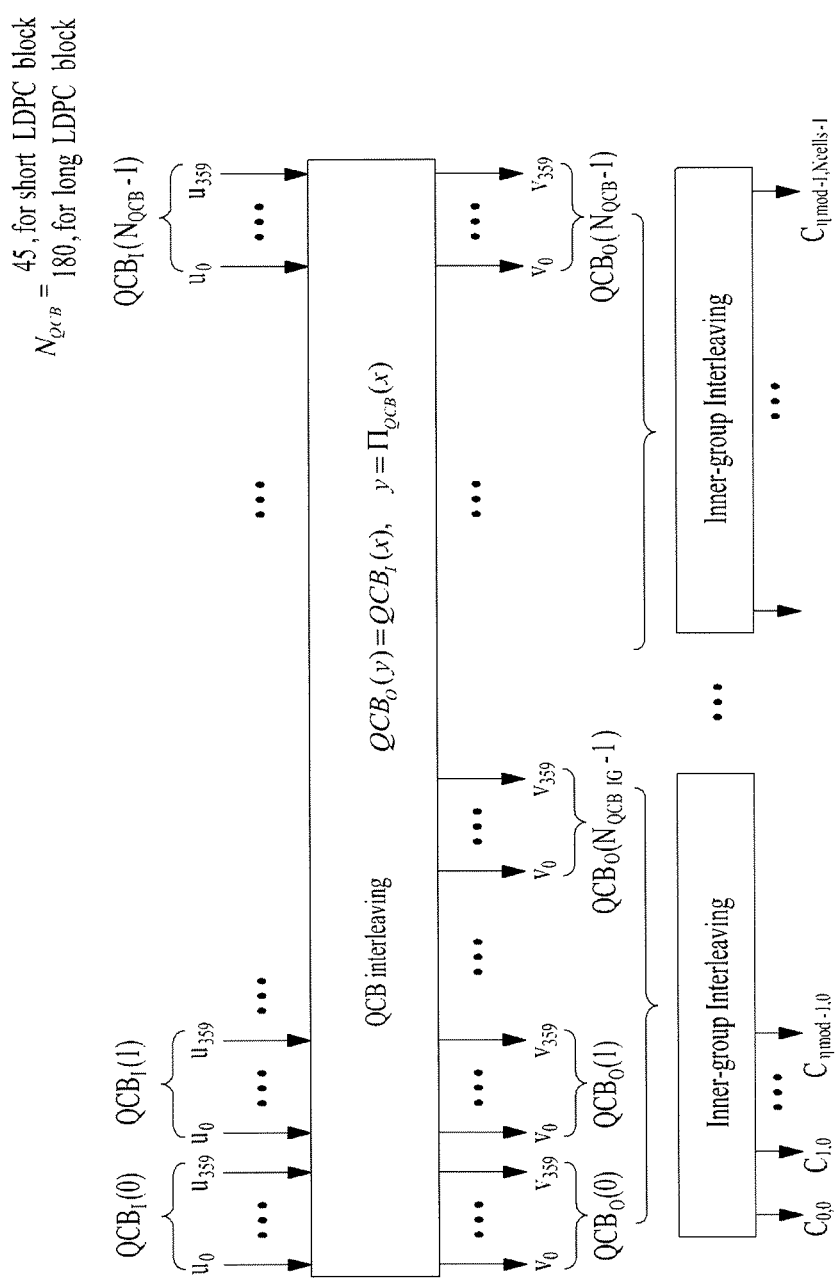
FIG. 23 illustrates a bit interleaving according to an embodiment of the present invention.

FIG. 23 illustrates a bit interleaving according to an embodiment of the present invention.

The outputs of the LDPC encoder are bit-interleaved, which consists of parity interleaving followed by Quasi-Cyclic Block (QCB) interleaving and inner-group interleaving.

shows Quasi-Cyclic Block (QCB) interleaving and (b) shows inner-group interleaving.

The FECBLOCK may be parity interleaved. At the output of the parity interleaving, the LDPC codeword consists of 180 adjacent QC blocks in a long FECBLOCK and 45 adjacent QC blocks in a short FECBLOCK. Each QC block in either a long or short FECBLOCK consists of 360 bits. The parity interleaved LDPC codeword is interleaved by QCB interleaving. The unit of QCB interleaving is a QC block. The QC blocks at the output of parity interleaving are permutated by QCB interleaving as illustrated in FIG. 23, where Ncells=64800/$\eta$mod or 16200/$\eta$mod according to the FECBLOCK length. The QCB interleaving pattern is unique to each combination of modulation type and LDPC code rate.

After QCB interleaving, inner-group interleaving is performed according to modulation type and order ($\eta$mod) which is defined in the below table 32. The number of QC blocks for one inner-group, $N_{QCB\_IG}$, is also defined.

TABLE 32

| Modulation type | $\eta_{mod}$ | $N_{QCB\_IG}$ |
| --- | --- | --- |
| QAM-16 | 4 | 2 |
| NUC-16 | 4 | 4 |
| NUQ-64 | 6 | 3 |
| NUC-64 | 6 | 6 |
| NUQ-256 | 8 | 4 |
| NUC-256 | 8 | 8 |
| NUQ-1024 | 10 | 5 |
| NUC-1024 | 10 | 10 |

The inner-group interleaving process is performed with $N_{QCB\_IG}$ QC blocks of the QCB interleaving output. Inner-group interleaving has a process of writing and reading the bits of the inner-group using 360 columns and $N_{QCB\_IG}$ rows. In the write operation, the bits from the QCB interleaving output are written row-wise. The read operation is performed column-wise to read out m bits from each row, where m is equal to 1 for NUC and 2 for NUQ.

Figure 24:
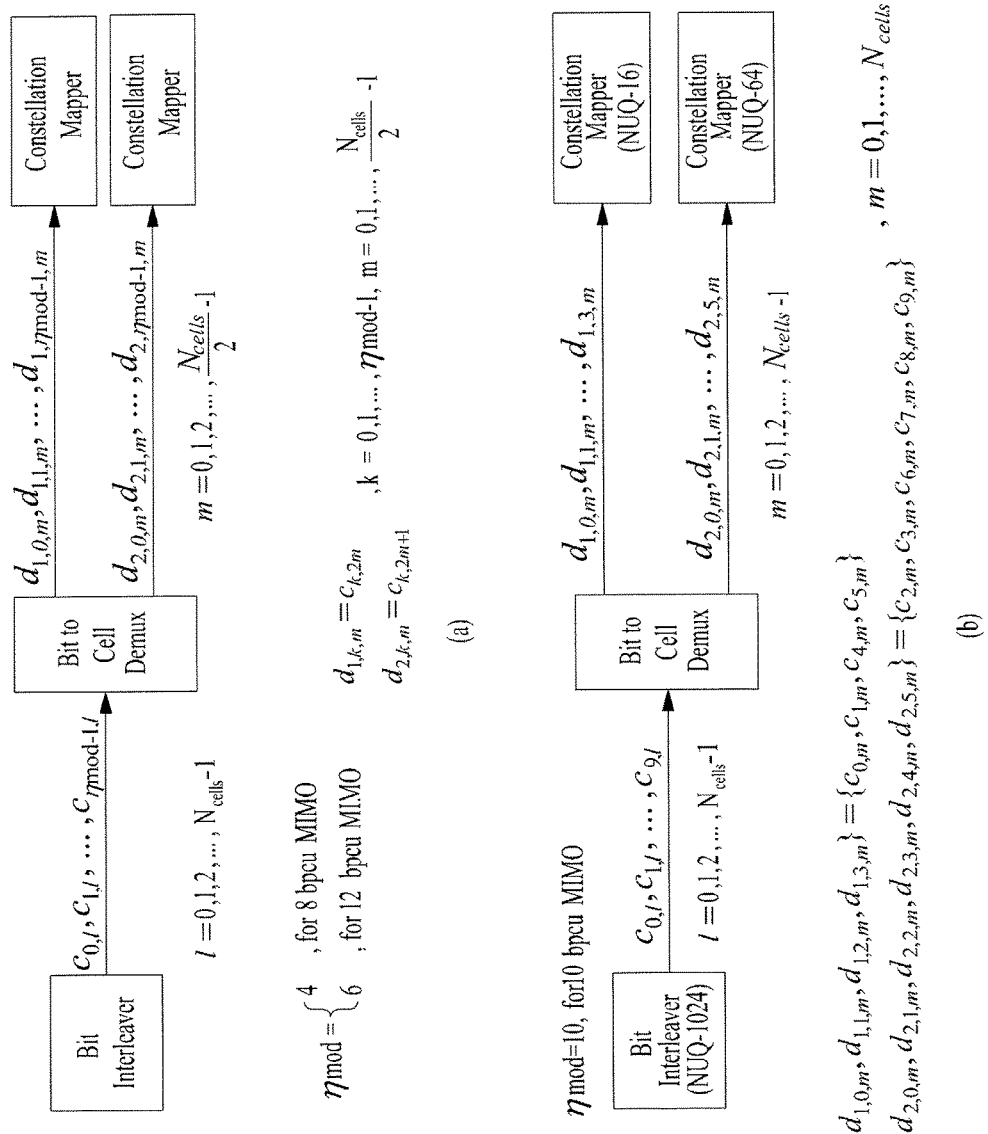
FIG. 24 illustrates a cell-word demultiplexing according to an embodiment of the present invention.

FIG. 24, including view (a) and view (b), illustrates a cell-word demultiplexing according to an embodiment of the present invention.

FIG. 24(a) shows a cell-word demultiplexing for 8 and 12 bpcu MIMO and FIG. 24(b) shows a cell-word demultiplexing for 10 bpcu MIMO.

Each cell word (c0,1, c1,1, ..., c$\eta$mod-1,1) of the bit interleaving output is demultiplexed into (d1,0,m, d1,1,m ..., d1,$\eta$mod-1,m) and (d2,0,m, d2,1,m ..., d2,$\eta$mod-1,m) as shown in (a), which describes the cell-word demultiplexing process for one XFECBLOCK.

For the 10 bpcu MIMO case using different types of NUQ for MIMO encoding, the Bit Interleaver for NUQ-1024 is re-used. Each cell word (c0,1, c1,1, ..., c9,1) of the Bit Interleaver output is demultiplexed into (d1,0,m, d1,1,m ..., d1,3,m) and (d2,0,m, d2,1,m ..., d2,5,m), as shown in (b).

FIG. 25, including views (a)-(c) illustrates a time interleaving according to an embodiment of the present invention.

FIG. 25(a), FIG. 25(b) and FIG. 25(c) show examples of TI mode.

The time interleaver operates at the DP level. The parameters of time interleaving (TI) may be set differently for each DP.

The following parameters, which appear in part of the PLS2-STAT data, configure the TI:

DP_TI_TYPE (allowed values: 0 or 1): Represents the TI mode; '0' indicates the mode with multiple TI blocks (more than one TI block) per TI group. In this case, one TI group is directly mapped to one frame (no inter-frame interleaving). '1' indicates the mode with only one TI block per TI group. In this case, the TI block may be spread over more than one frame (inter-frame interleaving).

DP_TI_LENGTH: If DP_TI_TYPE='0', this parameter is the number of TI blocks NTI per TI group. For DP_TI_TYPE='1', this parameter is the number of frames PI spread from one TI group.

DP_NUM_BLOCK_MAX (allowed values: 0 to 1023): Represents the maximum number of XFECBLOCKs per TI group.

DP_FRAME_INTERVAL (allowed values: 1, 2, 4, 8): Represents the number of the frames IJUMP between two successive frames carrying the same DP of a given PHY profile.

DP_TI_BYPASS (allowed values: 0 or 1): If time interleaving is not used for a DP, this parameter is set to '1'. It is set to '0' if time interleaving is used.

Additionally, the parameter DP_NUM_BLOCK from the PLS2-DYN data is used to represent the number of XFECBLOCKs carried by one TI group of the DP.

When time interleaving is not used for a DP, the following TI group, time interleaving operation, and TI mode are not considered. However, the Delay Compensation block for the dynamic configuration information from the scheduler will still be required. In each DP, the XFECBLOCKs received from the SSD/MIMO encoding are grouped into TI groups. That is, each TI group is a set of an integer number of XFECBLOCKs and will contain a dynamically variable number of XFECBLOCKs. The number of XFECBLOCKs in the TI group of index n is denoted by NxBLOCK_Group (n) and is signaled as DP_NUM_BLOCK in the PLS2-DYN data. Note that NxBLOCK_Group(n) may vary from the minimum value of 0 to the maximum value NxBLOCK_Group_MAX (corresponding to DP_NUM_BLOCK_MAX) of which the largest value is 1023.

Each TI group is either mapped directly onto one frame or spread over PI frames. Each TI group is also divided into more than one TI blocks(NTI), where each TI block corresponds to one usage of time interleaver memory. The TI blocks within the TI group may contain slightly different numbers of XFECBLOCKs. If the TI group is divided into multiple TI blocks, it is directly mapped to only one frame. There are three options for time interleaving (except the extra option of skipping the time interleaving) as shown in the below table 33.

TABLE 33

| Modes | Descriptions |
|---|---|
| Option-1 | Each TI group contains one TI block and is mapped directly to one frame as shown in (a). This option is signaled in the PLS2-STAT by DP_TI_TYPE = '0' and DP_TI_LENGTH = '1' ($N_{TI}$ = 1). |
| Option-2 | Each TI group contains one TI block and is mapped to more than one frame. (b) shows an example, where one TI group is mapped to two frames, i.e., DP_TI_LENGTH = '2' ($P_I$ = 2) and DP_FRAME_INTERVAL ($I_{JUMP}$ = 2). This provides greater time diversity for low data-rate services. This option is signaled in the PLS2-STAT by DP_TI_TYPE = '1'. |
| Option-3 | Each TI group is divided into multiple TI blocks and is mapped directly to one frame as shown in (c). Each TI block may use full TI memory, so as to provide the maximum bit-rate for a DP. This option is signaled in the PLS2-STAT signaling by DP_TI_TYPE = '0' and DP_TI_LENGTH = $N_{TI}$, while $P_I$ = 1. |

In each DP, the TI memory stores the input XFECBLOCKs (output XFECBLOCKs from the SSD/MIMO encoding block). Assume that input XFECBLOCKs are defined as $$(d_{n,s,0,0}, d_{n,s,0,1}, \ldots, d_{n,s,0,N_{cells}-1}, d_{n,s,1,0}, \ldots, d_{n,s,1,N_{cells}-1}, \ldots,$$
$$d_{n,s,N_{xBLOCK\_TI}(n,s)-1,0}, \ldots, d_{n,s,N_{xBLOCK\_TI}(n,s)-1,N_{cells}-1}),$$

where $d_{n,s,r,q}$ is the qth cell of the rth XFECBLOCK in the sth TI block of the nth TI group and represents the outputs of SSD and MIMO encodings as follows $$d_{n,s,r,q} = \begin{cases} f_{n,s,r,q}, & \text{the output of SSD ... encoding} \\ g_{n,s,r,q}, & \text{the output of MIMO encoding} \end{cases}.$$

In addition, assume that output XFECBLOCKs from the time interleaver 5050 are defined as $$(h_{n,s,0}, h_{n,s,1}, \ldots, h_{n,s,i}, \ldots,$$
$$h_{n,s,N_{xBLOCK\_TI}(n,s) \times N_{cells}-1}),$$

where $h_{n,s,i}$ is the ith output cell (for i=0, ..., $N_{xBLOCK\_TI}(n,s) \times N_{cells}-1$) in the sth TI block of the nth TI group.

Typically, the time interleaver will also act as a buffer for DP data prior to the process of frame building. This is achieved by means of two memory banks for each DP. The first TI-block is written to the first bank. The second TI-block is written to the second bank while the first bank is being read from and so on.

The TI is a twisted row-column block interleaver. For the sth TI block of the nth TI group, the number of rows $N_r$ of a TI memory is equal to the number of cells $N_{cells}$, i.e., $N_r = N_{cells}$ while the number of columns $N_c$ is equal to the number $N_{xBLOCK\_TI}(n,s)$.

Figure 26:
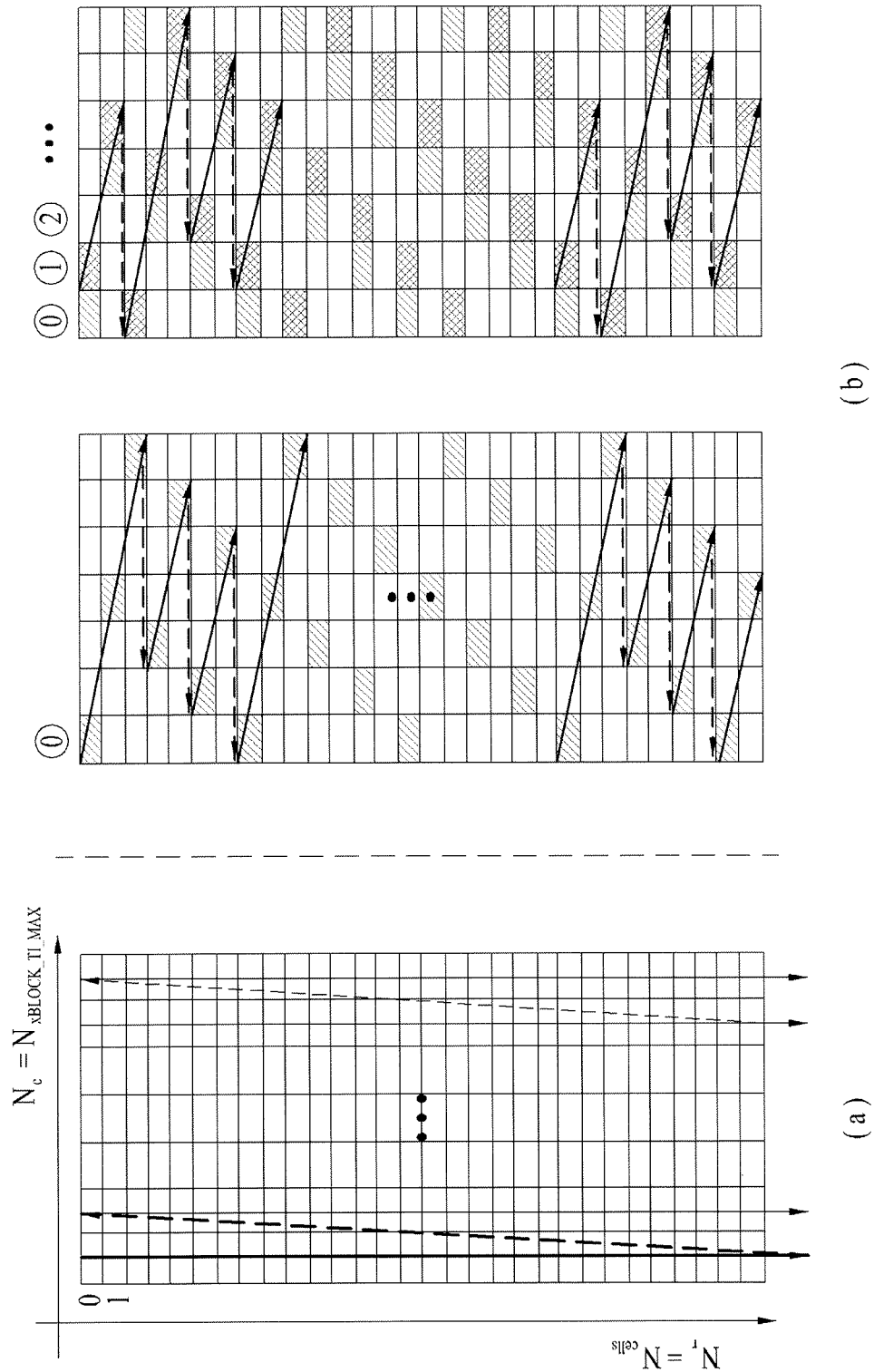
FIG. 26 illustrates the basic operation of a twisted row-column block interleaver according to an embodiment of the present invention.

FIG. 26, including view (a) and view (b), illustrates the basic operation of a twisted row-column block interleaver according to an embodiment of the present invention.

FIG. 26(a) shows a writing operation in the time interleaver and FIG. 26(b) shows a reading operation in the time interleaver The first XFECBLOCK is written column-wise into the first column of the TI memory, and the second XFECBLOCK is written into the next column, and so on as shown in FIG. 26(a). Then, in the interleaving array, cells are read out diagonal-wise. During diagonal-wise reading from the first row (rightwards along the row beginning with the left-most column) to the last row, $N_r$ cells are read out as shown in FIG. 26(b). In detail, assuming $z_{n,s,i}$(i=0, ..., $N_r N_c$) as the TI memory cell position to be read sequentially, the reading process in such an interleaving array is performed by calculating the row index $R_{n,s,i}$, the column index $C_{n,s,i}$, and the associated twisting parameter $T_{n,s,i}$ as follows expression.

$$GENERATE(R_{n,s,i}, C_{n,s,i}) = \quad \text{[Math Figure 9]}$$
$$\{$$
$$R_{n,s,i} = \text{mod}(i, N_r),$$
$$T_{n,s,i} = \text{mod}(S_{shift} \times R_{n,s,i}, N_c),$$
$$C_{n,s,i} = \text{mod}\left(T_{n,s,i} + \left\lfloor \frac{i}{N_r} \right\rfloor, N_c\right)$$
$$\}$$

where $S_{shift}$ is a common shift value for the diagonal-wise reading process regardless of $N_{xBLOCK\_TI}(n,s)$, and it is determined by $N_{xBLOCK\_TI\_MAX}$ given in the PLS2-STAT as follows expression.

for [Math Figure 10]
$$\begin{cases} N'_{xBLOCK\_TI\_MAX} = N_{xBLOCK\_TI\_MAX} + 1, & \text{if } N_{xBLOCK\_TI\_MAX} \bmod 2 = 0 \\ N'_{xBLOCK\_TI\_MAX} = N_{xBLOCK\_TI\_MAX}, & \text{if } N_{xBLOCK\_TI\_MAX} \bmod 2 = 1 \end{cases},$$

$$S_{shift} = \frac{N'_{xBLOCK\_TI\_MAX} - 1}{2}$$

As a result, the cell positions to be read are calculated by a coordinate as $z_{n,s,i} = N_r C_{n,s,i} + R_{n,s,i}$.

Figure 27:
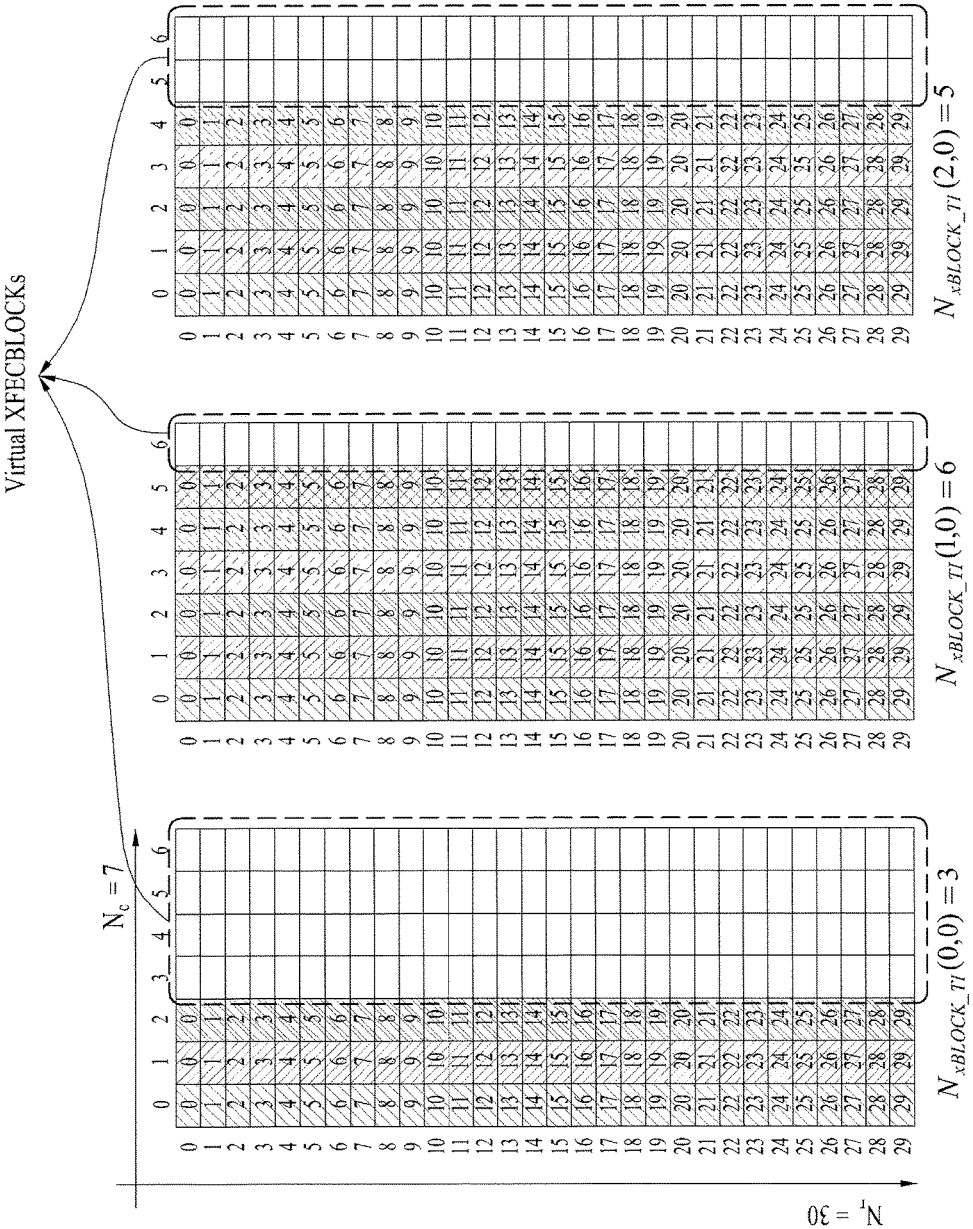
FIG. 27 illustrates an operation of a twisted row-column block interleaver according to another embodiment of the present invention.

FIG. 27 illustrates an operation of a twisted row-column block interleaver according to another embodiment of the present invention.

More specifically, FIG. 27 illustrates the interleaving array in the TI memory for each TI group, including virtual XFECBLOCKs when $N_{xBLOCK\_TI}(0,0)=3$, $N_{xBLOCK\_TI}(1,0)=6$, $N_{xBLOCK\_TI}(2,0)=5$.

The variable number $N_{xBLOCK\_TI}(n,s)=N$, will be less than or equal to $N'_{xBLOCK\_TI\_MAX}$. Thus, in order to achieve a single-memory deinterleaving at the receiver side, regardless of $N_{xBLOCK\_TI}(n,s)$, the interleaving array for use in a twisted row-column block interleaver is set to the size of $N_r \times N_c = N_{cells} \times N'_{xBLOCK\_TI\_MAX}$ by inserting the virtual XFECBLOCKs into the TI memory and the reading process is accomplished as follow expression.

$$p = 0;$$ [Math Figure 11]

for $i = 0$;

$i < N_{cells} N'_{xBLOCK\_TI\_MAX}$; $i = i + 1$

{GENERATE $(R_{n,s,i}, C_{n,s,i})$;

$V_i = N_r C_{n,s,j} + R_{n,s,j}$ if $V_i < N_{cells} N_{xBLOCK\_TI}(n, s)$

{

$Z_{n,s,p} = V_i$; $p = p + 1$;

}

}

The number of TI groups is set to 3. The option of time interleaver is signaled in the PLS2-STAT data by DP_TI_TYPE='0', DP_FRAME_INTERVAL='1', and DP_TI_LENGTH='1', i.e., NTI=1, IJUMP=1, and PI=1. The number of XFECBLOCKs, each of which has Ncells=30 cells, per TI group is signaled in the PLS2-DYN data by NxBLOCK_TI(0,0)=3, NxBLOCK_TI(1,0)=6, and NxBLOCK_TI(2,0)=5, respectively. The maximum number of XFECBLOCK is signaled in the PLS2-STAT data by NxBLOCK_Group_MAX, which leads to $\lfloor N_{xBLOCK\_Group\_MAX}/N_{TI} \rfloor = N_{xBLOCK\_TI\_MAX} = 6$.

Figure 28:
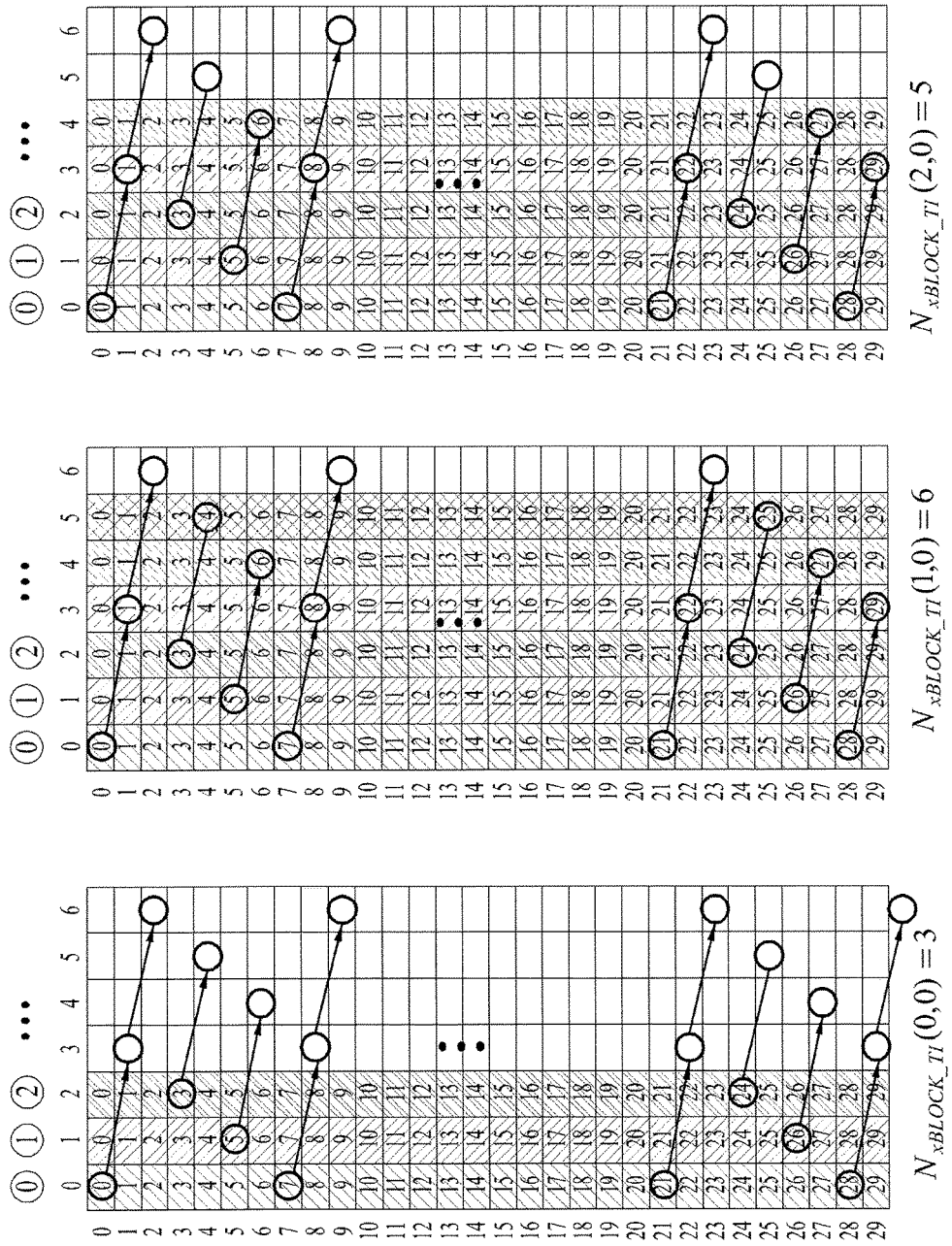
FIG. 28 illustrates a diagonal-wise reading pattern of a twisted row-column block interleaver according to an embodiment of the present invention.

FIG. 28 illustrates a diagonal-wise reading pattern of a twisted row-column block interleaver according to an embodiment of the present invention.

More specifically FIG. 28 shows a diagonal-wise reading pattern from each interleaving array with parameters of $N'_{xBLOCK\_TI\_MAX}=7$ and Sshift=(7−1)/2=3. Note that in the reading process shown as pseudocode above, if $V_i \geq N_{cells} N_{xBLOCK\_TI}(n,s)$, the value of Vi is skipped and the next calculated value of Vi is used.

Figure 29:
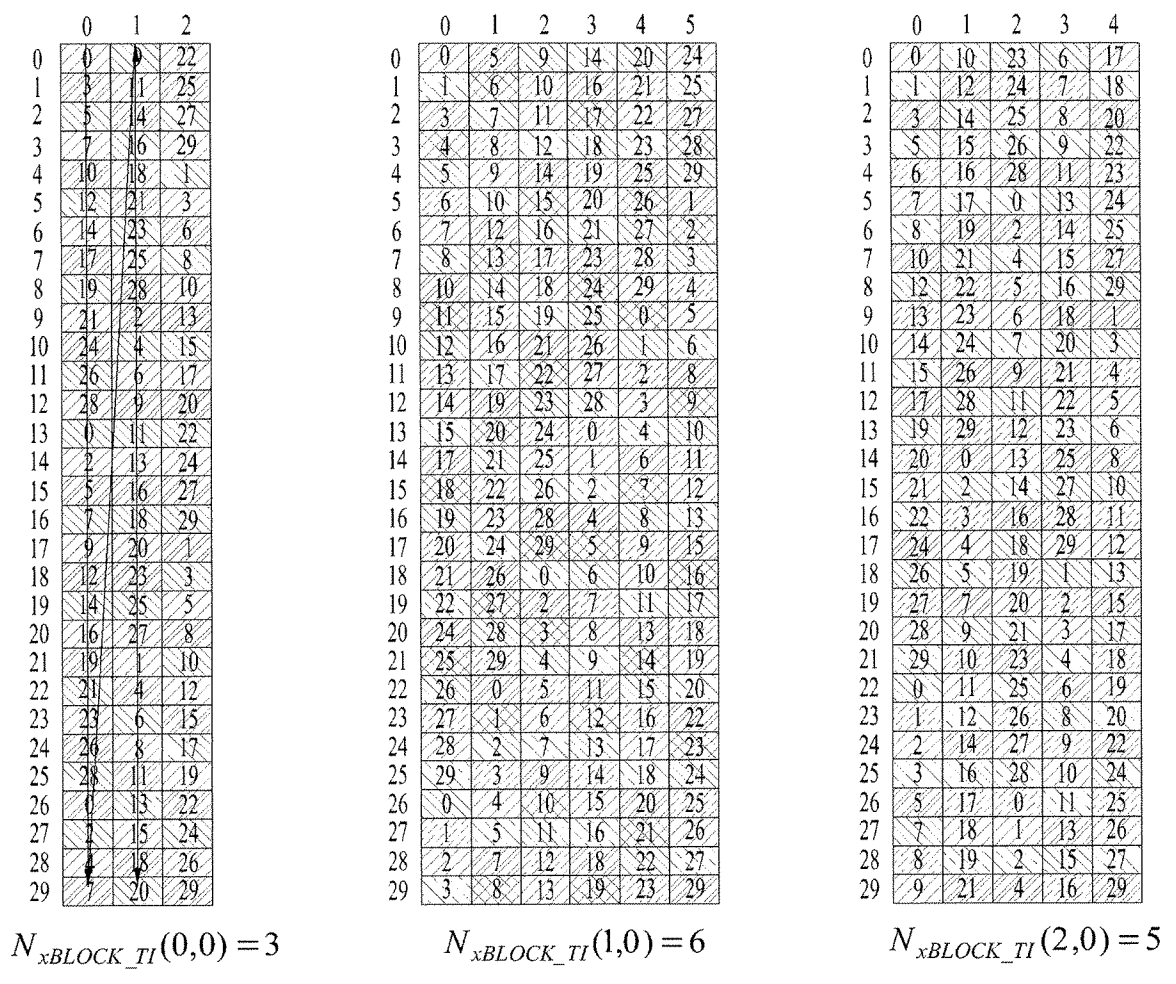

FIG. 29 illustrates interleaved XFECBLOCKs from each interleaving array according to an embodiment of the present invention.

FIG. 29 illustrates the interleaved XFECBLOCKs from each interleaving array with parameters of $N'_{xBLOCK\_TI\_MAX}=7$ and Sshift=3.

Hereinafter, a method of protecting PLS data by the apparatus for transmitting broadcast signals according to the present embodiment will be described. As described with reference to FIG. 2, the PLS data may include PLS1 data and PLS2 data.

PLS1 data provides basic transmission parameters including parameters required to enable the reception and decoding of PLS2. PLS1 fields remain unchanged for /'the entire duration of one frame-group.

PLS2 contains parameters that provide sufficient information for the receiver to decode the desired DP. PLS2 signaling further consists of two types of parameters, PLS2-STAT and PLS2-DYN. The PLS2-STAT parameters are the same within a frame-group, while the PLS2-DYN parameters provide information that is specific to the current frame. The values of the PLS2-DYN parameters may change during the duration of one frame-group, while the size of fields remains constant.

PLS1 and the static part of PLS2 can be changed only on the border of two super-frames. In in-band signaling, there is a counter indicating the next super-frame with changes in PLS1 or the static part of the PLS2 parameters. The receiver can locate the change boundary by checking the new PLS parameters from the FSS(s) in the first frame of the announced super-frame, where the indicated change applies.

Figure 30:
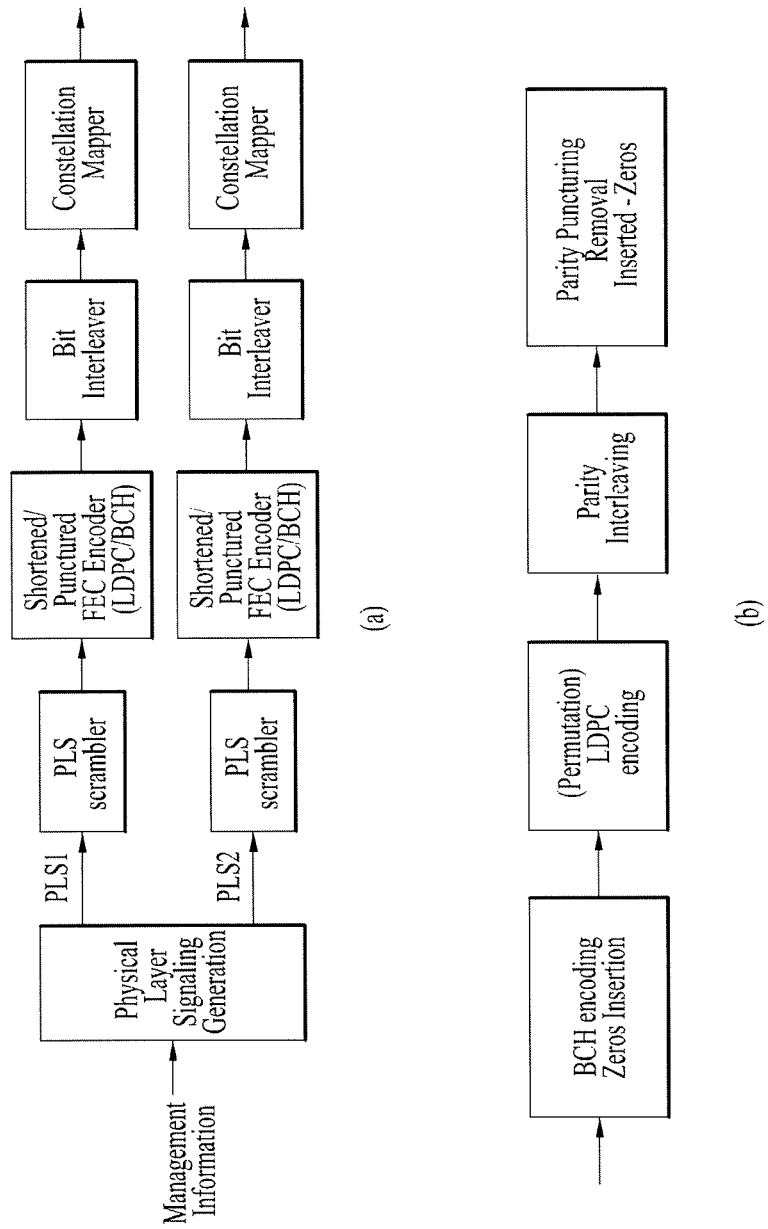
FIG. 30 illustrates a PLS data protection operation according to an embodiment of the present invention.

FIG. 30, including view (a) and view (b), illustrates a PLS data protection operation according to an embodiment of the present invention.

FIG. 30(a) illustrates an operation of processing PLS data by the apparatus for transmitting broadcast signals according to the present embodiment.

FIG. 30(b) illustrates a detailed operation of a shortened/punctured FEC encoder (LDPC/BCH) according to the present embodiment.

As illustrated in FIG. 30(a), the PLS data protection operation according to the present embodiment may include a physical layer signaling generation block, a PLS scrambler, the shortened/punctured FEC encoder (LDPC/BCH), a bit interleaver and a constellation mapper. In the present invention, the physical layer signaling generation block may be referred to as a signaling generation block. Hereinafter, operations of the respective functional blocks will be described.

The signaling generation block creates physical layer signaling information used for the operation of each functional block. This signaling information is also transmitted so that services of interest are properly recovered at the receiver side.

The signaling generation block may generate and output each of the PLS1 data and the PLS2 data based on input management information. Thereafter, each of the PLS1 data and the PLS2 data may be independently processed.

In addition, the signaling generation block may divide and output the PLS data in units for LDPC encoding. In this case, the PLS data divided in units for LDPC encoding may be referred to as Ksig. In addition, each of the divided PLS data input to the LDPC encoder may be referred to as an information block or information bits. The signaling generation block may not divide the PLS1 data.

Hereinafter, the operation of each functional block may be performed on each of the PLS1 data and the PLS2 data. In description with reference to figures below, the PLS data may include the PLS1 data or the PLS2 data.

Thereafter, the PLS scrambler may scramble and output input PLS data. The PLS data is scrambled (randomized) for energy dispersal. A detailed operation of the PLS scrambler will be described below.

Thereafter, the shortened/punctured FEC encoder (LDPC/BCH) may encode the input scrambled PLS data. The shortened/punctured FEC encoder (LDPC/BCH) may include a BCH encoder with zeros insertion block, an LDPC encoding block, a parity interleaving block and a parity puncturing inserted-zeros removal block. Detailed operations of the respective functional blocks included in the shortened/punctured FEC encoder will be described with reference to FIG. 30(b).

The shortened/punctured FEC encoder may output shortened and punctured LDPC-encoded PLS data. The LDPC-encoded PLS data output from the shortened/punctured FEC encoder may be input to the bit interleaver. The bit interleaver may interleave input bits of the shortened and punctured LDPC-encoded PLS data.

The bit interleaver according to the present embodiment may adjust reliability of the LDPC-encoded PLS data and of bits in a QAM symbol. The QAM symbol may correspond to a column used in a detailed operation of the bit interleaver to be described below.

Thereafter, the constellation mapper may map the interleaved PLS data onto the QAM symbol. In this instance, QAM may have a form such as BPSK, QPSK, 16-QAM, 256-QAM, or the like.

As illustrated in FIG. 30(b), the shortened/punctured FEC encoder (LDPC/BCH) according to the present embodiment may include the 90 bit, the LDPC encoding block, the parity interleaving block and the parity puncturing inserted-zeros removal block. Hereinafter, the operations of the respective functional blocks will be described in detail.

The BCH encoder with zeros insertion block may BCH-encode input PLS data. After the BCH encoding, zero bits are inserted prior to the bit BCH output to generate LDPC encoding input. The LDPC encoding input according to the present embodiment may have a constant length due to the zero bits inserted in the BCH encoder with zeros insertion block.

In this case, the zero bits inserted into the PLS data may have a size determined based on Table 4. The size of the zero bits inserted into the PLS data may be set to $(K_{bch}-K_{sig})$. $K_{sig}$ of the PLS2 data may be a variable unlike $K_{sig}$ of the PLS1 data. Therefore, zero bits inserted into the PLS2 data may have a size changed depending on $K_{sig}$ and $K_{bch}$.

The apparatus for transmitting broadcast signals according to the present embodiment may perform zero bits insertion without BCH encoding. Or the apparatus for transmitting broadcast signals according to the present embodiment may not perform both BCH encoding and zero bits insertion.

The LDPC encoding block may permute the PLS1 data, which is input from the BCH encoder. In this case, the permutation may be performed based on a shortening order or a permutation pattern. The permutation may be performed in units of 90 bits.

When the apparatus for transmitting broadcast signals according to the present embodiment may not perform BCH encoding, LDPC encoding block may perform permutation to zero inserted PLS data without BCH encoding. Or when the apparatus for transmitting broadcast signals according to the present embodiment may not perform both BCH encoding and zero bits insertion. LDPC encoding block may perform permutation to PLS data only.

The LDPC encoding block may perform column permutation of an H matrix on the PLS2 data, which is input from the BCH encoder, after LDPC encoding to ensure shortening performance. The apparatus for transmitting broadcast signals and the apparatus for receiving broadcast signals according to the present embodiment may reduce complexity when encoding and decoding permutated PLS data. The H matrix may be referred to as a parity check matrix.

The LDPC encoding block may perform LDPC encoding on the permuted PLS1 data. In addition, the LDPC encoding block may perform LDPC encoding on the PLS2 data. The LDPC encoding block may output the LDPC-encoded PLS data in the form of an H matrix. The H matrix output from the LDPC encoding block has a sequential form. In addition, a parity part may be rapidly decoded in a dual diagonal (or bit-wise dual diagonal) form by the apparatus for receiving broadcast signals.

The LDPC encoding block according to the present embodiment may use 4K-1/4 LDPC code for the PLS1 data and use 4K-1/4 or 7K-3/10 LDPC code for PLS2 data to output the H matrix.

The parity interleaving block interleaves parity bits of the LDPC code which is the output of the aforementioned LDPC encoding block. The parity interleaving block may interleave bits of the LDPC code to output the bits in a form of a quasi-cyclic block (QCB) (block-wise dual diagonal form). The LDPC code output in the form of the QCB may be addressed in QC units by a receiver.

Thereafter, the parity puncturing inserted-zeros removal block may puncture a portion of LDPC parity bits in LDPC encoded bits of PLS data, and remove zero bits which are inserted after BCH encoding to output encoded PLS data. The parity puncturing inserted-zeros removal block according to the present embodiment may output encoded PLS data having a particular code rate by adjusting the punctured parity bits and the removed zero bits.

The punctured parity bits may have a size determined based on the following expression.

$$\begin{cases} \text{floor}(1.38 \times (Kbch - Ksig)) + 1346, & \text{if } Ksig < 1021 \\ \text{floor}(1.41 \times (Kbch - Ksig)) + 1620, & \text{otherwise} \end{cases}$$

Here, Ksig denotes a size of the scrambled PLS data output by the PLS scrambler, and Kbch is set to 1020 or 2100 depending on the size of Ksig (see Table 4).

The above-described blocks may be omitted or replaced by blocks having similar or identical functions.

Figure 31:
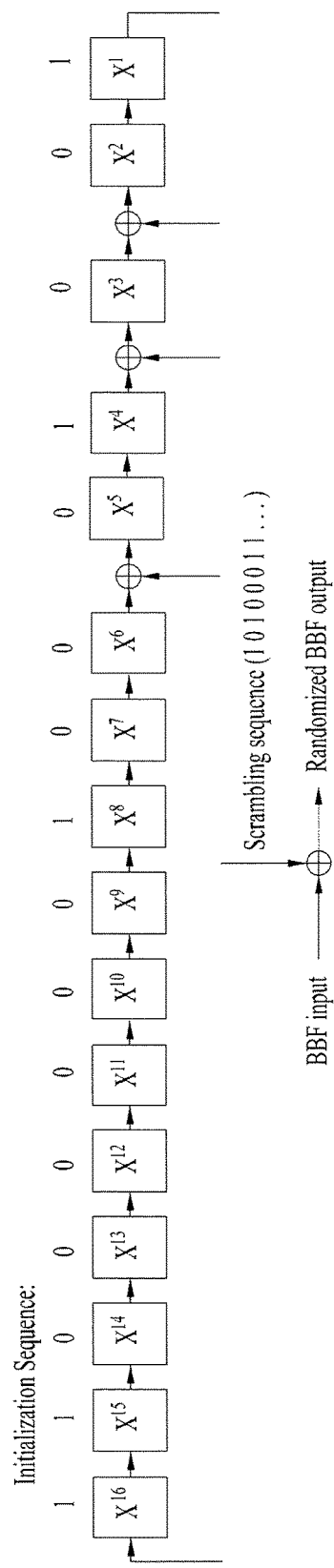
FIG. 31 illustrates the PLS scrambler according to the present embodiment.

FIG. 31 illustrates the PLS scrambler according to the present embodiment.

The PLS scrambler illustrated in FIG. 31 may be a linear shift feedback register (LSFR).

All Ksig blocks of PLS1 and PLS2 blocks are scrambled before BCH encoding and shortened and punctured LDPC encoding. The generator polynomial of the randomizer is the same as that of the BBF. The feed-back shift register is loaded with the initial sequence (0xC089) at the start of every PLS1 information block and every segmented PLS2 information block.

FIG. 32, including views (a) to (c), illustrates a detailed operation of the parity interleaving block using a PLS data structure.

FIG. 32(a) illustrates a structure of the LDPC-encoded PLS data output by the LDPC encoding block.

FIG. 32(b) illustrates a detailed operation of the shortened/punctured FEC encoder (LDPC/BCH) according to the present embodiment. Operations of respective functional blocks of FIG. 32(b) are identical to the operations of the respective functional blocks described with reference to FIG. 30(b).

FIG. 32(c) illustrates a structure of the LDPC-encoded PLS data subjected to parity interleaving and output by the parity interleaving block.

The LDPC-encoded PLS data illustrated in FIG. 32(a) is output from the LDPC encoding block. The LDPC-encoded PLS data may include LDPC info (Kldpc) and LDPC parity (Nldpc−Kldpc). LDPC info (Kldpc) may include BCH info and BCH parity. BCH info may include encoded PLS data and zero inserted bits. LDPC parity (Nldpc−Kldpc) may include Qldpc parity groups. Qldpc has a size determined based on a size of the PLS data which is divided in units for LDPC encoding and input to the LDPC encoder (see Table 4). As illustrated in FIG. 32(a), each of parity blocks having a length of Qldpc may include a parity bit of $1^{st}$ parity group, a parity bit of $2^{nd}$ parity group, . . . , and a bit of $90^{th}$ parity group.

Parity interleaved PLS data illustrated in FIG. 32(c) is output from the parity interleaving block. The parity interleaved PLS data may include LDPC info (Kldpc) and LDPC parity (Nldpc–Kldpc). The parity interleaving block may collect parity bits of LDPC parity (Nldpc–Kldpc) for each parity group. In this case, each parity group may be 90-QCB.

The apparatus for transmitting broadcast signals according to the present embodiment may not perform BCH encoding as above described in FIG. 30. In this case, LDPC info.(Kldpc) represented in FIG. 32(a) and FIG. 32(c) may not include BCH parity. Or LDPC info.(Kldpc) may not include BCH parity and zero bits. That is, LDPC info. (Kldpc) may include PLS data and zero inserted bits or may include only PLS data.

Figure 33:
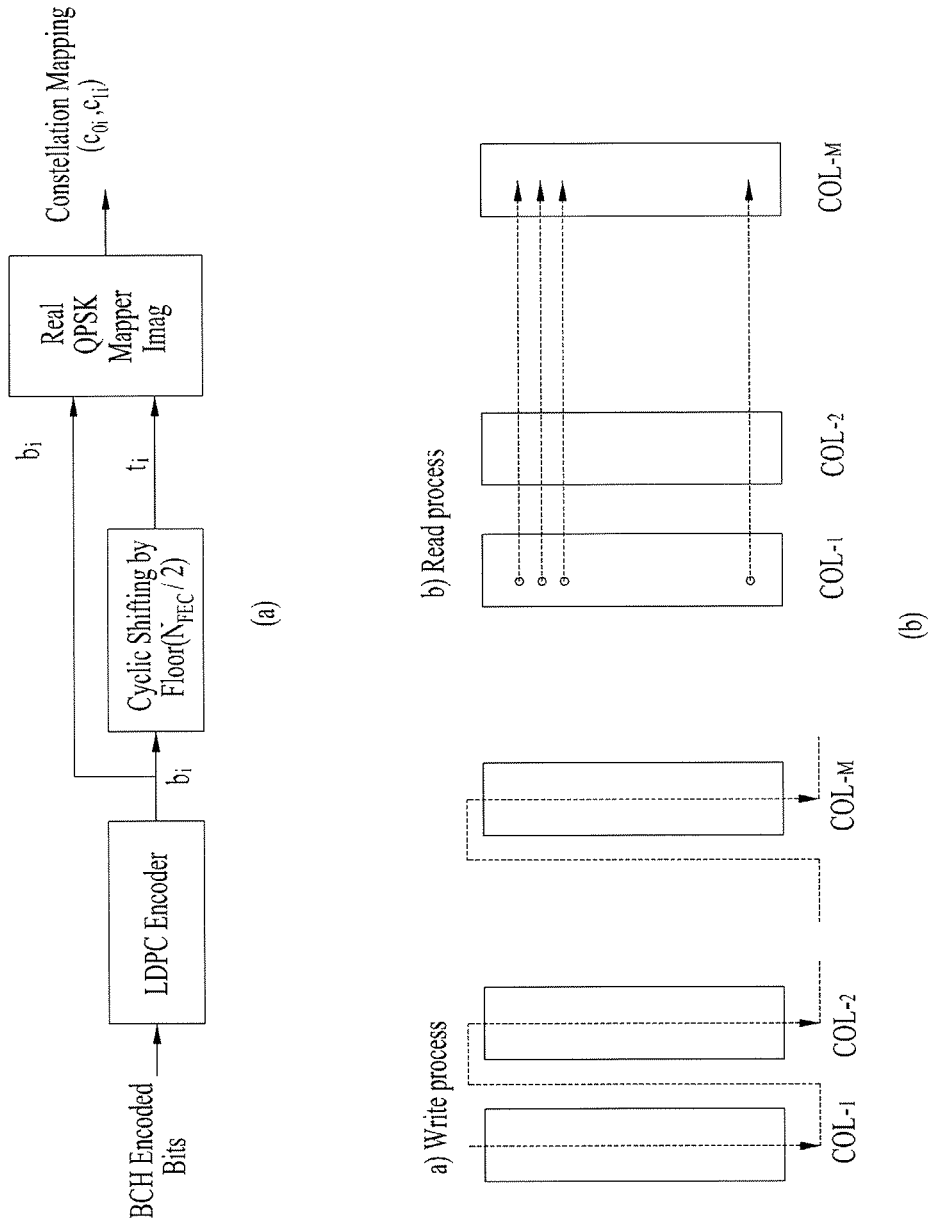
FIG. 33 illustrates an operation of a bit-interleaving block of the apparatus for transmitting broadcast signals according to the present embodiment.

FIG. 33, including view (a) and view (b), illustrates an operation of a bit-interleaving block of the apparatus for transmitting broadcast signals according to the present embodiment.

The operation of the bit-interleaving block may be performed in two types according to a modulation order. Hereinafter, operations of the bit-interleaving block will be described for a case in which the modulation order is BPSK and a case in which the modulation order is QPSK, higher order QAM, or QAM order.

FIG. 33(a) illustrates a bit interleaving operation for BPSK according to an embodiment of the present invention.

In the case of BPSK, there are two branches for bit interleaving to duplicate FEC coded bits in the real and imaginary parts. In this case, the bit-interleaving block may obtain diversity gain by distributing bits to real and imaginary parts. Each coded block is written to the upper branch first. The bits are mapped to the lower branch by applying modulo $N_{FEC}/2$ addition with cyclic shifting value floor $(N_{FEC}/2)$, where $N_{FEC}$ is the length of each LDPC coded block after shortening and puncturing. Consequently, the input of the cell-word constellation mapping is defined as:

$$[c_{0,i}, c_{1,i}] = [b_i, t_i], t_i = b_{(i+floor(N_{FEC}/2))modN_{FEC}},$$
$$i = 0, 1, \ldots, N_{FEC}-1.$$

FIG. 33(b) illustrates that the bit-interleaving block of the apparatus for transmitting broadcast signals according to the present embodiment performs block interleaving based on QPSK, higher order QAM, and QAM order.

FIG. 33(b) schematically illustrates a writing operation in the Write process a. In other modulation cases, such as QSPK, QAM-16 and NUQ-64, FEC coded bits are written serially into the interleaver column-wise, where the number of columns is the same as the modulation order. That is, QPSK, 16-QAM, QAM-64(NUQ-64) and QAM-256(NUQ-256) have the column numbers of 2, 4, 6 and 8, respectively.

FIG. 33(b) schematically illustrates a read operation in the Read process b. In the read operation, the bits for one constellation symbol are read out sequentially row-wise and fed into the bit demultiplexer block (see the Read process b) of FIG. 33(b)). These operations are continued until the end of the column.

The bit-interleaving block according to the present embodiment may map LDPC info bits and parity bits onto one symbol as equally as possible, which is intended to avoid a situation in which the LDPC info bits are nulled simultaneously with some of symbols included in a broadcast signal when the some symbols are nulled. In this way, the apparatus for receiving broadcast signals according to the present embodiment, which receives the broadcast signal, may enhance performance on a fading channel while maintaining performance on an additive white Gaussian noise (AWGN) channel.

Figure 34:
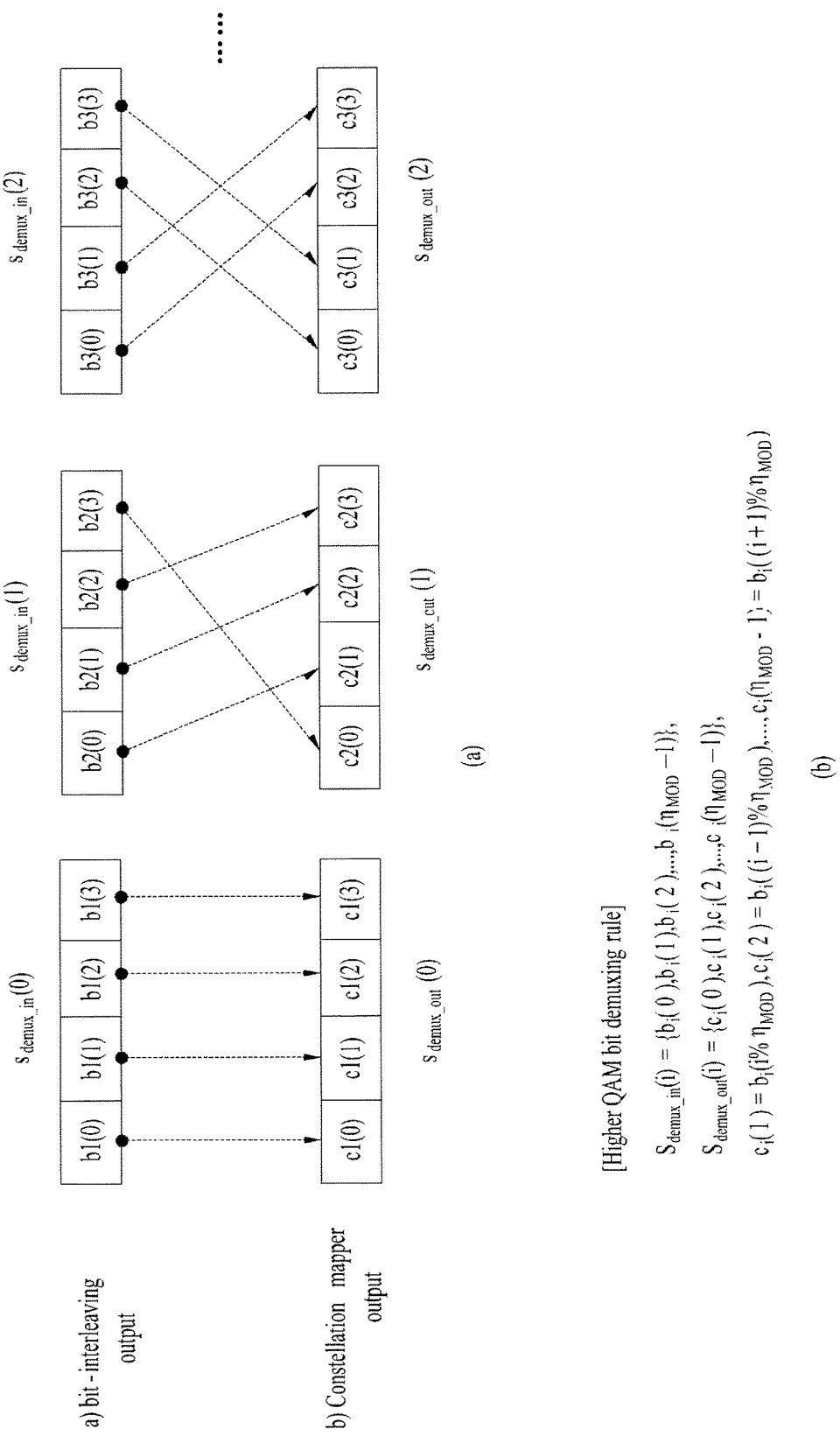
FIG. 34 illustrates a detailed operation of a bit demultiplexer (demux) of the apparatus for transmitting broadcast signals according to the present embodiment.

FIG. 34, including view (a) and view (b), illustrates a detailed operation of a bit demultiplexer (demux) of the apparatus for transmitting broadcast signals according to the present embodiment.

FIG. 34(a) shows the bit demultiplexing rule for QAM-16, QAM-64 and QAM-256. This operation continues until all bit groups are read from the bit-interleaving block. Specifically, a) bit-interleaving output illustrates a structure of data output by the bit-interleaving block, and b) constellation mapper output illustrates a structure of data output by the constellation mapper.

FIG. 34(b) shows equations for a higher QAM bit demuxing rule.

Hereinafter, the higher QAM bit demuxing rule shown in FIG. 34(b) will be described in detail.

Sdemux_in(i) is a bit demux input. That is, Sdemux_in(i) is an output of a block interleaver. A value i corresponds to a column index of the block interleaver. Sdemux_out(i) is an output of the bit demux.

$\eta$ MOD denotes a modulation order. That is, 16-QAM has a modulation order of 4, 64-QAM(NUQ-64) has a modulation order of 6, and 256-QAM(NuQ-256) has a modulation order of 8. When the bit demux according to the present embodiment performs demultiplexing based on the rule shown in FIG. 34(b), information bits of LDPC may be uniformly distributed from an MSB to an LSB of the QAM symbol.

The bit demux may enhance reliability of the broadcast signal by performing demultiplexing on bit-interleaved PLS data.

Each bit-interleaved group is demultiplexed bit-by-bit in a group before constellation mapping. Depending on modulation order, there are two mapping rules. In the case of BPSK and QPSK, the reliability of bits in a symbol is equal. Therefore, the bit group read out from the bit-interleaving block is mapped to a QAM symbol without any operation. In the case of QAM-n (n is 16 or more) (also including non-uniform QAM and non-uniform constellation), bits in the QAM symbol may have different reliabilities. In addition, an information bit of the PLS data, which is bit-interleaved based on the number of shortened/punctured bits, may be positioned in the MSB first.

The bit demux may perform bit demultiplexing on the bit-interleaved PLS data to enhance reliability of the bit-interleaved PLS data. However, when the bit demux is separately configured based on the variable number of shortened/punctured bits, complexity may be induced. The bit demux according to the present embodiment may circular-shift the PLS data based on the QAM order and map the circular-shifted PLS data onto the QAM symbol. The bit demux according to the present embodiment may perform mapping such that LDPC-encoded bits are uniformly distributed in the QAM symbol.

FIG. 35, including views (a)-(c), illustrates a result obtained by mapping bits input to the constellation mapper onto the QAM symbol and outputting the mapped bits by the constellation mapper according to the present embodiment.

QSPK is mapped as described in FIG. 35(a).

NUQ 64 is mapped as described in FIG. 35(b).

QAM-16 is mapped as described in FIG. 35(c).

Hereinafter, a detailed operation of the constellation mapper will be described.

The constellation mapper according to the present embodiment may map PLS data subjected to both bit interleaving and bit demultiplexing, or PLS data subjected only to bit interleaving onto the QAM symbol. The constellation mapper according to the present embodiment may change a symbol mapping scheme based on a targeted SNR. As described in the foregoing, the present invention may define three physical layer (PL) profiles: base, handheld and advanced profiles, each optimized to minimize receiver complexity while attaining the performance required in a particular use case. The constellation mapper according to the present embodiment may map PLS data of a profile (which may be a base profile or an advanced profile) for a mobile environment in a BPSK (or QPSK) scheme. In addition, the constellation mapper according to the present embodiment may map PLS data of a profile (which may be a handheld profile) for a fixed reception environment according to a 16-QAM or NUQ-64 scheme. When the constellation mapper according to the present embodiment maps the PLS data in an NUQ scheme, enhanced shaping gain and robustness may be acquired without increase in complexity compared to a case in which PLS data is mapped in a uniform QAM scheme. On the other hand, when the constellation mapper according to the present embodiment maps the PLS data according to the 16-QAM scheme, a gain difference is small compared to a case in which the PLS data is mapped in the NUQ scheme. Therefore, the constellation mapper according to the present embodiment may map the PLS data in the NUQ scheme without using the QAM scheme for a higher order than 16-QAM.

A code rate applied to the NUQ-64 scheme according to the present embodiment may be in a range of 5/15, 6/15, . . . , 13/15. Therefore, the constellation mapper according to the present embodiment may use the 5/15 code rate when mapping the PLS data using the NUQ-64 scheme. Since a code rate value that may be applied at the time of encoding the PLS data is 1/4 or 3/10, the constellation mapper according to the present embodiment may use 5/15 which is a code rate closest to 1/4 or 3/10.

Figure 36:
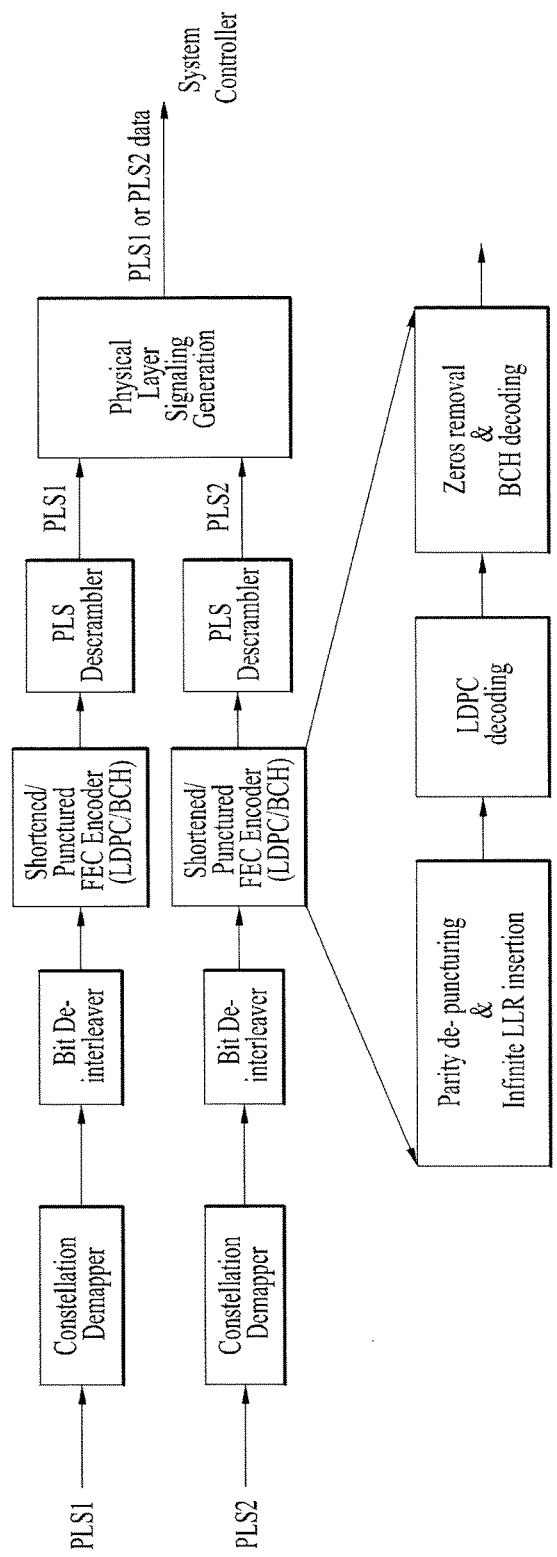
FIG. 36 illustrates that PLS data decoding is performed in the apparatus for receiving broadcast signals according to the present embodiment.

FIG. 36 illustrates that PLS data decoding is performed in the apparatus for receiving broadcast signals according to the present embodiment.

Each of functional blocks of the apparatus for receiving broadcast signals shown in FIG. 36 may perform a reverse procedure of the PLS data protection procedure of the apparatus for transmitting broadcast signals described with reference to FIGS. 30 to 35. However, parity deinterleaving corresponding to a reverse procedure of the parity interleaving may not be performed.

Blocks that perform the PLS data decoding according to the present embodiment may include a constellation demapper, a bit de-interleaver, a shortened/punctured FEC decoder (LDPC/BCH), a PLS descrambler and a physical layer signaling decoder. The blocks that perform the PLS data decoding shown in FIG. 36 may perform the operation of the signaling decoding block 9040 described above with reference to FIG. 9. When the apparatus for receiving broadcast signals according to the present embodiment receives PLS data that is unprocessed BCH encoding operation, the PLS data decoding operation according to the present embodiment may be omitted.

The shortened/punctured FEC decoder (LDPC/BCH) may include a parity de-puncturing & infinite LLR insertion block, an LDPC decoding block and a zeros removal & BCH decoding block.

The apparatus for receiving broadcast signals according to the present embodiment may independently process each of the PLS1 data and the PLS2 data. Hereinafter, operations of the respective functional blocks will be described.

As illustrated in FIG. 9, the synchronization & demodulation module 9000 may receive input signals through m Rx antennas, perform signal detection and synchronization with respect to a system corresponding to the apparatus for receiving broadcast signals and carry out demodulation corresponding to a reverse procedure of the procedure performed by the apparatus for transmitting broadcast signals.

The signaling decoding module 9400 may obtain PLS information from the signal demodulated by the synchronization & demodulation module 9000. As described above, the frame parsing module 9100, demapping & decoding module 9200 and output processor 9300 may execute functions thereof using the data output from the signaling decoding module 9400.

The constellation demapper may demap demodulated PLS data onto a soft bit having a log likelihood ratio (LLR) in symbol units.

The bit deinterleaver may perform bit deinterleaving on the demapped PLS data. The bit deinterleaver may perform a reverse procedure of the bit-interleaving block described above with reference to FIGS. 30 and 33.

The shortened/punctured FEC decoder (LDPC/BCH) may perform FEC decoding on the bit-deinterleaved PLS data. As described in the foregoing, the shortened/punctured FEC decoder may include the parity de-puncturing & infinite LLR insertion block, the LDPC decoding block and the zeros removal & BCH decoding block, and each of the blocks may process the input bit-deinterleaved PLS data. Hereinafter, operations of the respective blocks included in the shortened/punctured FEC decoder will be described.

The parity de-puncturing & infinite LLR insertion block may restore parity bits punctured in the apparatus for transmitting broadcast signals. In this case, the parity de-puncturing & infinite LLR insertion block may perform de-puncturing by inserting parity bits into positions where the parity bits are located before being punctured in the apparatus for transmitting broadcast signals.

The parity de-puncturing & infinite LLR insertion block may restore zero bits removed in an operation processed in the apparatus for transmitting broadcast signals. In this case, the parity de-puncturing & infinite LLR insertion block may insert 0 bit having an LLR.

The LDPC decoding block may perform LDPC decoding on the PLS data subjected to the parity de-puncturing & infinite LLR insertion block. When the PLS data received by the apparatus for receiving broadcast signals is QC-LDPC-encoded PLS data, the LDPC decoding block may perform parallel decoding on the PLS data in units of QC sizes.

Thereafter, the zeros removal & BCH decoding block may extract an information part from the LDPC-decoded PLS data. The zeros removal & BCH decoding block may perform BCH decoding after deleting zero bits which are inserted into the extracted information part.

The above-described blocks may be omitted or replaced by blocks having similar or identical functions.

FIG. 37 illustrates a BICM block for protection of physical layer signaling (PLS), emergency alert channel (EAC) and fast information channel (FIC). EAC is a part of a frame that carries EAS information data and FIC is a logical channel in a frame that carries the mapping information between a service and the corresponding base DP.

The BICM block for protection of PLS, EAC and FIC according to the present embodiment may include a PLS FEC encoder, a bit interleaver and a constellation mapper. Operations of the respective blocks are the same as those described with reference to FIG. 6.

Hereinafter, a detailed configuration and operation of the bit interleaver will be described.

As illustrated in FIG. 37, the bit interleaver according to the present embodiment may include a block interleaver and a bit demux. As illustrated with reference to FIG. 34, the bit demux block may demultiplex PLS data to which a QAM order of 16-QAM or more is applied.

The block interleaver may perform the same operation as that of the bit interleaver described above with reference to FIGS. 30 to 33. The bit demux may perform the same operation as that of the bit demux described above with reference to FIG. 34.

Above-described blocks may process emergency alert channel (EAC) and fast information channel (FIC). The procedure of processing the EAC and FIC may be the same as that of the PLS data as above-described. Otherwise, the procedure of processing the EAC and FIC may differ from that of the PLS data as above-described.

The above-described blocks may be omitted or replaced by blocks having similar or identical functions.

FIG. 38 illustrates input and output data of the bit interleaver according to the present embodiment.

FIG. 38 illustrates input and output data of the bit interleaver for 16-QAM.

FIG. 38(a) illustrates data input to the bit interleaver. The data input to the bit interleaver is LDPC encoded data.

FIG. 38(b) schematically illustrates a write operation and a reading operation of the bit interleaver.

The LDPC-encoded PLS data illustrated in FIG. 38(a) has the same configuration as that of the LDPC-encoded PLS data described above with reference to FIG. 32(a).

A whole codeword refers to LDPC-encoded bits of the PLS data. In addition, information parts and parity parts correspond to LDPC info (Kldpc) and LDPC parity (Nldpc-Kldpc), respectively, of FIG. 32(a). The whole codeword according to the present embodiment may have a length equal to a value of Nldpc of Table 4. The whole codeword in the present specification may be referred to as an LDPC codeword or a codeword.

FIG. 38 corresponds to an example of the operation of the bit interleaver for 16-QAM. Thus, the number of columns illustrated in FIG. 38(b), that is, a QAM-order is 4. Therefore, the LDPC-encoded PLS data illustrated in FIG. 38(a) is divided into four equal parts and written to each of the columns. Each of two arrows below the information parts and the parity parts has a length corresponding to half of a length of the whole codeword. Each of two arrows below the first arrow, which is one of the two arrows below the information parts and the parity parts, has a length corresponding to ¼ the length of the whole codeword. The bit interleaver may write bits corresponding to the length of one of the arrows on the bottom to each column in a column-wise manner.

In the read operation, the bits for one constellation symbol are read out sequentially row-wise and fed into the bit demultiplexer block. These operations are continued until the end of the column.

In this case, each QAM symbol may include an information bit of at least 1 bit.

Figure 39:
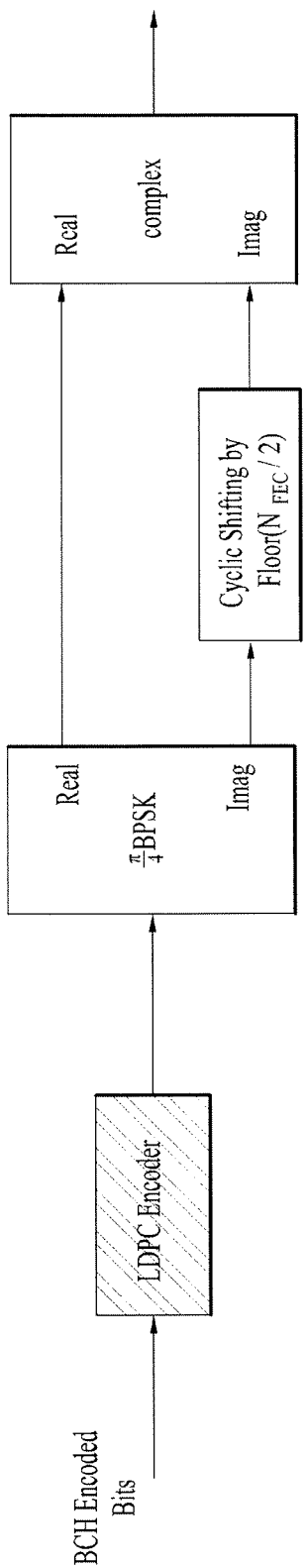
FIG. 39 illustrates a configuration of a bit interleaver block of a broadcast signal transmission apparatus according to an embodiment of the present invention.

FIG. 39 illustrates a configuration of a bit interleaver block of a broadcast signal transmission apparatus according to an embodiment of the present invention.

Specifically, FIG. 39 illustrates an equivalent configuration of the bit interleaver block described with reference to FIG. 33(a). An operation and effect of the bit interleaver block illustrated in FIG. 39 may be the same as an operation and effect of the bit interleaver block illustrated in FIG. 33(a).

As illustrated in FIG. 33, the bit interleaver block according to the embodiment of the present invention may include the LDPC encoder, the cyclic shift block, and the QPSK mapper. In addition, as illustrated in FIG. 39, the bit interleaver block according to the present embodiment may include an LDPC encoder, a BPSK mapper, a cyclic shift block, and a complex mapper. The configuration of the bit interleaver block illustrated in FIG. 39 is an equivalent configuration of the bit interleaving block illustrated in FIG. 33.

A mapper included in the bit interleaver block according to an embodiment of the present invention may be referred to as a QPSK mapper, a BPSK mapper, or a complex mapper, and the mapper may disperse FEC-encoded bits to a real part and an imaginary part. The complex mapper according to the present embodiment may correspond to the QPSK mapper or the BPSK mapper, and a specific name of the mapper may be changed by a designer.

A signaling generation block according to an embodiment of the present invention may perform a bit interleaving operation and/or a block interleaving operation according to a modulation order. When the modulation order corresponds to QPSK, the bit interleaving operation according to the present embodiment may be performed based on an SSD scheme. Therefore, the configurations of the bit interleaver blocks illustrated in FIGS. 33 and 39 may be applied when the modulation order corresponds to QPSK and the SSD scheme is employed.

When the modulation order corresponds to QPSK or higher order QAM greater than or equal to QPSK, block interleaving may be performed based on a QAM order. In this case, a block interleaving operation may be the same as the above-described bit interleaving operation illustrated in FIG. 33(b). The block interleaving operation and effects thereof according to the present embodiment are the same as the above description with reference to FIG. 33(b).

Hereinafter, a description will be given of a specific operation of bit interleaving performed based on the SSD scheme when the modulation order corresponds to QPSK.

The mapper according to the present embodiment may duplicate an output bit of the LDPC encoder in the real part and the imaginary part. Specifically, the mapper according to the present embodiment may disperse respective output bits of the LDPC encoder to the real part and the imaginary part, thereby acquiring I/Q diversity gain. In this case, the mapper may equally allocate LDPC information bits and parity bits to QAM symbols (or QPSK symbols). Therefore, even when any one of symbols is nulled by a transmission channel environment, information bits are not continuously mapped to one QAM symbol. Thus, it is possible to prevent information bits corresponding to 2 or more bits from being simultaneously nulled. In this case, performance on a fading channel may be enhanced while maintaining performance in an AWGN environment.

A cyclic shift memory of the cyclic shift block according to the present embodiment may perform an interleaving operation. The cyclic shift memory according to the present embodiment may be connected to an input end of the imaginary part of the mapper as illustrated in FIG. 33 or FIG. 39, and connected to an input end of the real part of the mapper although not illustrated.

FIG. 40 shows an equation indicating an operation of a bit demultiplexer of a broadcast signal transmission apparatus according to an embodiment of the present invention.

Specifically, FIG. 40 expresses a higher-QAM demultiplexing rule by an equation, which is similar to the above-described equation of FIG. 34(*b*).

Hereinafter, the higher QAM demultiplexing rule illustrated in FIG. 40 is similar to the above description with reference to FIG. 34(*b*) except for $c_i(\eta_{MOD}-1)=b_i((i+\eta_{MOD}-1)\% \eta_{MOD})$, and thus a specific description thereof will be omitted. The bit demultiplexer according to the present embodiment may perform the operation of FIG. 34(*a*) based on the equation of FIG. 40.

The bit demultiplexer according to the present embodiment may not be operated under a particular condition. The particular condition may be changed according to modulation order or encoding scheme. Specifically, the particular condition may correspond to a case of QPSK to which the SSD encoding scheme is applied or a case in which the modulation order is QPSK. When the bit demultiplexer is not operated, a bit may be directly mapped to a QAM symbol.

FIG. 41 illustrates a bit deinterleaver of a broadcast signal reception apparatus according to an embodiment of the present invention. Specifically, the bit deinterleaver illustrated in FIG. 41 may perform an operation corresponding to a reverse operation of the above-described operation of the bit interleaver according to the embodiment of the present invention.

The broadcast signal reception apparatus according to the present embodiment may perform the operation of decoding PLS data described with reference to FIG. 36 when a modulation order is QPSK, and a broadcast signal that includes PLS data processed based on SSD encoding is not received. Therefore, the bit deinterleaver illustrated in FIG. 41 may operate only when the modulation order is QPSK, and the broadcast signal reception apparatus according to the present embodiment receives the broadcast signal that includes PLS data processed based on SSD encoding.

When the modulation order is QPSK, and the broadcast signal that includes PLS data processed based on SSD encoding is not received, the bit deinterleaver according to the present embodiment may differently operate based on a dimension of LLR decoding as illustrated in FIG. 41.

FIG. 41(*a*) illustrates a configuration corresponding to a case in which the bit deinterleaver according to the present embodiment performs 2D-LLR decoding and an equation of an output bit of a 2D-QPSK demapper. The bit deinterleaver illustrated in FIG. 41(*a*) may operate upon receiving PLS data undergoing the bit interleaving operation described with reference to FIG. 33(*a*) and FIG. 39, and acquire maximum decoding ability using a 2D-LLR demapper (or 2D-LLR QPSK demapper). In this case, the bit deinterleaver according to the present embodiment may include a delay line block, a cyclic shift block, a 2D-QPSK demapper, and a shortened/punctured FEC decoder block. Hereinafter, a description will be given of specific data processing operations of the respective blocks.

The bit deinterleaver according to the present embodiment may perform an operation corresponding to a reverse operation of the cyclic shift block memory described with reference to FIG. 33(*a*) and FIG. 39 on a QPSK symbol including input PLS data.

Therefore, the QPSK symbol including PLS data may be input to each of the delay line block and the cyclic shift block. Thereafter, the delay line block may output a value corresponding to an I component, and the cyclic shift block may output a value corresponding to a Q component. Thereafter, the 2D-QPSK demapper applies the values of the I and Q components to the equation at the bottom of FIG. 41(*a*), thereby outputting LLR(bi)

Parameters included in the equation for obtaining LLR(bi) have meanings as below.

Ix and Qx denote values of I and Q components of each QPSK symbol, and each of ρI and ρQ denotes amplitude—fading factor of I and Q.

FIG. 41(*b*) illustrates a configuration corresponding to a case in which the bit deinterleaver according to the present embodiment performs 1D-LLR decoding. In this case, the bit deinterleaver according to the present embodiment may include a 1D-QPSK demapper, a delay line block, a cyclic shift block, and a shortened/punctured FEC decoder block. In this case, a QPSK symbol including PLS data may be first input to the 1D-QPSK demapper. The 1D-QPSK demapper according to the present embodiment may softly combine LLR values based on information indicating that a real part and a cyclic shifted imaginary part are repeated. Therefore, when the bit deinterleaver according to the present embodiment operates based on a 1D-QPSK demapping scheme, there is no need to use the equation for outputting specific LLR(bi) which is necessary when the 2D-QPSK demapper is used as in FIG. 41(*a*). Therefore, it is possible to expect lower complexity of the broadcast signal reception apparatus according to the present embodiment.

A specific operation of a block excluded from the above description among specific blocks included in the bit deinterleaver of FIG. 41(*b*) may be the same as an operation of a specific block having the same name included in the bit deinterleaver of FIG. 41(*a*).

FIG. 42 shows an equation indicating an operation of a bit demultiplexer of a broadcast signal transmission apparatus according to an embodiment of the present invention.

Specifically, FIG. 42 shows another equation indicating the operation of the bit demultiplexer described with reference to FIG. 34. The operation of the bit demultiplexer described with reference to FIG. 34(*a*) may be performed based on the equation shown in FIG. 42. Specific definitions of parameters of the equation are similar to the above description with reference to FIG. 34.

The operation of the bit demultiplexer according to the present embodiment described with reference to FIGS. 34 and 42 has effects and characteristics as below.

LDPC output of PLS data according to an embodiment of the present invention has a reliability that may vary according to the amount of signaling data, and thus an existing bit demultiplexing scheme performed according to a fixed rule is not suitable. The existing bit demultiplexing scheme performed according to the fixed rule may be a scheme that demultiplexes a data stream into sub-streams based on a predetermined table or parameter value as in standards such as DVB-T, DVB-NGH, etc.

The amount of signaling data according to the present embodiment may vary according to a service providing environment of a service provider. In this regard, the broadcast signal transmission apparatus according to the present embodiment may provide a constant SNR-threshold by processing variable signaling data using the above-described bit demultiplexing scheme. In the bit demultiplexing scheme according to the present embodiment, there is no need to separately define a shortening/puncturing order according to a modulation order. Therefore, the broadcast signal transmission apparatus according to the present embodiment may perform bit demultiplexing based on the same shortening/puncturing order defined irrespective of a modulation value.

FIG. 43 shows applicable ModCod combinations when PLS data signaling protection according to an embodiment of the present invention is performed.

PLS data signaling protection according to an embodiment of the present invention described with reference to FIGS. 30 to 32 may be performed based on a protection level to be described below. PLS data signaling protection according to the present embodiment to be described below may be performed according to a ModCod value categorized based on throughput of service data or signaling data. A category according to an embodiment of the present invention may be referred to as a mode or an information mode.

A trade-off exists between protection level (or robustness) and efficiency. In other words, as the protection level increases, redundancy increases, and thus data throughput may decrease.

Therefore, when signaling protection is performed based on an LDPC encoding scheme, it is important to adequately adjust the protection level.

FIG. 43(a) is a table showing an applicable ModCod combination when a length of LDPC code is 64 k.

In the table, a row indicates code rates and a column indicates modulation values. A code rate is expressed by x/15, in which x may have any one of values of 2 to 13. A modulation value may correspond to any one of 2, 4, 6, 8, 10, and 12. The table of FIG. 43(a) shows data throughput according to a combination of each code rate and each modulation value.

FIG. 43(b) is a table showing an applicable ModCod combination when a length of LDPC code is 16 k.

The table has the same structure as that of FIG. 43(a), and a modulation value may correspond to any one of 2, 4, 6, and 8.

As described in the foregoing, a result value of the tables shown in FIGS. 43(a) and 43(b) indicates data throughput according to a ModCod combination. The number of significant ModCod combinations is 46 when the length of LDPC code is 64 k, and the number of significant ModCod combinations is 27 when the length of LDPC code is 16 k.

Therefore, the broadcast signal transmission apparatus according to the present embodiment may process signaling data by categorizing 73 significant ModCod combinations according to a particular rule based on the tables of FIG. 43. When signaling protection is performed in this way, it is possible to expect further enhanced performance in terms of robustness and efficiency.

FIGS. 44 to 46 are tables that categorize and show data according to data throughput. Specifically, in FIGS. 44 to 46, applicable ModCod combinations are categorized based on data throughput shown in the above-described tables of FIG. 43. Data throughput shown in FIGS. 44 to 46 is related to each of a case in which a BCH operation is included (with BCH or w/ BCH) and a case in which the BCH operation is not included (without BCH or w/o BCH).

A length of LDPC code, a modulation order (Mod), a code rate (numerator for CR), SNR (FER=10^-4, AWGN), SNR (FER=10^-4, Ray), and data throughput according to whether the BCH operation is included (throughput (w/BCH), throughput (w/o BCH)) are shown at the tops of FIGS. 44 to 46.

Data may be classified into five categories in total including an interval in which data throughput is greater than 0 and less than or equal to 1 (category 1), an interval in which data throughput is greater than 1 and less than or equal to 2 (category 2), an interval in which data throughput is greater than 2 and less than or equal to 3.5 (category 3), an interval in which data throughput is greater than 3.5 and less than or equal to 5.5 (category 4), and an interval in which data throughput is greater than 5.5 (category 5).

The number of classified categories and a criterion for classifying categories may be changed by a designer. According to an embodiment of the present invention, the number of classified categories may be 7, and the criterion for classifying categories may be an information length of LDPC code.

FIG. 47 is a table showing BICM ModCod performance for each category according to an embodiment of the present invention.

Specifically, FIG. 47 is a table obtained based on result values of the tables shown in FIGS. 44 to 46. Data-BICM ModCod Performance on the left side of FIG. 47 shows maximum capacity (or maximum data throughput), a minimum AWGN value, and a minimum Rayleigh value for each category. Signaling ModCod on the right side of FIG. 47 shows a ModCod value applied to each category.

FIG. 48 is a table showing BICM ModCod for each category according to an embodiment of the present invention. Specifically, FIG. 48 corresponds to another example of FIG. 47 and proposes a more suitable ModCod combination when targeted performance varies for each particular category.

Data may be classified into six categories based on data throughput. In this case, intervals may be more uniform when compared to a case in which data is classified into five categories. Signaling ModCod on the right side of FIG. 48 shows a ModCod value applicable to each category when robustness of data is mainly targeted in Category 1 and Category 2 and data transmission (high capacity) is mainly targeted in Category 3 to Category 6.

Figure 49:
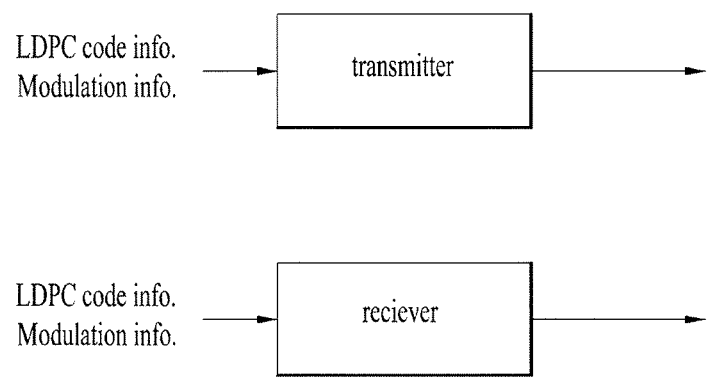
FIG. 49 is a conceptual diagram illustrating a broadcast signal transmission apparatus and a broadcast signal reception apparatus according to an embodiment of the present invention operating based on ModCod information.

FIG. 49 is a conceptual diagram illustrating a broadcast signal transmission apparatus and a broadcast signal reception apparatus according to an embodiment of the present invention operating based on ModCod information.

Specifically, the broadcast signal transmission apparatus and the broadcast signal reception apparatus according to the present embodiment may have the same configurations as those of the broadcast signal transmission apparatus of FIG. 30 and the broadcast signal reception apparatus of FIG. 36.

The broadcast signal transmission apparatus according to the present embodiment may transmit a category value as level (or category) information of signaling data. For example, level information of signaling data may be transmitted such that "000" is transmitted for category1, "001" is transmitted for category2, "010" is transmitted for category3, "011" is transmitted for category4, and "100" is transmitted for category5. In this case, the broadcast signal reception apparatus according to the present embodiment may acquire information about a corresponding category by decoding level information of data. The broadcast signal reception apparatus according to the present embodiment may perform FEC decoding by acquiring ModCod information based on category information of data.

Alternatively, the broadcast signal transmission apparatus according to the present embodiment may transmit level (or category) information of data by including a ModCod value as the information in signaling information. The broadcast signal transmission apparatus according to the present embodiment may determine a ModCod value after classifying data into categories. For example, among code rate values, 3/15 LDPC may be signaled as Code_type="00" and 6/15 LDPC may be signaled as Code_type="01". A modulation value may be signaled as "000" in BPSK, "001" in QPSK, "010" in 16QAM, "011" in 64QAM, and "100" in 256QAM.

Therefore, if signaling data is classified as Category 3 when the broadcast signal transmission apparatus according to the present embodiment performs signaling based on the table of FIG. 48, Code_type="01" and Mod_type="001" may be signaled. In this case, the broadcast signal reception apparatus according to the present embodiment may decode signaling data by acquiring information of Code_type and Mod_type.

The broadcast signal transmission apparatus according to the present embodiment may perform signaling by arbitrarily changing a category of data to enhance robustness. For example, data, data throughput (capacity) of which is 7.2, corresponds to Category5. In this case, the broadcast signal transmission apparatus according to the present embodiment may determine a ModCod value to be 6/15-LDPC and 256QAM based on the table of FIG. 47. However, the broadcast signal transmission apparatus according to the present embodiment may determine the ModCod value to be 6/15-LDPC and 64QAM corresponding to Category4 to enhance robustness of data.

The broadcast signal transmission apparatus according to the present embodiment may include the ModCod value or the category value described above as signaling information in a PLS or a bootstrap and transmit the value. In addition, the broadcast signal transmission apparatus according to the present embodiment may protect signaling information based on a ModCod value determined for each category. The broadcast signal reception apparatus according to the present embodiment may perform signaling decoding based on bootstrapping, a PLS, a ModCod value included in L1 signaling data, or category information.

Names of a PLS, PLS1, and PLS2 according to an embodiment of the present invention may be changed to L1 signaling data, L1-static data (or L1 pre-data), and L1-dynamic data (or L1 post-data), respectively.

Figure 50:
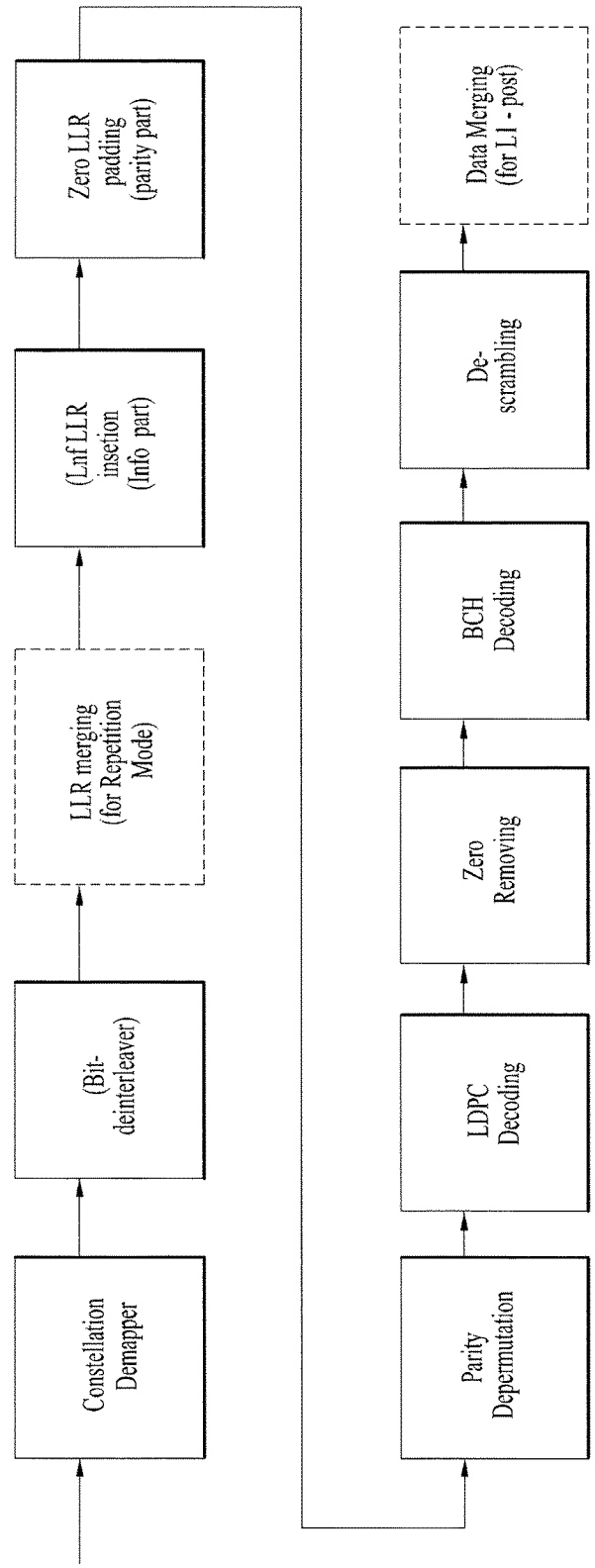
FIG. 50 illustrates a configuration of a decoding block of L1 signaling data of a broadcast signal reception apparatus according to an embodiment of the present invention.

FIG. 50 illustrates a configuration of a decoding block of L1 signaling data of a broadcast signal reception apparatus according to an embodiment of the present invention.

FIG. 50 corresponds to another example of the PLS data decoding block of the broadcast signal reception apparatus according to the embodiment of the present invention described with reference to FIG. 36. Therefore, a detailed description of an operation of a block, among blocks shown in FIG. 50, which overlaps with a block of FIG. 36 will be omitted.

The decoding block of the L1 signaling data according to the present embodiment may include a cell demapper, a bit deinterleaver, an LLR merging block, an infinite (Inf) LLR insertion block, a zero LLR padding block, a parity de-permutation block, an LDPC decoding block, a zero removing block, a BCH decoding block, a descrambling block, and a data merging block. Sub-blocks that may be included in the decoding block of the L1 signaling data according to the present embodiment may be omitted or added by a designer.

The cell demapper according to the present embodiment may demap an L1 signaling data cell included in a signal frame. The L1 signaling data cell may include an L1 static cell and an L1 dynamic cell. The L1 signaling data decoding according to the present embodiment may be applied to each of L1 static data and L1 dynamic data. In this case, the same decoding process may be applied except for the data merging block. The L1 dynamic data may be split into a plurality of FEC blocks at a transmitting end, and then FEC-encoded and transmitted. Therefore, the data merging block according to the present embodiment may merge only the L1 dynamic data.

Thereafter, a constellation demapper may receive a cell output from the cell demapper, and demap the cell to a bit based on a constellation of each cell. Thereafter, the constellation demapper may output the bit in a form of LLR. The bit deinterleaver may perform a reverse operation of the above-described L1 bit interleaver. In other words, the bit deinterleaver according to the present embodiment may align bits using an FEC block as a unit.

When a repetition mode is applied to protection of the L1 signaling data in a transmitter, the LLR merging block may merge LLRs of repeatedly transmitted L1 signaling bits in an FEC block. The repetition mode according to the present embodiment may indicate that L1 data is transmitted by being repeatedly included in the same signal frame or different signal frames. Alternatively, the repetition mode according to the present embodiment may indicate that some parity bits of L1 data are overlapped and transmitted. The two cases are intended to enhance robustness when a signal frame is transmitted. The Inf LLR insertion block may allocate an LLR to a bit having high reliability among bits shortened in an L1 encoding process. Even though a bit shortened in an LDPC encoding process is not actually received by a receiver, the bit corresponds to data known to the receiver as a value of 0. Therefore, as described in the foregoing, bits having reliable LLRs may be allocated to an information part. On the other hand, an LDPC puncturing bit is not transmitted after LDPC encoding, and thus the zero LLR padding block may insert zero-LLR into a position of a parity bit to indicate that the corresponding bit cannot be determined to be 0 or 1. The parity de-permutation block may perform an operation corresponding to a reverse operation of L1 parity permutation. The parity de-permutation block may output LLRs corresponding to a length of an LDPC codeword. Thereafter, the LDPC decoding block may perform LDPC decoding of the LLRs corresponding to the length of the LDPC codeword to output an LDPC information part in bits.

Thereafter, the zero removing block may remove zero bits corresponding to an L1 zero insertion interval. Thereafter, the L1 signaling data may be BCH-decoded and descrambled.

Information necessary when the L1 signaling data is decoded may be fixed to a system parameter. Examples of the information necessary when the L1 signaling data is decoded may include information related to a constellation applied to the L1 signaling data, information related to a repetition mode, length information of the L1 signaling data, and information related to the number of punctured LDPC parity bits. In addition, in a broadcast network using a heterogeneous system, information necessary to decode the L1 signaling data may be transmitted by being included in a preamble or a bootstrap.

Figure 51:
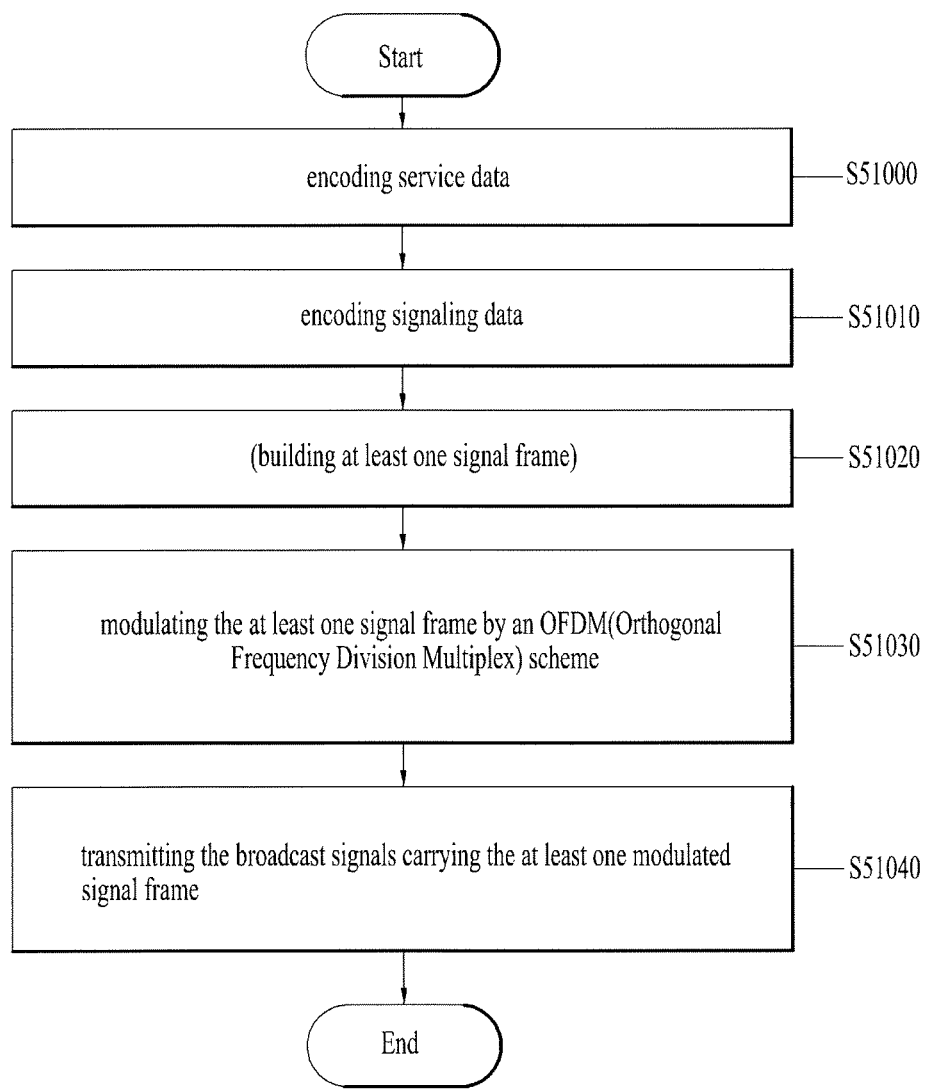
FIG. 51 is a flowchart illustrating a method of transmitting a broadcast signal according to an embodiment of the present invention.

FIG. 51 is a flowchart illustrating a method of transmitting a broadcast signal according to an embodiment of the present invention.

In S51000, a broadcast signal transmission apparatus according to an embodiment of the present invention may encode data (or service data) that transmits at least one broadcast service component. As described in the foregoing, the data according to the present embodiment may be processed for each DP corresponding to the data. The data may be encoded by the bit interleaved coding & modulation block 1010.

In S51010, the broadcast signal transmission apparatus according to the present embodiment may encode signaling data (which may be referred to as physical signaling data or PLS). As described in the foregoing, the signaling data according to the present embodiment may include L1-static data and L1-dynamic data.

As described in the foregoing, a PLS, PLS1, and PLS2 according to an embodiment of the present invention may be referred to as signaling data (or L1 signaling data), L1-static data (or L1 pre-data), and L1-dynamic data (or L1 post-data), respectively.

A broadcast signal reception apparatus according to an embodiment of the present invention may divide the L1-dynamic data into M blocks to encode the L1-dynamic data to a codeword having a constant size of N. Thereafter, the broadcast signal transmission apparatus according to the present embodiment may BCH-encode each block, perform zero padding on each BCH-encoded block, attach parity bits to a rear of the zero-padded block, and puncture the parity bits, thereby outputting an FEC block.

Specifically, the broadcast signal transmission apparatus according to the present embodiment may successively insert zero-padding bits into each block according to a determined zero-padding sequential order at the time of zero padding. Thereafter, the broadcast signal transmission apparatus according to the present embodiment may permute the zero-padded block based on the zero-padding sequential order. Thereafter, the broadcast signal transmission apparatus according to the present embodiment may perform LDPC encoding by attaching parity bits to a rear of the permuted block, and perform parity bit interleaving. Thereafter, the broadcast signal transmission apparatus according to the present embodiment may delete the inserted zero-padding bits. The broadcast signal transmission apparatus according to the present embodiment may be divided into a plurality of categories according to a size of the L1 signaling data. The broadcast signal transmission apparatus according to the present embodiment may encode the L1 signaling data based on a ModCod and a modulation value determined according to the divided categories.

The broadcast signal transmission apparatus according to the present embodiment may separately process (or encode) PLS1 and PLS2. Specifically, the broadcast signal transmission apparatus according to the present embodiment may insert padding data before splitting PLS2. In addition, some parity bits included in LDPC-encoded PLS2 may be punctured.

Thereafter, the broadcast signal transmission apparatus according to the present embodiment may permute LDPC parity bits included in PLS2 based on a permutation order after puncturing. The broadcast signal transmission apparatus according to the present embodiment may use a permutation order determined based on an LDPC code rate.

Thereafter, the broadcast signal transmission apparatus according to the present embodiment may select some of the punctured parity bits to transmit the selected parity bits by inserting the selected parity bits into PLS2. In this case, the selected parity bits may be referred to as additional parity bits. PLS1 may include information about whether the additional parity bits are included in PLS2. The additional parity bits may contribute to enhancement of decoding performance in the broadcast signal reception apparatus.

The signaling data may be encoded by the PLS FEC encoder 6000 of the broadcast signal transmission apparatus according to the present embodiment.

Thereafter, in S51020, the broadcast signal transmission apparatus according to the present embodiment may create at least one signal frame. The signal frame according to the present embodiment may include signaling data and service data. The signal frame may be created by the frame building block 1020.

Thereafter, in S51030, the broadcast signal transmission apparatus according to the present embodiment may modulate the at least one created signal frame using an OFDM scheme. OFDM modulation of the signal frame may be performed by the waveform generation module 1300.

Thereafter, in S51040, the broadcast signal transmission apparatus according to the present embodiment may transmit at least one broadcast signal carrying the at least one created and modulated signal frame.

Figure 52:
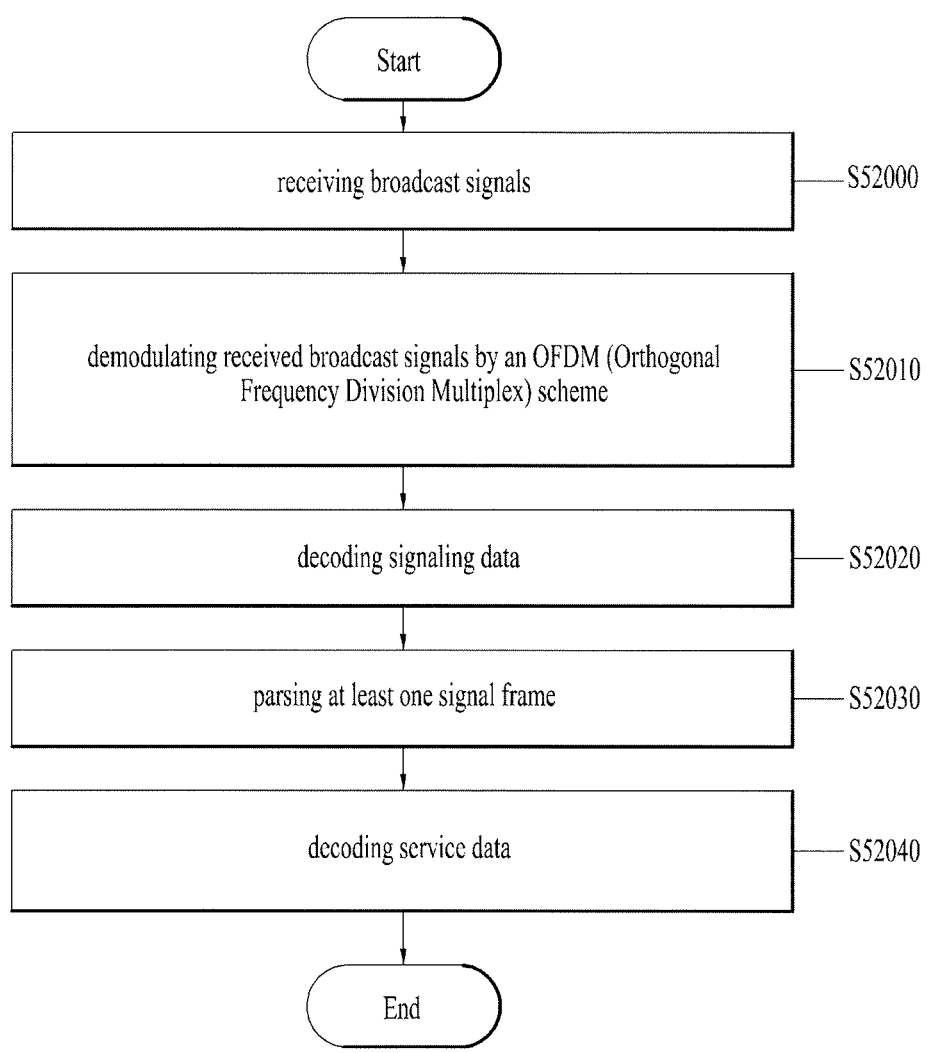
FIG. 52 is a flowchart illustrating a method of receiving a broadcast signal according to an embodiment of the present invention.

FIG. 52 is a flowchart illustrating a method of receiving a broadcast signal according to an embodiment of the present invention.

FIG. 52 corresponds to a reverse process of the method of transmitting the broadcast signal described with reference to FIG. 51.

In S52000, a broadcast signal reception apparatus according to an embodiment of the present invention may receive at least one broadcast signal. The broadcast signal according to the present embodiment includes at least one signal frame, and each signal frame may include signaling data and service data.

In S52010, the broadcast signal reception apparatus according to the present embodiment may demodulate the at least one received broadcast signal using an OFDM scheme. The broadcast signal may be demodulated by the synchronization & demodulation module 9000.

Thereafter, in S52020, the broadcast signal reception apparatus according to the present embodiment may operate according to a reverse order of the operation of the PLS FEC Encoder 6000 described above with reference to FIG. 28. Specifically, the broadcast signal reception apparatus according to the present embodiment may LDPC-decode PLS transmission bits included in the signal frame, and then BCH-decode the bits. When the broadcast signal reception apparatus according to the present embodiment BCH-decode signaling data subjected to the above-described PLS encoding scheme, the broadcast signal reception apparatus may BCH-decode only signaling data excluding a zero-padding bit. A broadcast signal transmission apparatus according to an embodiment of the present invention may be divided into a plurality of categories according to a size of L1 signaling data. The broadcast signal transmission apparatus according to the present embodiment may encode the L1 signaling data based on a ModCod and a modulation value determined according to the divided categories.

The broadcast signal reception apparatus according to the present embodiment may separately process (or decode) PLS1 and PLS2. Specifically, the broadcast signal reception apparatus according to the present embodiment may delete padding data included in PLS2. In addition, the broadcast signal reception apparatus may restore punctured parity bits included in PLS2 at the time of LDPC decoding. In this case, inserted padding data and punctured parity bits may have sizes determined at a transmitting end by the above-described method or equation. Therefore, the broadcast signal reception apparatus according to the present embodiment may reversely obtain the padding data and the punctured parity bits based on the above-described method or equation, or use the padding data and the punctured parity bits as known data.

As described in the foregoing, PLS2 may include additional parity bits, and PLS1 may include information about whether the additional parity bits are present. In addition, the above-described permutation order may be used as known data when the broadcast signal reception apparatus performs decoding.

PLS decoding may be performed by the signaling decoding module 9040.

Thereafter, in S52020, the broadcast signal reception apparatus according to the present embodiment may separate at least one signal frame from the demodulated broadcast signal. The signal frame may be separated by the frame parsing module 9010.

Thereafter, in S52040, the broadcast signal reception apparatus according to the present embodiment may decode the service data carrying at least one broadcast service component. The data may be decoded by the demapping & decoding module 9020.

It will be appreciated by those skilled in the art that various modifications and variations can be made in the present invention without departing from the spirit or scope of the inventions. Thus, it is intended that the present invention covers the modifications and variations of this invention provided they come within the scope of the appended claims and their equivalents.

Both apparatus and method inventions are mentioned in this specification and descriptions of both of the apparatus and method inventions may be complementarily applicable to each other.

What is claimed is:

1. A method for transmitting broadcast signals, the method comprising:
   encoding, by an encoder, service data;
   Low Density Parity Check (LDPC) encoding, by a signaling encoder, signaling data based on modes of the signaling data, wherein the signaling data is categorized into each mode based on an LDPC code rate and a modulation order for the signaling data;
   interleaving the LDPC encoded signaling data in an interleaver;
   demultiplexing the interleaved signaling data in a bit group using a shifting method,
   wherein output bits of the demultiplexing are cyclically shifted from input bits of the demultiplexing according to the modulation order and a bit group index of the signaling data, the bit group index being a parameter of the interleaver;
   mapping the demultiplexed signaling data into signaling symbols based on the modulation order;
   building, by a frame builder, at least one signal frame including the encoded service data and the signaling symbols;
   modulating, by a modulator, data in the at least one signal frame by an Orthogonal Frequency Division Multiplex (OFDM) scheme; and
   transmitting, by a transmitter, the broadcast signals carrying the modulated data in the at least one signal frame,
   wherein one of the modes for the signaling data represents a 6/15 LDPC code rate and a Quadrature Phase Shift Keying (QPSK) modulation.

2. The method of claim 1, wherein the broadcast signals further carry a bootstrap,
   wherein the bootstrap includes information indicating one of the modes of the signaling data.

3. The method of claim 1, wherein the shifting method is performed when the modulation order is one of 4, 6 or 8.

4. The method of claim 1, wherein the interleaving is performed by writing the LDPC encoded signaling data into the interleaver column-wise, a number of columns depending on the modulation order, and reading bits of the written signaling data row-wise.

5. An apparatus for transmitting broadcast signals, the apparatus comprising:
   an encoder to encode service data;
   a signaling encoder to Low Density Parity Check (LDPC) encode signaling data based on modes of the signaling data,
   wherein the signaling data is categorized into each mode based on an LDPC code rate and a modulation order for the signaling data;
   an interleaver to interleave the LDPC encoded signaling data;
   a demultiplexer to demultiplex the interleaved signaling data in a bit group using a shifting method,
   wherein output bits of the demultiplexer are cyclically shifted from input bits of the demultiplexer according to the modulation order and a bit group index of the signaling data, the bit group index being a parameter of the interleaver;
   a mapper to map the demultiplexed signaling data into signaling symbols based on the modulation order;
   a frame builder to build at least one signal frame including the encoded service data and the signaling symbols;
   a modulator to modulate data in the at least one signal frame by an Orthogonal Frequency Division Multiplex (OFDM) scheme; and
   a transmitter to transmit the broadcast signals carrying the modulated data in the at least one modulated signal frame,
   wherein one of the modes for the signaling data represents a 6/15 LDPC code rate and a Quadrature Phase Shift Keying (QPSK) modulation.

6. The apparatus of claim 5, wherein the broadcast signals further carry a bootstrap,
   wherein the bootstrap includes information indicating one of the modes of the signaling data in the at least one signaling symbol in the at least one signal frame.

7. The apparatus of claim 5, wherein the shifting method is performed when the modulation order is one of 4, 6 or 8.

8. The apparatus of claim 5, wherein the LDPC encoded signaling data is written into the interleaver column-wise, a number of columns depending on the modulation order, and bits of the written signaling data are read out row-wise.

* * * * *